(12) United States Patent
Lee et al.

(10) Patent No.: US 11,728,252 B2
(45) Date of Patent: Aug. 15, 2023

(54) SEMICONDUCTOR DEVICE PACKAGE

(71) Applicant: Advanced Semiconductor Engineering, Inc., Kaohsiung (TW)

(72) Inventors: Hui Hua Lee, Kaohsiung (TW); Chun Hao Chiu, Kaohsiung (TW); Hui-Ying Hsieh, Kaohsiung (TW); Kuo-Hua Chen, Kaohsiung (TW); Chi-Tsung Chiu, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 383 days.

(21) Appl. No.: 16/846,085

(22) Filed: Apr. 10, 2020

(65) Prior Publication Data

US 2020/0243427 A1 Jul. 30, 2020

Related U.S. Application Data

(63) Continuation of application No. 15/621,970, filed on Jun. 13, 2017, now Pat. No. 10,707,157.

(51) Int. Cl.
 *H01L 23/495* (2006.01)
 *H01L 21/48* (2006.01)
 (Continued)

(52) U.S. Cl.
 CPC ...... *H01L 23/49575* (2013.01); *H01L 21/486* (2013.01); *H01L 21/4857* (2013.01);
 (Continued)

(58) Field of Classification Search
 CPC ........... H01L 23/49575; H01L 21/4857; H01L 21/486; H01L 23/49513; H01L 23/49517;
 (Continued)

(56) References Cited

U.S. PATENT DOCUMENTS 5,629,835 A * 5/1997 Mahulikar .......... H01L 21/4828
 174/257
5,764,484 A * 6/1998 Hoffman ................. H01L 23/13
 257/E23.079
(Continued)

FOREIGN PATENT DOCUMENTS

CN 102064113 A 5/2011
CN 102446882 A 5/2012

OTHER PUBLICATIONS

Final Office Action for U.S. Appl. No. 15/621,970, dated Oct. 18, 2019, 8 pages.
(Continued)

*Primary Examiner* — Benjamin Tzu-Hung Liu
(74) *Attorney, Agent, or Firm* — Foley & Lardner LLP

(57) ABSTRACT

A semiconductor device package includes a first conductive base, a first insulation layer and a second insulation layer. The first conductive base has a first surface, a second surface opposite to the first surface and a lateral surface extended between the first surface and the second surface. The lateral surface includes a first portion adjacent to the first surface and a second portion adjacent to the second surface. The first insulation layer comprises a first insulation material. The first insulation layer has a first surface and a second surface opposite to the first surface. The first insulation layer covers the first portion of the lateral surface of the first conductive base. The second insulation layer comprises a second insulation material and covers the second portion of the lateral surface of the first conductive base. The first insulation material is different from the second insulation material.

15 Claims, 70 Drawing Sheets

(51) Int. Cl.
  *H01L 23/498*      (2006.01)
  *H01L 23/538*      (2006.01)
  *H01L 23/00*       (2006.01)
  *H01L 25/065*      (2023.01)
  *H01L 25/16*       (2023.01)

(52) U.S. Cl.
  CPC .. *H01L 23/49513* (2013.01); *H01L 23/49517* (2013.01); *H01L 23/49811* (2013.01); *H01L 23/49866* (2013.01); *H01L 23/5386* (2013.01); *H01L 23/5389* (2013.01); *H01L 24/00* (2013.01); *H01L 25/0652* (2013.01); *H01L 25/16* (2013.01); *H01L 2224/04105* (2013.01); *H01L 2224/12105* (2013.01); *H01L 2224/19* (2013.01); *H01L 2224/24137* (2013.01); *H01L 2224/24145* (2013.01); *H01L 2224/24195* (2013.01); *H01L 2224/24247* (2013.01); *H01L 2224/32145* (2013.01); *H01L 2224/32225* (2013.01); *H01L 2224/32245* (2013.01); *H01L 2224/73267* (2013.01); *H01L 2224/92244* (2013.01); *H01L 2225/06524* (2013.01); *H01L 2225/06548* (2013.01); *H01L 2225/06572* (2013.01); *H01L 2225/06575* (2013.01); *H01L 2225/06589* (2013.01); *H01L 2924/15153* (2013.01); *H01L 2924/3511* (2013.01)

(58) Field of Classification Search
  CPC ......... H01L 23/49811; H01L 23/49866; H01L 23/5386; H01L 23/5389; H01L 24/00; H01L 25/0652; H01L 25/16; H01L 2224/04105; H01L 2224/12105; H01L 2224/19; H01L 2224/24137; H01L 2224/24145; H01L 2224/24195; H01L 2224/24247; H01L 2224/32145; H01L 2224/32225; H01L 2224/32245; H01L 2224/73267; H01L 2224/92244; H01L 2225/06524; H01L 2225/06548; H01L 2225/06572; H01L 2225/06575; H01L 2225/06589; H01L 2924/15153; H01L 2924/3511

See application file for complete search history.

(56) References Cited

U.S. PATENT DOCUMENTS

| | | | |
|---|---|---|---|
| 5,886,399 A | 3/1999 | Ohsawa et al. | |
| 7,759,777 B2 | 7/2010 | Otremba et al. | |
| 7,964,957 B2 | 6/2011 | Noguchi et al. | |
| 8,030,131 B2 | 10/2011 | Otremba et al. | |
| 8,120,158 B2 | 2/2012 | Ewe et al. | |
| 8,487,426 B2 | 7/2013 | Essig et al. | |
| 9,105,620 B1* | 8/2015 | Do | H01L 23/49861 |
| 9,331,003 B1* | 5/2016 | Camacho | H01L 21/4832 |
| 9,357,660 B2 | 5/2016 | Yoshikawa et al. | |
| 2011/0084370 A1 | 4/2011 | Su et al. | |
| 2013/0020688 A1* | 1/2013 | Pan | H01L 21/4828 257/676 |
| 2013/0093086 A1* | 4/2013 | Lin | H01L 21/4846 257/738 |
| 2014/0118976 A1 | 5/2014 | Yoshikawa et al. | |
| 2015/0332991 A1* | 11/2015 | Lee | H01L 29/0657 438/118 |
| 2015/0348934 A1* | 12/2015 | Qin | H01L 23/52 438/113 |
| 2016/0118365 A1* | 4/2016 | Singh | H01L 24/11 257/676 |
| 2016/0218019 A1 | 7/2016 | Su et al. | |
| 2016/0372338 A1* | 12/2016 | Liang | H01L 21/4825 |
| 2017/0141087 A1 | 5/2017 | Vincent et al. | |

OTHER PUBLICATIONS

Final Office Action for U.S. Appl. No. 15/621,970, dated Sep. 5, 2018, 17 pages.
Non-Final Office Action for U.S. Appl. No. 15/621,970, dated Apr. 4, 2019, 16 pages.
Notice of Allowance for U.S. Appl. No. 15/621,970 dated Jan. 10, 2020, 9 pages.
Office Action for corresponding Chinese Patent Application No. 201710451949.7 dated Nov. 5, 2018 in 5 pages.
Translation of Search Report for corresponding Chinese Patent Application No. 201710451949.7 dated Nov. 20, 2018 in 4 pages.
Non-Final Office Action for U.S. Appl. No. 15/621,968, dated Nov. 3, 2017, 9 pages.
Non-Final Office Action for U.S. Appl. No. 15/621,970, dated Jan. 12, 2018, 15 pages.
Notice of Allowance for U.S. Appl. No. 15/621,968, dated Feb. 9, 2018, 8 pages.
Office Action for corresponding Chinese Patent Application No. 201710451949.7 dated Dec. 24, 2020, 10 pages.
Search Report for corresponding Chinese Patent Application No. 201710451949.7 dated Dec. 24, 2020 in 6 pages (with English Translation).

* cited by examiner

SEMICONDUCTOR DEVICE PACKAGE

CROSS-REFERENCE TO RELATED APPLICATIONS

This application is a continuation of U.S. patent application Ser. No. 15/621,970 filed Jun. 13, 2017, which claims the benefit of and priority to U.S. Provisional Application No. 62/350,622, filed Jun. 15, 2016, the entire contents of which are incorporated herein by reference.

BACKGROUND

1. Technical Field

The present disclosure relates to a semiconductor device package and a method of manufacturing the same. In particular, the present disclosure relates to a semiconductor device package structure including an improved conductive base and a method for manufacturing the same.

2. Description of the Related Art

In some embedded semiconductor device packages, where one or more semiconductor devices are disposed on/in a die paddle of a leadframe, it can be challenging to integrate a large number of components and/or input/outputs (I/Os) (e.g. conductive lines/vias/traces) into the semiconductor device package while preventing or mitigating parasitic capacitance.

SUMMARY

In one or more embodiments, according to a first aspect of the present disclosure, a semiconductor device package includes a first conductive base, a first insulation layer and a second insulation layer. The first conductive base has a first surface, a second surface opposite to the first surface and a lateral surface extended between the first surface and the second surface. The lateral surface includes a first portion adjacent to the first surface of the first conductive base and a second portion adjacent to the second surface of the first conductive base. The first insulation layer includes a first insulation material. The first insulation layer has a first surface and a second surface opposite to the first surface. The first insulation layer covers the first portion of the lateral surface of the first conductive base. The second insulation layer includes a second insulation material and covers the second portion of the lateral surface of the first conductive base. The first insulation material is different from the second insulation material.

In one or more embodiments, according to a second aspect of the present disclosure, a semiconductor device package includes a conductive base and an insulation layer. The conductive base has a first surface, a second surface opposite to the first surface, and a lateral surface extended between the first surface and the second surface. The conductive base has a first portion adjacent to the first surface of the conductive base and a second portion adjacent to the second surface of the conductive base. The first portion of the conductive base has a first width and the second portion of the conductive base has a second width. The first width is greater than the second width. The insulation layer covers the lateral surface of the first conductive base.

In one or more embodiments, according to a third aspect of the present disclosure, a semiconductor device package includes a conductive base, a first insulation layer and a second insulation layer. The conductive base has a first surface, a second surface opposite to the first surface and a lateral surface extended between the first surface and the second surface. The lateral surface includes a first portion adjacent to the first surface of the conductive base and a second portion adjacent to the second surface of the conductive base. The first insulation layer includes a first insulation material and covers the first portion of the lateral surface of the conductive base. The second insulation layer includes a second insulation material and covers the second surface of the conductive base. The first insulation material is different from the second insulation material.

BRIEF DESCRIPTION OF THE DRAWINGS

Common reference numerals are used throughout the drawings and the detailed description to indicate the same or similar elements. Embodiments of the present disclosure will be more apparent from the following detailed description taken in conjunction with the accompanying drawings.

DETAILED DESCRIPTION

Described in this disclosure are embodiments of techniques for providing devices with reduced package sizes. For example, the present disclosure describes embodiments of a semiconductor device package structure including an improved conductive base structure for mitigating or eliminating parasitic capacitance when one or more semiconductor devices are disposed in a die paddle of a leadframe.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration, and that practical implementations of the structures described herein can be spatially arranged in any orientation or manner, provided that the merits of embodiments of this disclosure are not deviated by such arrangement.

Figure 1:
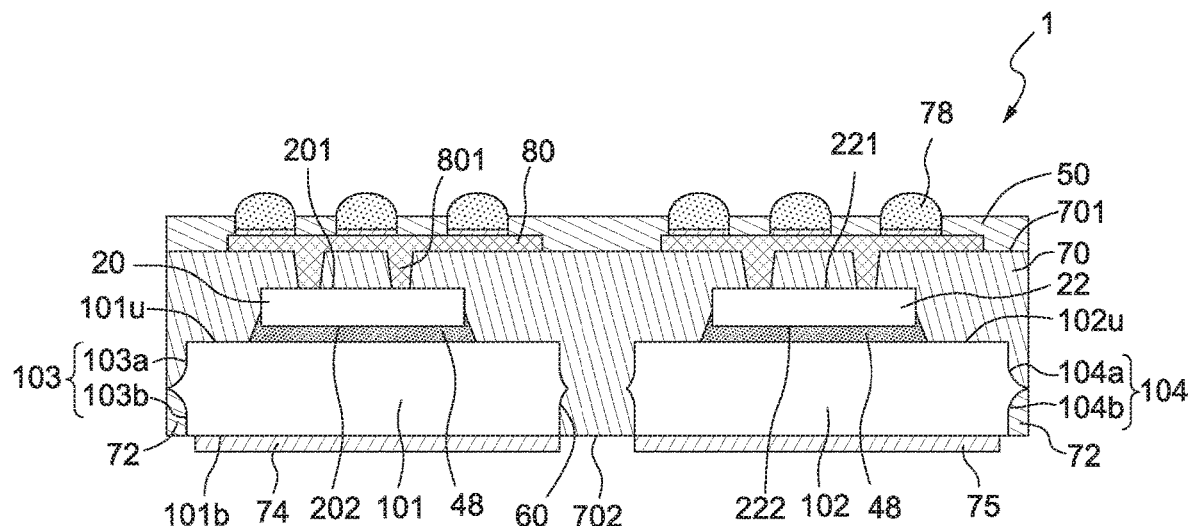
FIG. 1 is a cross-sectional view of some embodiments of a semiconductor device package in accordance with a first aspect of the present disclosure.

FIG. 1 is a cross-sectional view of some embodiments of a semiconductor device package 1 in accordance with a first aspect of the present disclosure. The semiconductor device package 1 includes conductive bases 101 and 102, semiconductor dies 20 and 22, conductive adhesive layers 48, insulation layers 50, 70 and 72, patterned conductive layers 80, interconnection structures 801, conductive connects 78, surface finish layers 74 and 75. The insulation layer 70 may be, for example, a protection layer, and may additionally or alternatively serve as a support layer. The semiconductor device package 1 shown in FIG. 1 is one example unit formed on a leadframe prior to singulation, and the leadframe can include a plurality of such units.

In some embodiments, the conductive bases 101 and 102 can constitute, or can be a part of, a leadframe. The conductive base 101 includes an upper surface 101u and a surface 101b opposite to the upper surface 101u. The conductive base 101 also has a lateral surface 103 extended between the upper surface 101u and the surface 101b. The lateral surface 103 includes a portion 103a adjacent to the surface 101u of the conductive base 101 and a portion 103b adjacent to the surface 101b of the conductive base 101. The portion 103a of the lateral surface 103 of the conductive base 101 is curved such that it protrudes outwardly from the conductive base 101, the lateral surface 103 being more protruded at a center position of the lateral surface 103 than at a point where the lateral surface 103 meets the surface 101u of the conductive base 101. The portion 103b of the lateral surface 103 of the conductive base 101 is curved such that it protrudes outwardly from the conductive base 101, the lateral surface 103 being more protruded at a center position of the lateral surface 103 than at a point where the lateral surface 103 meets the surface 101b of the conductive base 101.

The conductive base 102 includes an upper surface 102u and a surface 102b opposite to the upper surface 102u, and a lateral surface 104. A material of the conductive bases 101 and 102 may include, for example, copper (Cu), or other metal, or a metal alloy, or other conductive material. In some embodiments, the conductive bases 101 and 102 may be a die paddle. The lateral surface 104 includes a portion 104a adjacent to the surface 102u of the conductive base 102 and a portion 104b adjacent to the surface 102b of the conductive base 102. The portion 104a of the lateral surface 104 of the conductive base 102 is curved such that it protrudes outwardly from the conductive base 102, the lateral surface 104 being more protruded at a center position of the lateral surface 104 than at a point where the lateral surface 104 meets the surface 102u of the conductive base 101. The portion 104b of the lateral surface 104 of the conductive base 102 is curved such that it protrudes outwardly from the conductive base 102, the lateral surface 104 being more protruded at a center position of the lateral surface 104 than at a point where the lateral surface 104 meets the surface 102b of the conductive base 102.

The conductive bases 101 and 102 can be disposed adjacent to each other, and can be disposed such that the lateral surfaces 103 and 104 face away from each other. In such an arrangement, the conductive bases 101 and 102 can be arranged symmetrically around a midpoint between the conductive bases 101 and 102. The symmetrical arrangement of the conductive base 101 and the conductive base 102 can help to reduce warpage of the semiconductor device package 1. In addition, in some embodiments, a large number of components can be integrated into the leadframe because of the symmetrical arrangement.

In some embodiments, the conductive bases 101 and 102 define one or more curved structures 60 (e.g. a smoothed or rounded corner, or a recess formed in a lateral surface of one of the conductive bases 101 and 102), which can provide for, in some implementations, reducing or minimizing stress at the curved structures 60 during a manufacturing operation (e.g. an operation related to a formation of the insulation layer 70). The curved structures 60 may configured to redistribute stress across the conductive bases 101 and 102, such as to more evenly apportion stress across the conductive bases 101 and 102, or to transfer a stress point from one portion of the conductive bases 101 and 102 to another portion of the conductive bases 101 and 102. Different curved structures 60 may have different radii of curvature and/or may form different angles of taper with respect to the surface 101b of the conductive base 101 or the upper surface 102u of the conductive base 102.

In some embodiments, the semiconductor die 20 has an upper surface 201 and a surface 202 opposite the upper surface 201. The surface 202 of the semiconductor die 20 is bonded to the surface 101u of the conductive base 101 through conductive adhesive layer 48. The conductive adhesive layer 48 may include, for example, a conductive gel or epoxy film (epoxy mixed with a conductive material), or other conductive material. In some embodiments, the semiconductor die 22 has an upper surface 221 and a surface 222 opposite the upper surface 221. The surface 222 of the semiconductor die 22 is bonded to the surface 102u of the conductive base 102 through the conductive adhesive layer 48.

The conductive adhesive layer 48 is disposed between the surface 201 of the semiconductor die 20 and the surface 101u of the conductive base 101. In some embodiments, the conductive adhesive layer 48 covers a portion of the surface 101u of the conductive base 101; in other embodiments, the conductive adhesive layer covers substantially an entirety of the surface 101u of the conductive base 101. In some embodiments, the conductive adhesive layer 48 may contact a portion of one or more sidewalls of the semiconductor die 20. The conductive adhesive layer 48 attaches the semiconductor die 20 to the conductive base 101. The arrangement of the semiconductor die 22 with respect to the conductive adhesive layer 48 is similar to that of the semiconductor die 20.

The insulation layer 70 is disposed on the conductive bases 101 and 102 and is disposed on the semiconductor dies 20 and 22. The insulation layer 70 includes an upper surface 701 and a surface 702 opposite to the upper surface 701. The insulation layer 70 encapsulates the upper surface 101u and the surface 101b of the conductive base 101 and covers at least a portion of the semiconductor die 20. The insulation layer 70 also encapsulates the upper surface 102u and the surface 102b of the conductive base 102 and covers the semiconductor die 22. In some embodiments, a material of the insulation layer 70 may include a polypropylene resin; however, other suitable materials may be additionally or alternatively used. The insulation layer 70 covers the portion 103a of the lateral surface 103 of the conductive base 101 and the portion 104a of the lateral surface 104 of the conductive base 102.

The insulation layer 72 covers the portion 103b of the lateral surface 103 of the conductive base 101 and the portion 104b of the lateral surface 104 of the conductive base 102. A material of the insulation layer 70 is different from a material of the insulation layer 72. A material of the insulating layer 72 may include an epoxy resin or other insulating materials used additionally or alternatively. In some embodiments, a material of the insulating layer 72 may be materials suitable for a solder mask.

During manufacturing of the semiconductor device package 1, a tie bar of the conductive bases 101 and 102 (e.g. a tie bar connecting the conductive bases 101 and 102) can be removed by using, for example, etching back techniques to mitigate damage to the conductive bases 101 and 102. The insulation layers 70 and 72 can encapsulate the conductive bases 101 and 102, thereby providing for further protection of the conductive bases 101 and 102 (e.g. protection of the corners of the conductive bases 101 and 102). In some embodiments, the dies 20 and 22, the surfaces 101u and 102u, the surface 101b and 102b and the lateral surfaces 103 and 104 of the conductive bases 101 and 102 can be protected by different materials (e.g. by the insulation layer 70 and second insulation layer 72). The lateral surface 103 can be covered by different materials (e.g. by the insulation layer 70 and insulation layer 72), which can provide for mitigating interference between electrodes of the die 20. The lateral surface 104 also can be covered by different materials (e.g. the insulation layer 70 and insulation layer 72), which can provide for mitigating interference between the different electrodes of the die 22.

The interconnection structures 801 electrically connect the patterned conductive layers 80 to the upper surface 201 of the semiconductor die 20. The interconnection structure 821 electrically connects the patterned conductive layer 82 to the upper surface 221 of the semiconductor die 22. In some embodiments, the interconnection structures 801 and 821 are conductive vias formed through the insulating layer 70. A material of interconnection structures 801 and 821 and patterned conductive layer 80 and 82 may include, for example, copper or other metal, or a metal alloy, or other conductive material.

The insulation layer 50 is disposed on the upper surface 701 of the insulation layer 70 and over the interconnection structures 801. In some embodiments, the insulation layer 50 may be a solder mask. A material of the insulation layer 50 may include an epoxy resin or other insulating materials used additionally or alternatively. Conductive connects 78 (e.g., solder balls) are disposed on the patterned conductive layers 80 through conductive pads. The surface finish layer 74 is formed on the surface 101b of the conductive base 101 and the surface finish layer 75 is formed on the surface 102b of the conductive base 102. The surface finish layers 74 and 75 may include any suitable conductive material (such as, for example, nickel (Ni), palladium (Pd), gold (Au), silver (Ag), Cu, and combinations of metals). The surface finish layer 74 can help to protect part of the surface 101b exposed from the insulation layer 72 and the finish layer 75 can protect part of the surface 102b exposed from the insulation layer 72.

Figure 2:
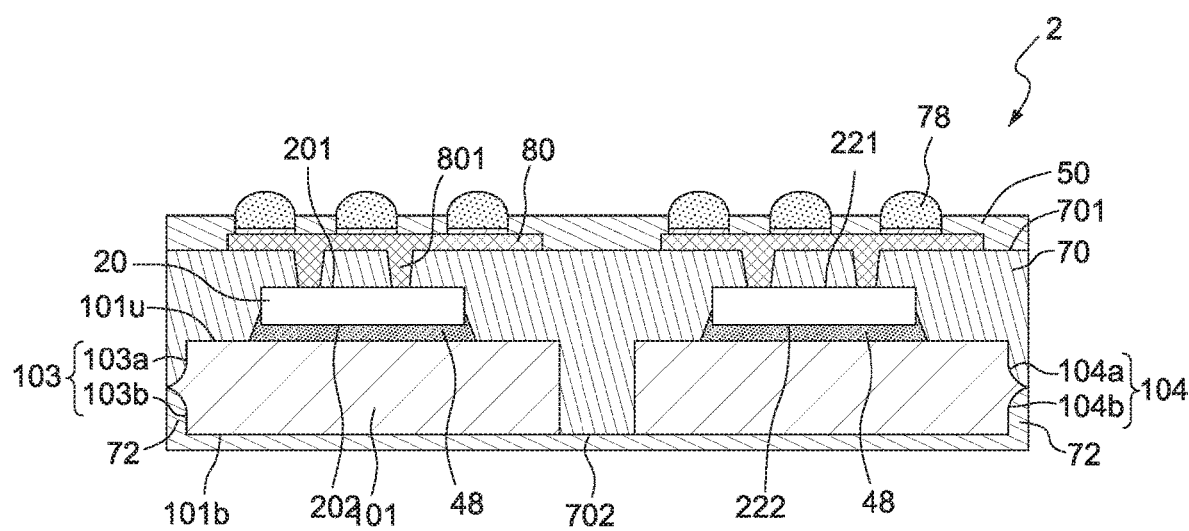
FIG. 2 is a cross-sectional view of some embodiments of a semiconductor device package in accordance with a second aspect of the present disclosure.

FIG. 2 is a cross-sectional view of some embodiments of a semiconductor device package 2 in accordance with a second aspect of the present disclosure. The semiconductor device package 2 is similar in some ways to the semiconductor device package 1 of FIG. 1, and some same-numbered components are not described again with respect to FIG. 2. The semiconductor device package 2 includes conductive bases 101 and 102, semiconductor dies 20 and 22, conductive adhesive layers 48, insulation layers 50, 70 and 72, patterned conductive layers 80, interconnection structures 801, and conductive connects 78. The insulation layer 70 may serve as a protection layer, and/or may serve as a support layer.

As shown in FIG. 2, the conductive bases 101 and 102 of the semiconductor device package 2 do not include the curved structures 60 and surface finish layers 74 and 75 described above. The surface 702 of the insulation layer 70, the surface 101b of the conductive base 101 and the surface 102b of the conductive base 102 are covered by the insulation layer 72. The insulation layer 72 covers the portion 103b of the lateral surface 103 of the conductive base 101 and the portion 104b of the lateral surface 104 of the conductive base 102. A material of the insulation layer 70 is different from a material of the insulation layer 72. In some embodiments, a material of the insulation layer 70 may include a polypropylene resin; however, other suitable materials may be additionally or alternatively used. In some embodiments, a material of the insulating layer 72 may be materials suitable for a solder mask.

Figure 3:
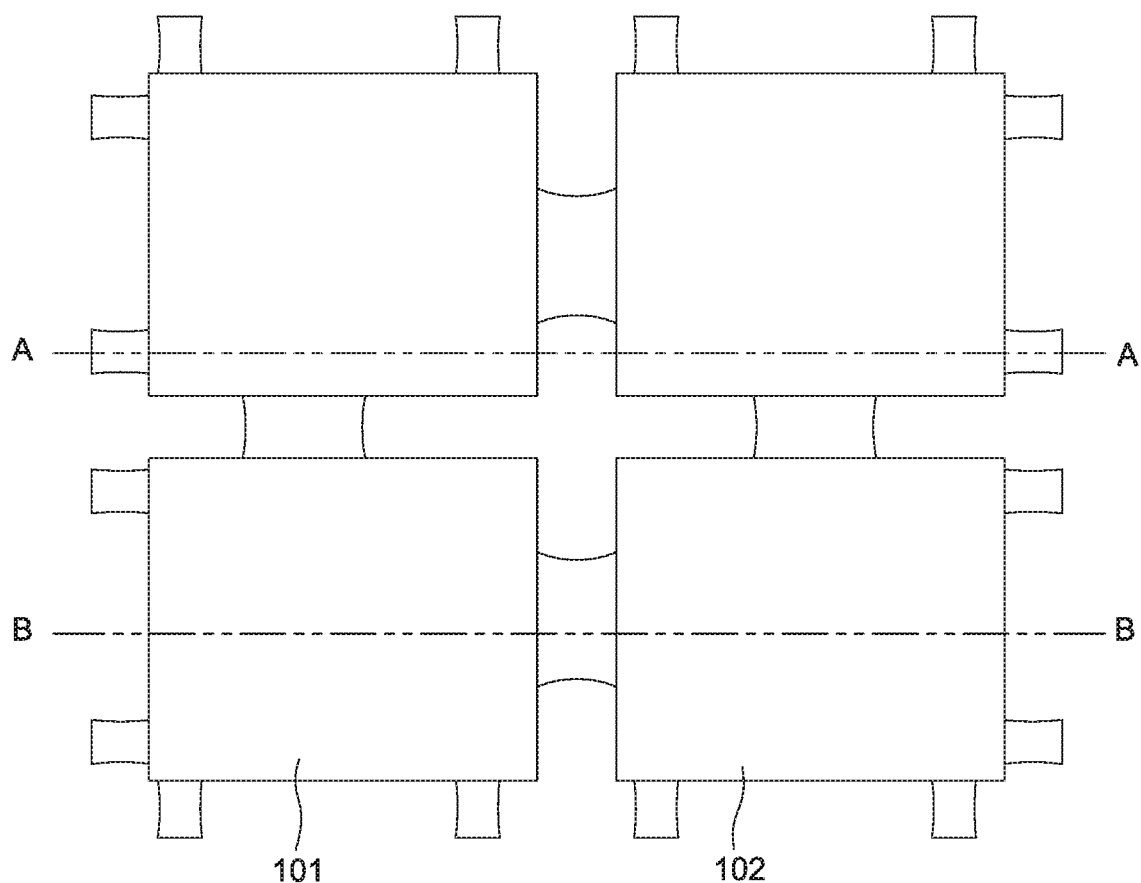
FIG. 3 is a top view of some embodiments of a conductive base in accordance with some aspects of the present disclosure.

FIG. 3 is a top view of connected (e.g. by a tie bar) conductive bases 101 and 102 in accordance with some embodiments of some semiconductor device packages described herein. FIGS. 4A-4H illustrate some embodiments of a method of manufacturing the semiconductor device package 1 depicted in FIG. 1. In FIGS. 4A-4H, the cross-sectional view is taken along line A-A of FIG. 3.

Figure 4A:
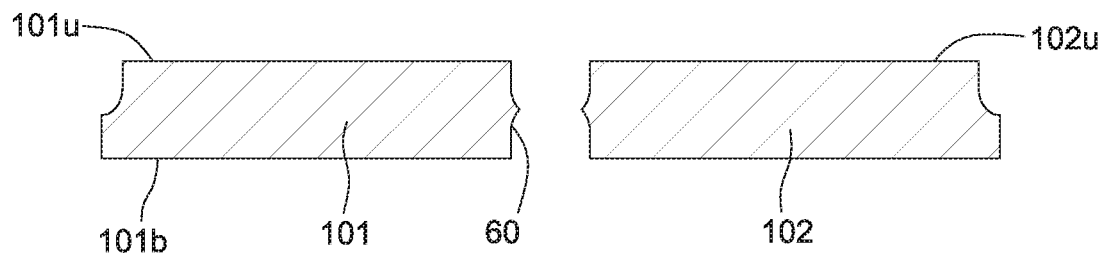
FIG. 4A, FIG. 4B, FIG. 4C, FIG. 4D, FIG. 4E, FIG. 4F, FIG. 4G and FIG. 4H illustrate some embodiments of a method of manufacturing the semiconductor device package depicted in FIG. 1.

Referring to FIG. 4A, conductive bases 101 and 102 are provided. The conductive base 101 includes an upper surface 101u and a surface 101b opposite to the upper surface 101u. The conductive base 102 includes an upper surface 102u and a surface 102b opposite to the upper surface 102u. A material of the conductive bases 101 and 102 includes, for example, copper or other metal, or a metal alloy, or other conductive material. The conductive base 101 includes one or more curved structures 60. Curved structures 60 of the conductive base 101 are smoothed, and can provide for redistributing stress and mitigating damage to the protection layer 70 during, for example, a lamination process. The structure of each of the conductive bases 101 and 102 may be formed in a same or similar manner.

Figure 4B:
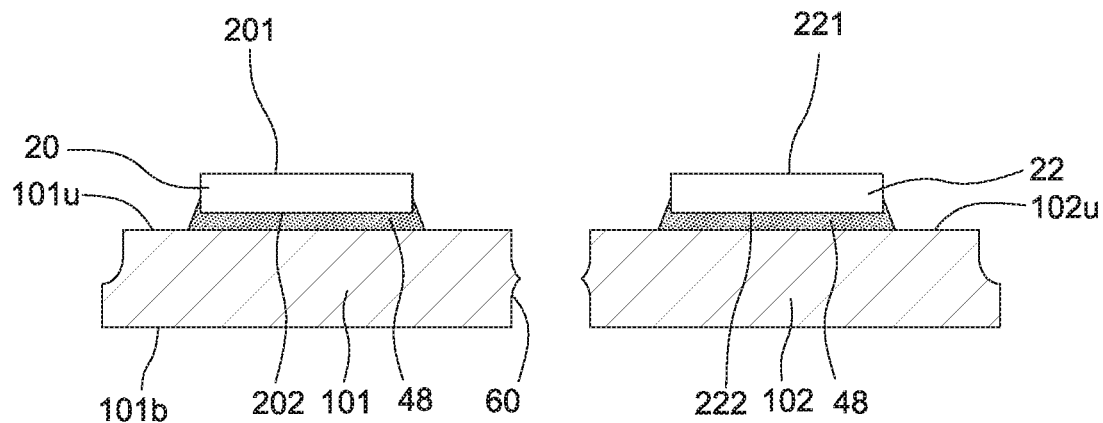

Referring to FIG. 4B, conductive adhesive layers 48 is disposed on the upper surface 101u of the conductive base 101. The conductive adhesive layer 48 may include, for example, a conductive gel or epoxy film (epoxy mixed with a conductive material). A semiconductor die 20 is disposed on the conductive adhesive layer 48. The conductive adhesive 48 is used to attach the semiconductor die 20 to the upper surface 101u of the conductive base 101.

Figure 4C:
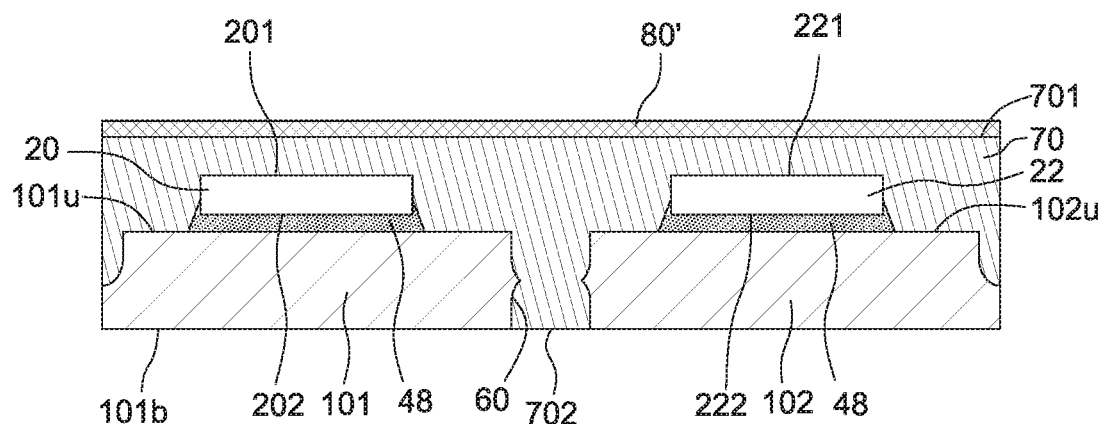

Referring to FIG. 4C, an insulation layer 70 is formed on the conductive base 101 and the semiconductor die 20 by a lamination technique. The insulation layer 70 also covers the curved structures 60. A material of the insulation layer 70 may include, for example, a polypropylene resin or other suitable material. A portion of the insulation layer 70 is melted during lamination. A conductive layer 80' is disposed on the upper surface 701 of the insulation layer 70 by coating, sputtering, plating or another suitable technique. The conductive layer 80' may include, for example, aluminum or copper, or an alloy thereof (such as AlCu).

Figure 4D:
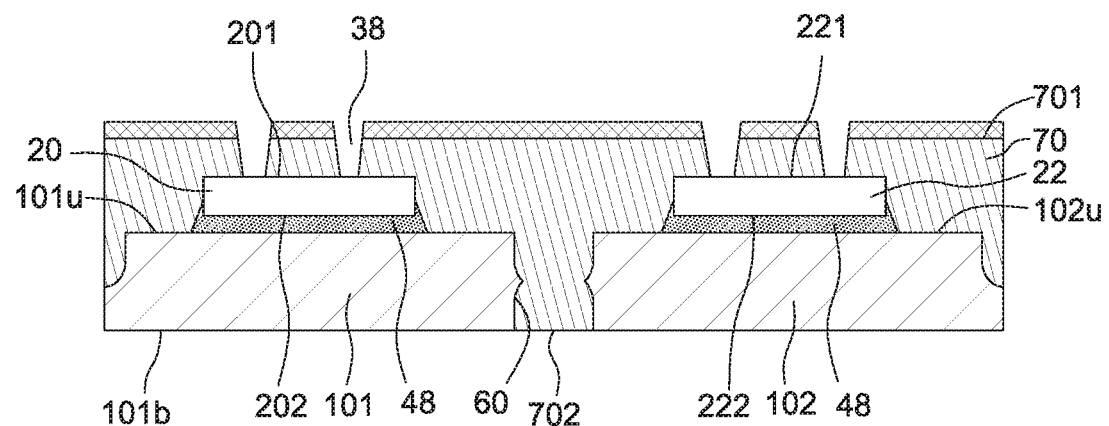
Figure 4E:
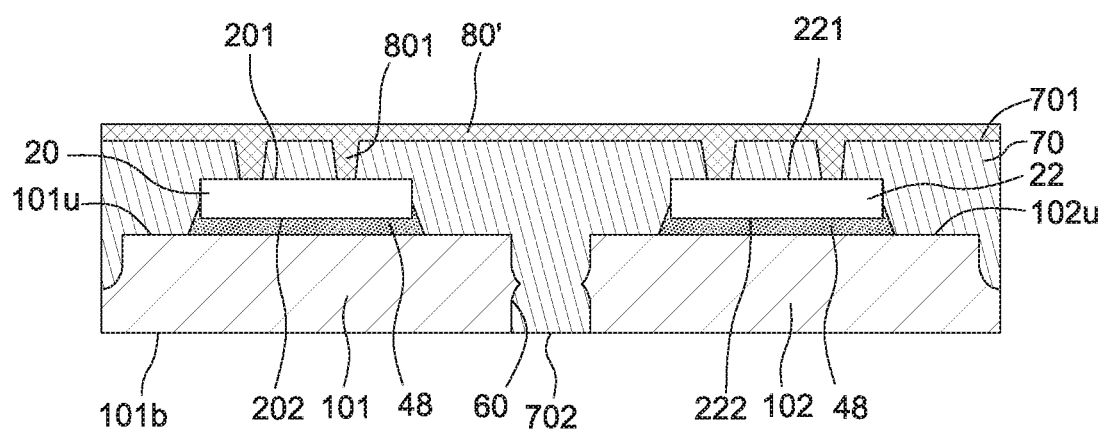

Referring to FIG. 4D, vias 38 are formed through the insulation later 70 from the surface of the conductive layer 80'. The vias 38 may be formed, for example, by drilling. Referring to FIG. 4E, a thickness of conductive layers 80' are increased by coating, sputtering, plating or another suitable technique.

Figure 4F:
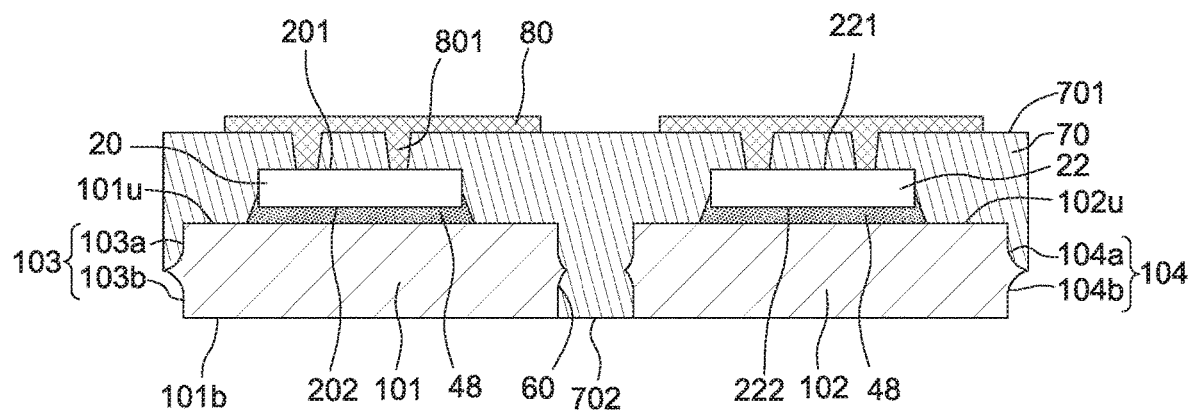

Referring to FIG. 4F, the interconnection structures 801 and the patterned conductive layer 80 are formed by etching techniques. The interconnection structures 801 and the patterned conductive layer 80 are conductive vias formed through the insulation layer 70. The conductive bases 101 and 102 are etched to expose the portion 103b of the lateral surface 103 and the portion 104b of the lateral surface 104. In some embodiments, the insulation layer 70 covers the portion 103a of the lateral surface 103 of the conductive base 101 and the portion 104a of the lateral surface 104 of the conductive base 102.

Figure 4G:
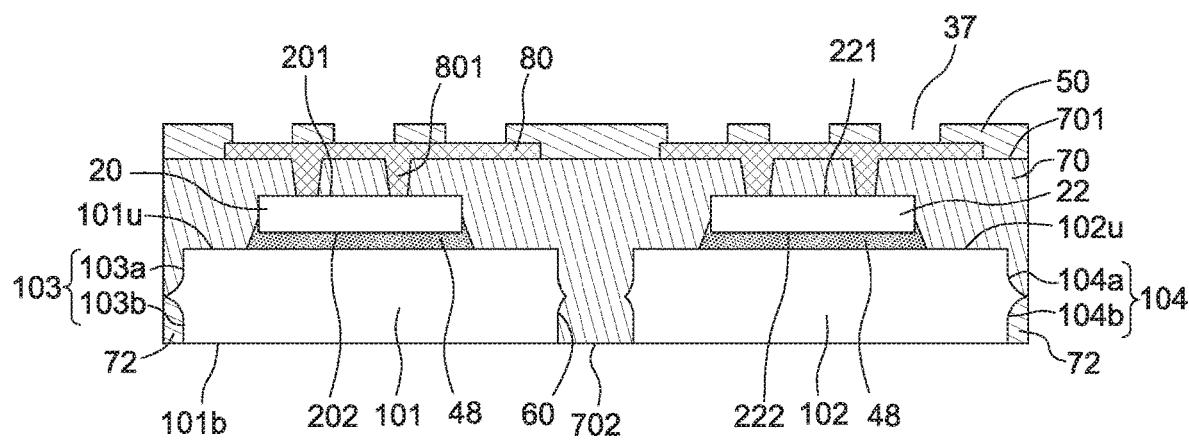

Referring to FIG. 4G, the insulating layer 50 is disposed on the upper surface 701 of the protection layer 70 and over the interconnection structures 801. The insulation layer 72 is disposed on the portion 103b of the lateral surface 103 of the conductive base 101 and the portion 104b of the lateral surface 104 of the conductive base 102. A material of the insulation layer 70 is different from a material of the insulation layer 72. A material of the insulating layer 72 may include an epoxy resin or other insulating materials used additionally or alternatively. In some embodiments, the insulating layer 50 may be a solder mask. A material of one or both of the insulating layers 50 and 72 may include an epoxy resin or other insulating materials used additionally or alternatively.

Figure 4H:
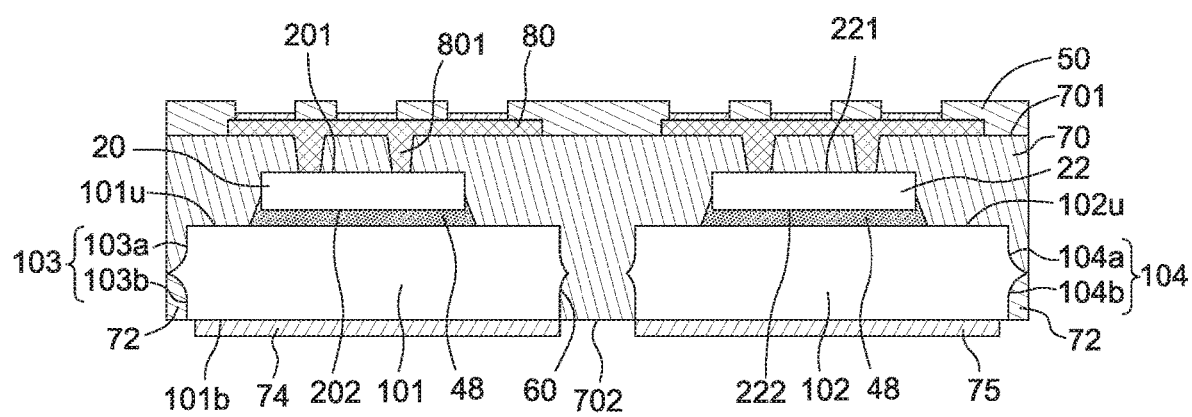

Referring to FIG. 4H, the surface finish layer 74 is disposed on the surface 101b of the conductive base 101 and the finish layer 75 is disposed on the surface 102b of the conductive base 102. The surface finish layers 74 and 75 may include any suitable conductive material (such as, for example, nickel (Ni), palladium (Pd), gold (Au), silver (Ag), Cu, and combinations of metals). The surface finish layer 74 can help to protect part of the surface 101b exposed from the insulation layer 72. Conductive pads are disposed on an exposed surface of the conductive layer 80 which is not covered by the insulating layer 50. Next, the conductive connects 78 are filled into or formed in the vias 37 and cover the conductive pads, thus forming the semiconductor device package 1 as illustrated in FIG. 1. The conductive connects 78 may include solder balls.

Figure 5A:
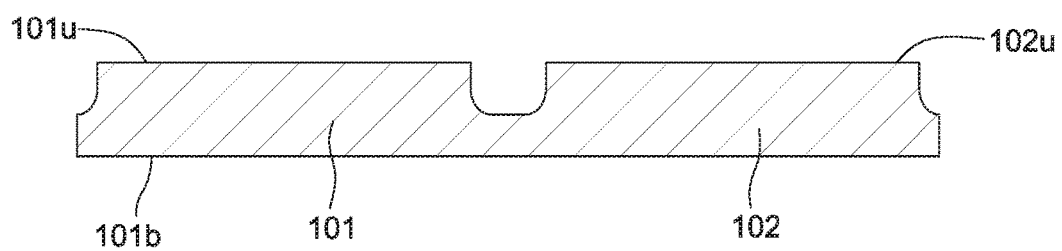
FIG. 5A, FIG. 5B and FIG. 5C illustrate some embodiments of a method of manufacturing the semiconductor device package depicted in FIG. 2.
Figure 5B:
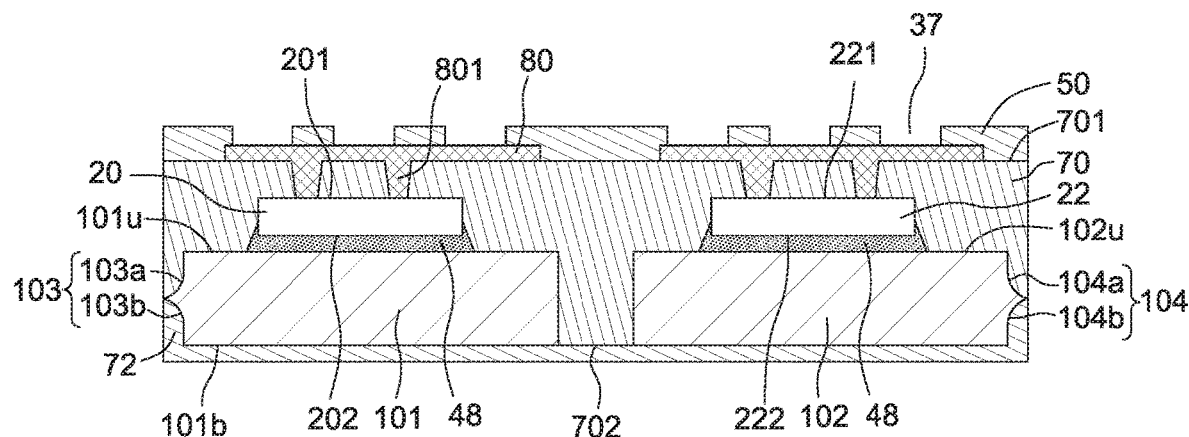
Figure 5C:
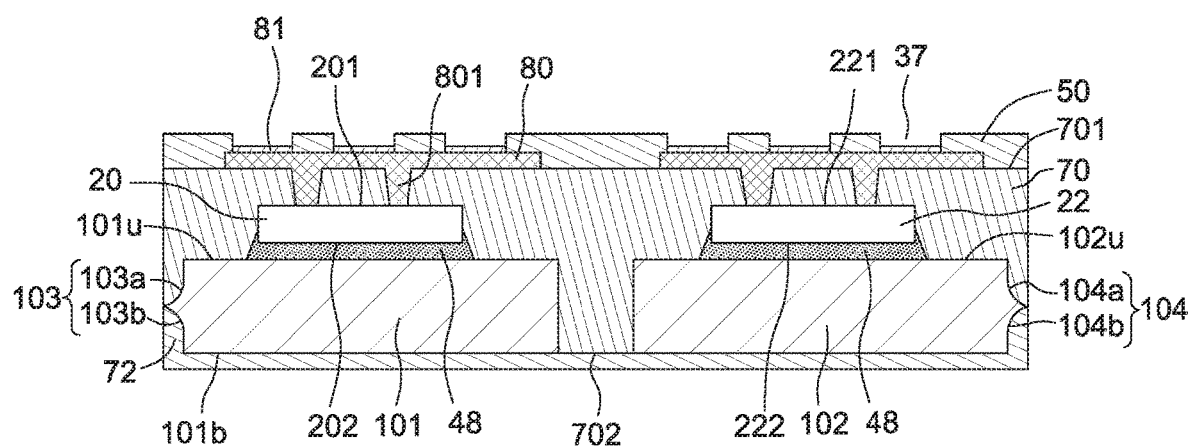

FIGS. 5A-5C illustrate some embodiments of a method of manufacturing the semiconductor device 2 package depicted in FIG. 2. In FIGS. 5A-5C, the cross-sectional view is taken along line B-B of FIG. 3. Referring to FIG. 5A, connected conductive bases 101' and 102' are provided. The connected conductive bases 101' and 102' include an upper surface 101u and a surface 101b opposite to the upper surface 101u. A material of the conductive bases 101 and 102 may include, for example, copper (Cu), or other metal, or a metal alloy, or other conductive material. In some embodiments, the conductive bases 101 and 102 may be a die paddle.

Referring to FIG. 5B, conductive adhesive layers 48 are respectively disposed on the upper surface 101u of the conductive base 101 and the upper surface 102u of the conductive base 102. The conductive adhesive layer 48 may include, for example, a conductive gel or epoxy film (epoxy mixed with a conductive material). The conductive adhesive 48 can be used to attach the semiconductor die 20 to the upper surface 101u of the conductive base 101 and attach the semiconductor die 22 to the upper surface 102u of the conductive base 102. An insulation layer 70 is formed on the conductive bases 101 and 102 and the semiconductor dies 20 and 22 by a lamination technique. A material of the insulation layer 70 may include, for example, a polypropylene resin or other suitable material. The insulation layer 70 covers the portion 103a of the lateral surface 103 of the conductive base 101 and the portion 104a of the lateral surface 104 of the conductive base 102. The interconnection structures 801 and 802 are formed in the insulation layer 70 and the patterned conductive layers 80 and 82 are formed on the upper surface 701 of the protection layer 70. The insulation layer 50 is formed on the upper surface 701 of the protection layer 70 and the patterned conductive layers 80 and 82. The insulation layer 72 is formed and covers the portion 103b of the lateral surface 103 of the conductive base 101 and the portion 104b of the lateral surface 104 of the conductive base 102. A material of the insulation layers 50 and 72 is different from a material of the insulation layer 70. A material of the insulating layer 72 may include an epoxy resin or other insulating materials used additionally or alternatively. In some embodiments, a material of the insulating layers 50 and 72 may include materials suitable for a solder mask.

Referring to FIG. 5C, conductive pads 81 are disposed on an exposed surface of the conductive layer 80 which is not covered by the insulating layer 50. Next, the conductive connects 78 are disposed in the vias 37 and cover the conductive pads, thus forming the semiconductor device package 2 as illustrated in FIG. 2.

Figure 6:
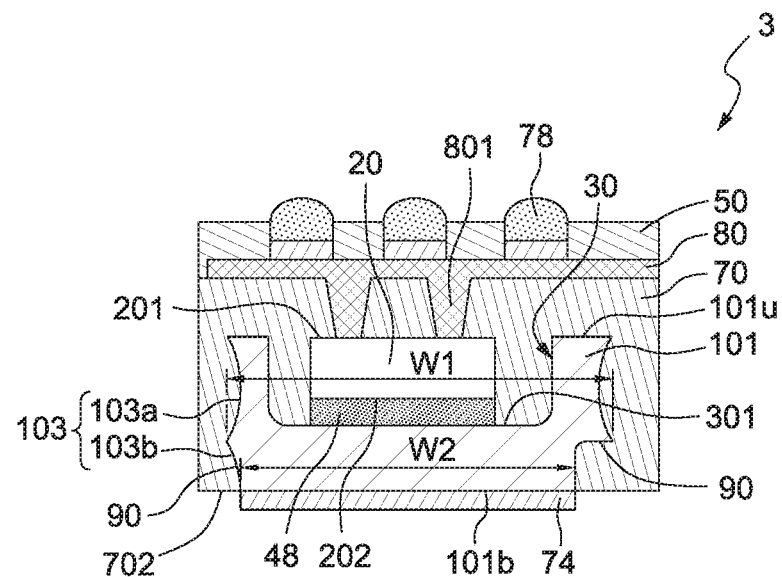
FIG. 6 is a cross-sectional view of some embodiments of a semiconductor device package in accordance with a third aspect of the present disclosure.

FIG. 6 is a cross-sectional view of some embodiments of a semiconductor device package 3 in accordance with a third aspect of the present disclosure. The semiconductor device package 3 includes a conductive base 101, a semiconductor die 20, a conductive adhesive layer 48, insulation layers 50 and 70, patterned conductive layers 80, interconnection structures 801, conductive connects 78, and a surface finish layer 74. The insulation layer 70 may serve as a protection layer 70 and/or as a support layer.

In some embodiments, the conductive base 101 may constitute, or may be a part of, a leadframe. The conductive base 101 includes an upper surface 101u and a surface 101b opposite to the upper surface 101u. The conductive base 101 also has a lateral surface 103 extended between the upper surface 101u and the surface 101b. The lateral surface 103 includes a portion 103a adjacent to the surface 101u of the conductive base 101 and a portion 103b adjacent to the surface 101b of the conductive base 101. The portions 103a and 103b of the lateral surface 103 of the conductive base 101 are curved surfaces. The portion 103b of the lateral surface 103 of the conductive base 101 is curved such that it protrudes outwardly from the conductive base 101, the lateral surface 103 being more protruded at a center position of the lateral surface 103 than at a point where the lateral surface 103 meets the surface 101b of the conductive base 101. The curved structure 90 (which can be, for example, a recess) is defined by the conductive base 101 and is formed in the portion 103b of the lateral surface 103. A material of the conductive base 101 may include, for example, copper (Cu), or other metal, or a metal alloy, or other conductive material. In some embodiments, the conductive base 101 may be a die paddle.

The conductive base 101 has a first portion adjacent to the first surface 101u of the conductive base 101 and a second portion adjacent to the second surface 101b of the conductive base 101. The first portion of the conductive base 101 has a first width W1 and the second portion of the conductive base 101 has a second width W2. In some embodiments, the first width W1 is greater than the second width W2, for example, at least about 1.05 times W2, at least about 1.1 times W2, or at least about 1.2 times W2.

The conductive base 101 defines a cavity 30 in the upper surface 101u. The cavity 30 has a bottom surface 301. A semiconductor die 20 is disposed on the bottom surface 301 of the cavity 30. The cavity is respectively formed in the conductive base 101 and can receive the semiconductor die 20, thereby reducing package thickness as compared to some embodiments that do not include a cavity 30. A compact three-dimensional (3-D) embedded package can be achieved by implementing a design with the cavity 30. The cavity 30 can provide for a space or distance between the die 20 and the surface 101u of the conductive base 101, which can help to mitigate or avoid damage of the die 20 during a lamination process.

In some embodiments, the semiconductor die 20 has an upper surface 201 and a surface 202 opposite the upper surface 201. The surface 202 of the semiconductor die 20 is bonded to the bottom surface 301 of the cavity 30 through the conductive adhesive layer 48. The conductive adhesive layer 48 may include, for example, a conductive gel or epoxy film (epoxy mixed with a conductive material), or other conductive material. The conductive adhesive layer 48 is disposed between the surface 202 of the semiconductor die 20 and the bottom surface 301 of the cavity 30. In some embodiments, the conductive adhesive layer 48 covers a portion of the bottom surface 301 of the cavity 30; in other embodiments, the conductive adhesive layer 48 covers substantially the entirety of the bottom surface 301. In some embodiments, the conductive adhesive layer 48 may contact a portion of one or more sidewalls of the semiconductor die 20. The conductive adhesive layer 48 attaches the semiconductor die 20 to the conductive base 101. The conductive adhesive layer 48 attaches the semiconductor die 22 to the conductive base 102.

The adhesive layer 48, which attaches the die 20 to the bottom surface 301 of the cavity 30, can be kept separated from a corner (e.g. the joint of the sidewall and the bottom of the cavity 30) of the cavity 30 (e.g. a space between the adhesive layer 48 and the corner can be provided), which can help to avoid or mitigate structural cracking. In addition, providing for such a space can reduce an amount of the adhesive layer 48 of the die 20, which can achieve a reduction in cost of the adhesive material.

The insulation layer 70 is disposed on the conductive base 101 and disposed on the semiconductor die 20. The insulation layer 70 includes an upper surface 701 and a surface 702 opposite to the upper surface 701. The insulation layer 70 encapsulates the upper surface 101u and the surface 101b of the conductive base 101 and encapsulates the semiconductor die 20. The insulation layer 70 also covers the lateral surface 103 of the conductive base 101. In some embodiments, a material of the protection layer 70 may include a polypropylene resin; however, other suitable materials may be additionally or alternatively used.

The surface 101b of the conductive base 101 is exposed from the insulation layer 70. A surface finish layer 74 is disposed on the surface 101b of the conductive base 101. The surface finish layer 74 may include any suitable conductive material (such as, for example, nickel (Ni), palladium (Pd), gold (Au), silver (Ag), Cu, and combinations of metals).

The interconnection structures 801 respectively electrically connect the patterned conductive layers 80 to the upper surface 201 of the semiconductor die 20. In some embodiments, the interconnection structures 801 are conductive vias formed through the insulation layer 70. A material of interconnection structures 801 and the patterned conductive layer 80 may include, for example, copper or other metal, or a metal alloy, or other conductive material.

The insulating layer 50 is disposed on the upper surface 701 of the insulating layer 70 and over the interconnection structures 801. In some embodiments, the insulating layer 50 may be a solder mask. A material of the insulation layer 50 may include an epoxy resin or other insulating materials used additionally or alternatively. Conductive connects 78 (e.g., solder balls) are disposed on the patterned conductive layers 80 through a conductive pad.

Figure 7:
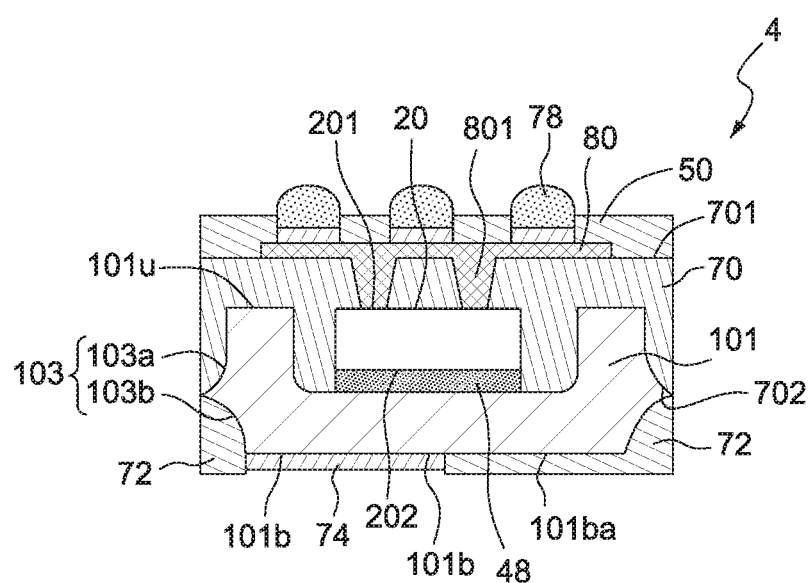
FIG. 7 is a cross-sectional view of some embodiments of a semiconductor device package in accordance with a fourth aspect of the present disclosure.

FIG. 7 is a cross-sectional view of some embodiments of a semiconductor device package 4 in accordance with a fourth aspect of the present disclosure. The semiconductor device package 4 is similar in some ways to the semiconductor device package 3 depicted in FIG. 6, and some same-numbered components are not described again with respect to FIG. 6. As shown in FIG. 7, the semiconductor device package 4 includes a conductive base 101, a semiconductor die 20, a conductive adhesive layer 48, insulation layers 50, 70 and 72, a patterned conductive layer 80, interconnection structures 801, a surface finish layer 74, and conductive connects 78. The insulation layer 70 may serve as a support layer.

The conductive base 101 includes an upper surface 101u and a surface 101b opposite to the upper surface 101u. The conductive base 101 also has a lateral surface 103 extended between the upper surface 101u and the surface 101b. The lateral surface 103 includes a portion 103a adjacent to the surface 101u of the conductive base 101 and a portion 103b adjacent to the surface 101b of the conductive base 101. The portion 103b of the lateral surface 103 of the conductive base 101 is curved such that it protrudes outwardly from the conductive base 101, the lateral surface 103 being more protruded at a center position of the lateral surface 103 than at a point where the lateral surface 103 meets the surface 101b of the conductive base 101. A material of the conductive base 101 may include, for example, copper (Cu), or other metal, or a metal alloy, or other conductive material. In some embodiments, the conductive base 101 may be a die paddle.

The conductive base 101 defines a cavity 30 in the upper surface 101u. The cavity 30 has a bottom surface 301. A semiconductor die 20 is disposed on the bottom surface 301 of the cavity 30. The cavity is formed in the conductive base 101 and can receive the semiconductor die 20, thus providing for decreased package thickness relative to embodiments without the cavity 30. A compact three-dimensional (3-D) embedded package can be achieved by such a design. A distance or space can be provided between the die 20 and the surface 101u of the conductive base 101, which can help to avoid damaging the die 20 during a lamination process.

In some embodiments, the semiconductor die 20 has an upper surface 201 and a surface 202 opposite the upper surface 201. The surface 202 of the semiconductor die 20 is bonded to the surface 101u of the conductive base 101 through conductive adhesive layer 48. The conductive adhesive layer 48 may include, for example, a conductive gel or epoxy film (epoxy mixed with a conductive material), or other conductive material.

The conductive adhesive layer 48 is disposed between the surface 201 of the semiconductor die 20 and the surface 101u of the conductive base 101. In some embodiments, the conductive adhesive layer 48 covers a portion of the surface 101u of the conductive base 101; in other embodiments, the conductive adhesive layer 48 covers substantially the entirety of the surface 101u. In some embodiments, the conductive adhesive layer 48 may contact a portion of one or more sidewalls of the semiconductor die 20. The conductive adhesive layer 48 attaches the semiconductor die 20 to the conductive base 101.

The insulation layer 70 is disposed on the conductive base 101 and disposed on the semiconductor die 20. The insulation layer 70 includes an upper surface 701 and a surface 702 opposite to the upper surface 701. The insulation layer 70 encapsulates the upper surface 101u and the surface 101b of the conductive base 101 and covers the semiconductor die 20. In some embodiments, a material of the insulation layer 70 may include a polypropylene resin; however, other suitable materials may be additionally or alternatively used. The insulation layer 70 covers the portion 103a of the lateral surface 103 of the conductive base 101.

The insulation layer 72 covers the portion 103b of the lateral surface 103 of the conductive base 101. The insulating layer 72 further covers a first portion 101ba of the surface 101b of the conductive base 101. A material of the insulation layer 70 is different from a material of the insulation layer 72. A material of the insulating layer 72 may include an epoxy resin or other insulating materials used additionally or alternatively. In some embodiments, a material of the insulating layer 72 may include material suitable for a solder mask.

The cavity 30, die 20 and the surface 101u, the surface 101b and the lateral surface 103 of the conductive base 101 can be protected by different materials (e.g. by the insulation layer 70 and second insulation layer 72). A distance or space between a drain of the die 20 and the surface 101b of the conductive base 101 can be configured (e.g. made large) to avoid the interference between the electrodes of the die 20.

The interconnection structures 801 electrically connect the patterned conductive layers 80 to the upper surface 201 of the semiconductor die 20. In some embodiments, the interconnection structures 801 are conductive vias formed through the insulating layer 70. A material of interconnection structures 801 and patterned conductive layer 80 may include, for example, copper or other metal, or a metal alloy, or other conductive material.

The insulation layer 50 is disposed on the upper surface 701 of the insulation layer 70 and over the interconnection structures 801. In some embodiments, the insulation layer 50 may be a solder mask. A material of the insulation layer 50 may include an epoxy resin or other insulating materials used additionally or alternatively. Conductive connects 78 (e.g., solder balls) are disposed on the patterned conductive layers 80 through conductive pads. The surface finish layer 74 is formed on the surface 101b of the conductive base 101. The surface finish layer 74 may include any suitable conductive material (such as, for example, nickel (Ni), palladium (Pd), gold (Au), silver (Ag), Cu, and combinations of metals). The surface finish layer 74 can protect a part of the surface 101b exposed from the insulation layer 72. The surface finish layer 74 is formed on a second part 101bb of the surface 101b of the conductive base 101. A first part 101ba of the surface 101b of the conductive base 101 is covered by the insulation layer 72.

Figure 8:
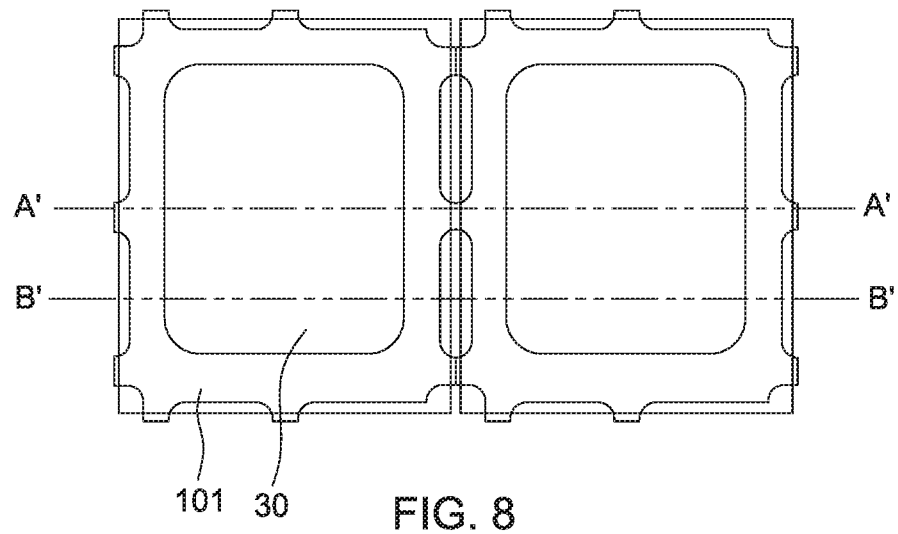
FIG. 8 is a top view of a conductive base in accordance with some embodiments of the present disclosure.
Figure 9A:
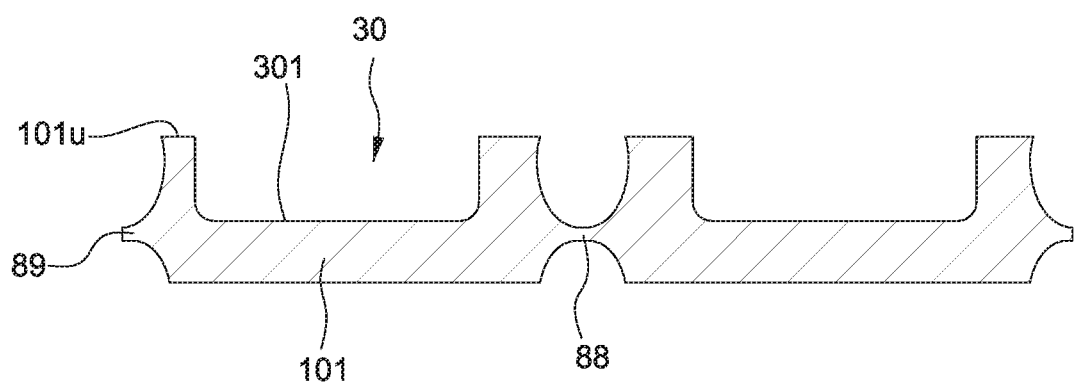
FIG. 9A, FIG. 9B, FIG. 9C, FIG. 9D, FIG. 9E, FIG. 9F, FIG. 9G, FIG. 9H, FIG. 9I, and FIG. 9J illustrate some embodiments of a method of manufacturing the semiconductor device package depicted in FIG. 7.

FIG. 8 is a top view of a conductive base 101 in accordance with some embodiments of the present disclosure. FIGS. 9A-9J illustrate some embodiments of a method of manufacturing the semiconductor device package 4 depicted in FIG. 7. In FIGS. 9A-9J, the cross-sectional view is taken along line A'-A' of FIG. 8. Referring to FIG. 9A, the conductive base 101 is provided. The conductive base 101 includes an upper surface 101u and a surface 101b opposite to the upper surface 101u. The conductive base 101 also includes a connect bar 88 and a protrusion 89. A material of the conductive base 101 includes, for example, copper or other metal, or a metal alloy, or other conductive material. The conductive base 101 defines a cavity 30 in the upper surface 101*u*. The cavity 30 has bottom surface 301. In some embodiments, the conductive base 101 is provided with the cavity 30 and is not etched to form the cavity 30. That is, the upper surface 101*u* of the conductive base 101 is not removed by an etching technique. The unetched structure of the conductive base 101, which may provide a relatively robust or strong structure, can be readily handled to facilitate subsequent electrical measurements/tests.

Figure 9B:
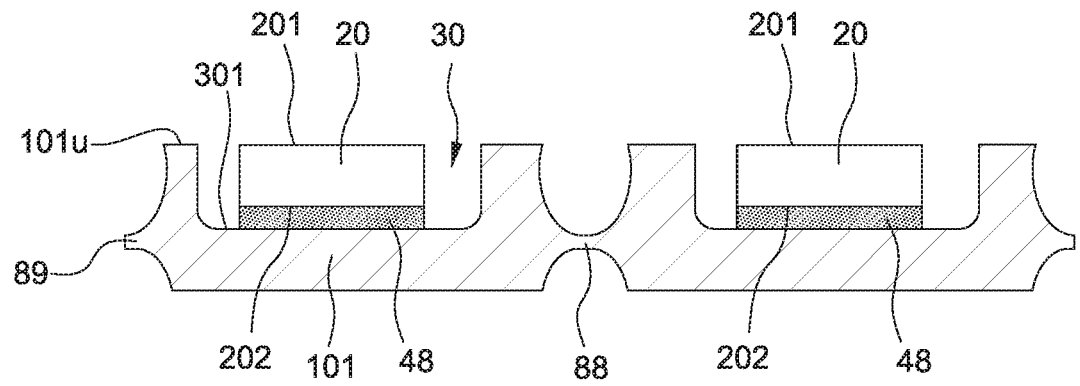

Referring to FIG. 9B, the adhesive layers 48 is disposed on the bottom surface 301 of the cavity 30. The adhesive layer 48 may include, for example, a conductive gel, epoxy film or epoxy mixed with a conductive material. A semiconductor die 20 is disposed on the conductive adhesive layer 48 in cavity 30. The conductive adhesive 48 can be used to attach the semiconductor die 20 to the bottom surface 301 of the cavity 30.

Figure 9C:
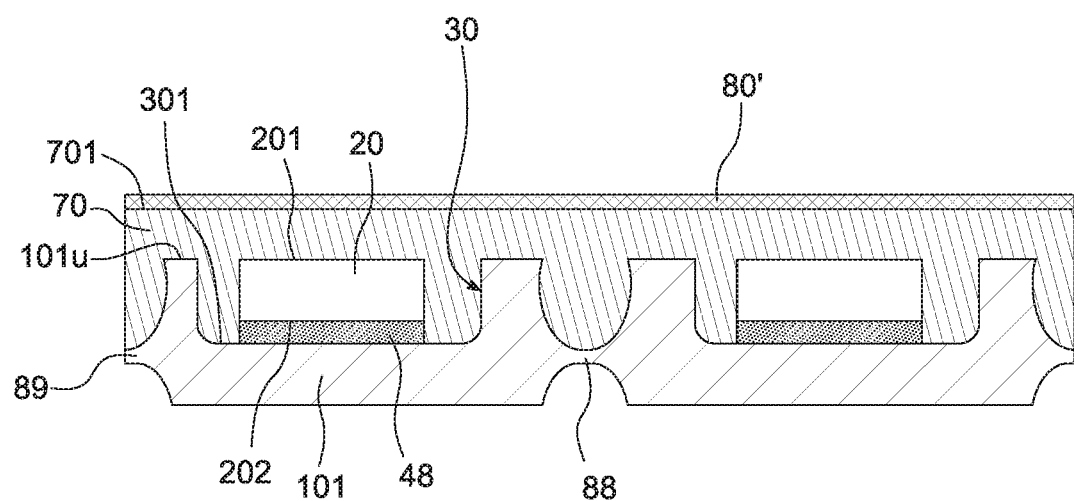
Figure 9D:
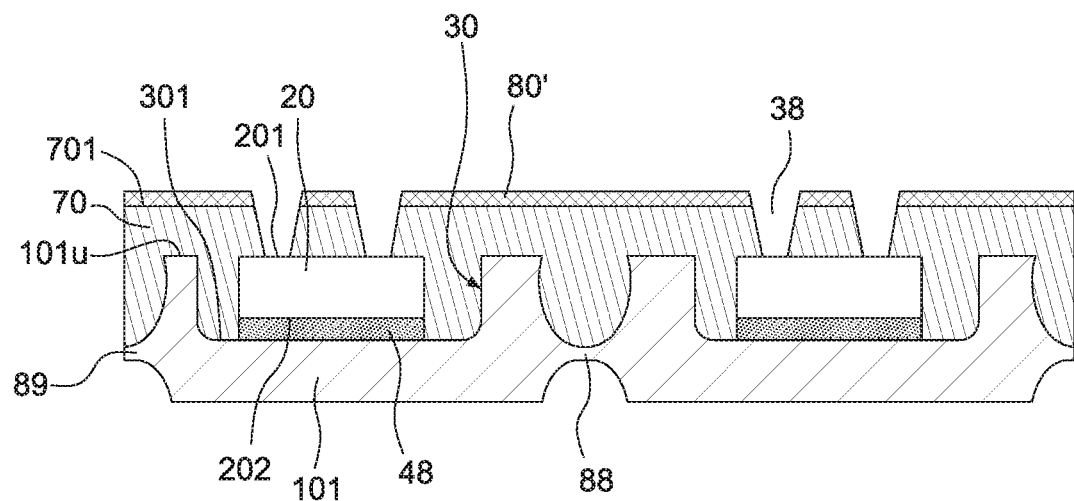
Figure 9E:
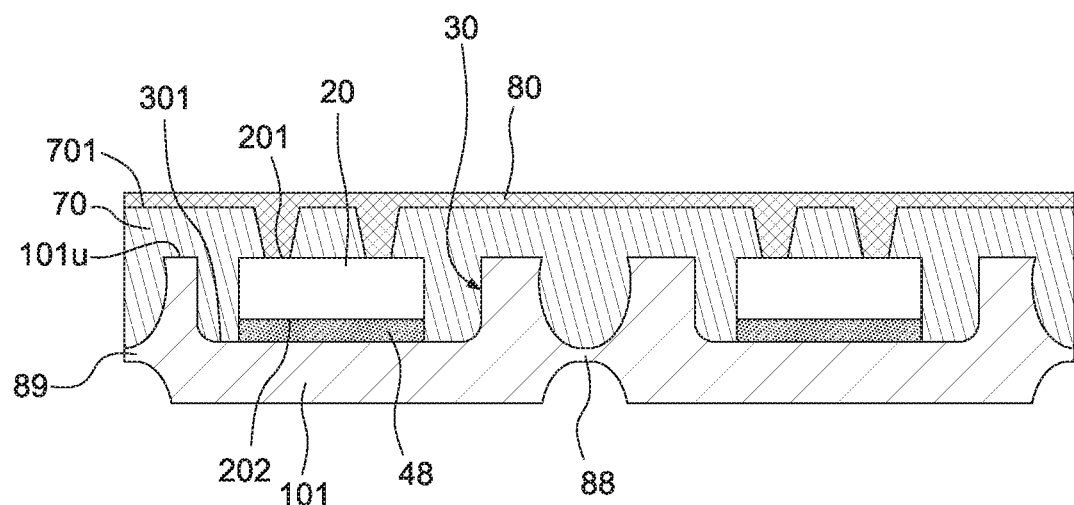

Referring to FIG. 9C, an insulation layer 70 is formed on the conductive base 101 and the semiconductor die 20 by a lamination technique. A material of the protection layer 70 may include, for example, a polypropylene resin or other suitable material. A portion of the insulation layer 70 is melted during lamination. A conductive layer 80' is disposed on the upper surface 701 of the insulation layer 70 by coating, sputtering, plating or another suitable technique. The conductive layer 80' may include, for example, aluminum or copper, or an alloy thereof (such as AlCu). Referring to FIG. 9D, vias 38 are formed through the insulation later 70 from the surface of the conductive layer 80'. The vias 38 may be formed, for example, by drilling. Referring to FIG. 9E, a thickness of conductive layer 80' is increased by coating, sputtering, plating or another suitable technique.

Figure 9F:
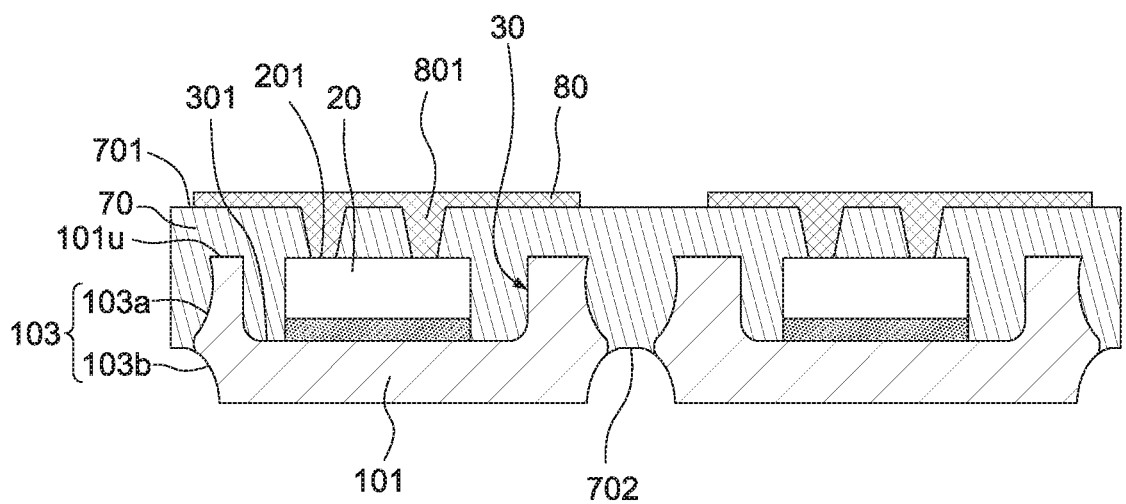

Referring to FIG. 9F, a portion of the conductive layer 80' is removed by a suitable technique, such as an etching process. The conductive layer 80 and the interconnection structures 801 are formed after etching. The connect bar 88 and the protrusion 89 are removed by a suitable technique, such as an etching process. After etching, the portions 103*a* and 103*b* of the lateral surface 103 are formed. The insulation later 70 covers the portions 103*a* of the lateral surface 103 and does not cover the portions 103*b* of the lateral surface 103.

Figure 9G:
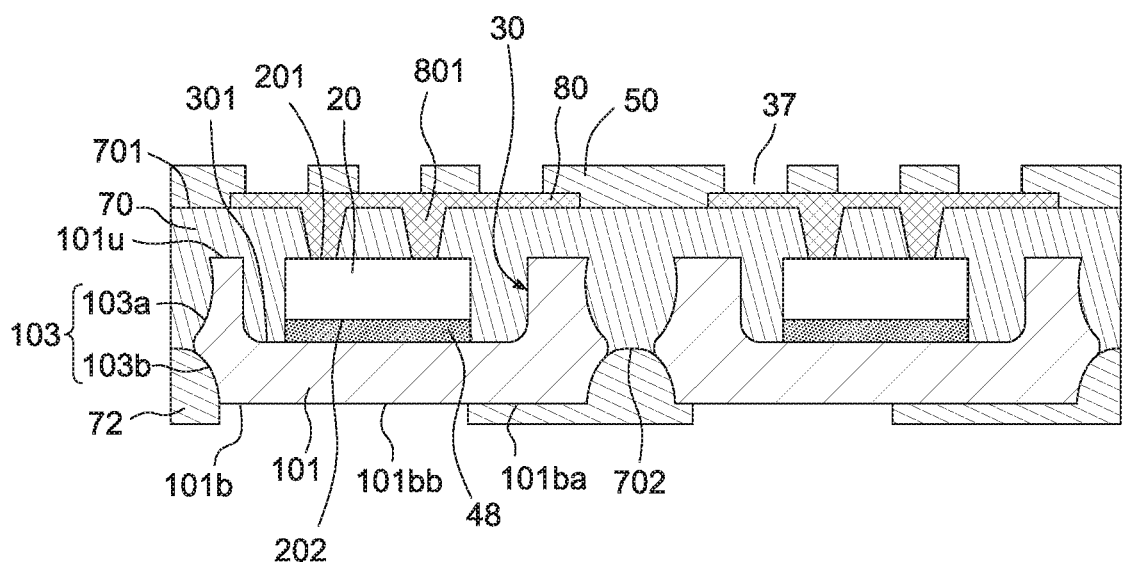

Referring to FIG. 9G, an insulating layer 50 is disposed on the upper surface 701 of the protection layer 70 and covers a portion of the surface of the conductive layer 80. The conductive layer 80 is exposed through vias 37. An insulating layer 72 is disposed on the first part 101*ba* of the surface 101*b* of the conductive base 101 and the surface 702 of the insulating layer 70. The insulating layer 72 also covers the portions 103*b* of the lateral surface 103.

Figure 9H:
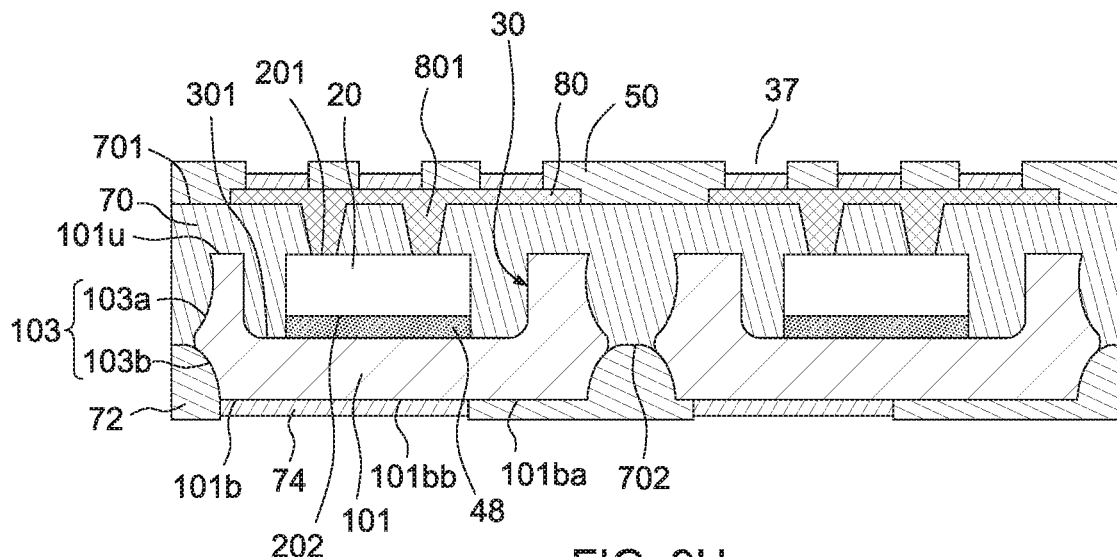
Figure 9I:
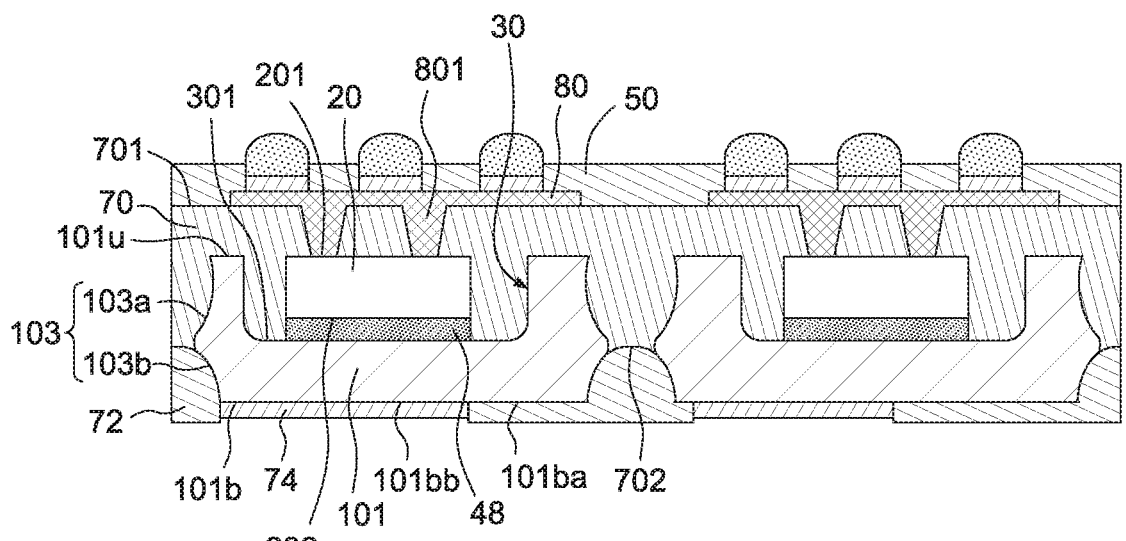
Figure 9J:
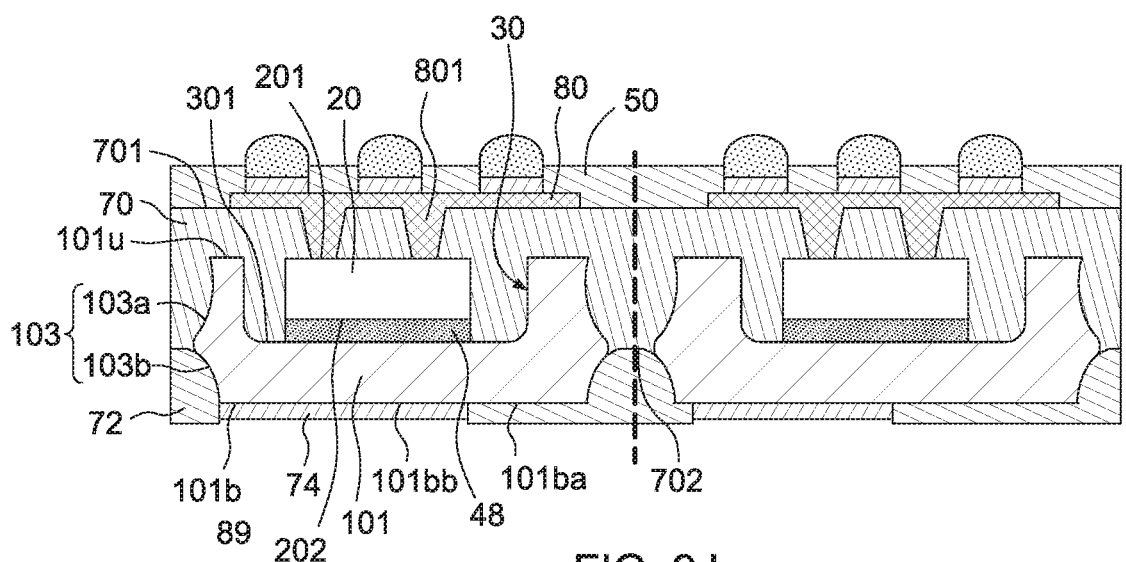

Referring to FIG. 9H, the surface finish layer 74 is formed on the surface 101*b* of the conductive base 101. The surface finish layer 74 may include any suitable conductive material (such as, for example, nickel (Ni), palladium (Pd), gold (Au), silver (Ag), Cu, and combinations of metals). Conductive pads are disposed on the exposed surface of the conductive layer 80 which is not covered by the insulating layer 50. Referring to FIG. 9I, the conductive connects 78 are filled into, or formed in, the vias 37 and cover the conductive pads. Referring to FIG. 9J, the semiconductor device package 4 as illustrated in FIG. 7 is formed by cutting through the sawing line as shown in the dotted line of FIG. 9J.

Figure 10A:
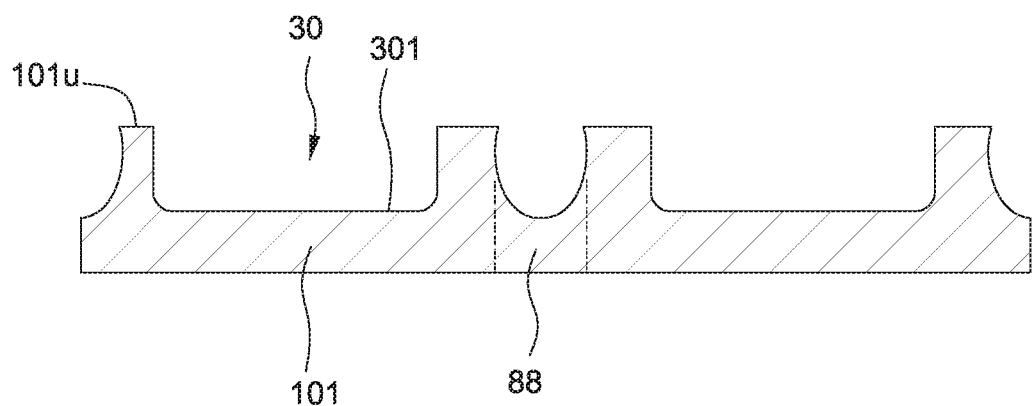
FIG. 10A, FIG. 10B, FIG. 10C, FIG. 10D, and FIG. 10E illustrate some embodiments of a method of manufacturing the semiconductor device package depicted in FIG. 7.

FIGS. 10A-10E illustrate some embodiments of a method of manufacturing the semiconductor device package 4 depicted in FIG. 7. The manufacturing methods shown in FIGS. 10A-10E are similar to the manufacturing methods shown in FIGS. 9A-9J, except for the structure of the conductive base 101. Referring to FIG. 10A, the conductive base 101 is provided. The conductive base 101 includes an upper surface 101*u* and a surface 101*b* opposite to the upper surface 101*u*. The conductive base 101 also includes connect bars 88 and 89. The connect bar 88 (as shown in the dotted line of FIG. 10A) is extended along the surface 101*b* of the conductive base 101. A material of the conductive base 101 includes, for example, copper or other metal, or a metal alloy, or other conductive material. The conductive base 101 defines a cavity 30 in the upper surface 101*u*.

Figure 10B:
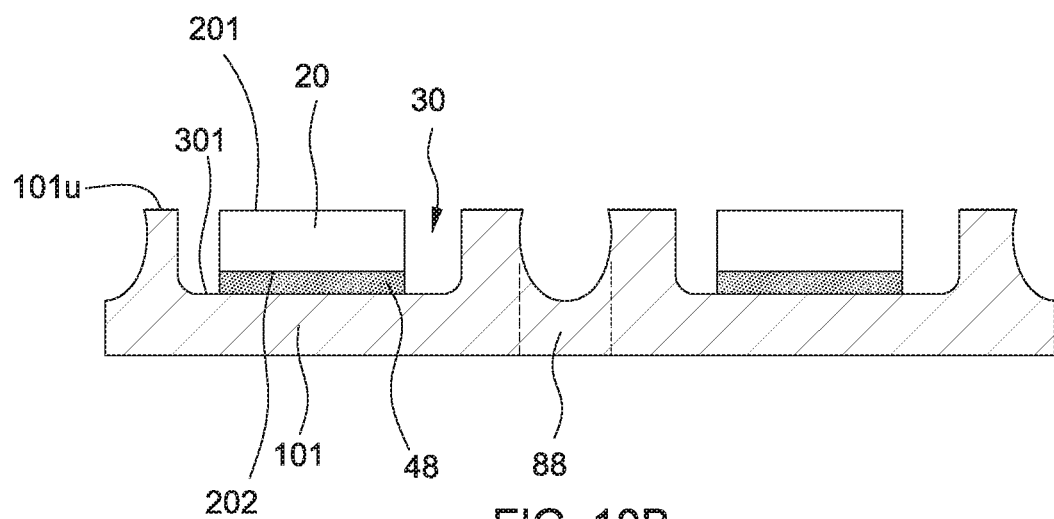

Referring to FIG. 10B, conductive adhesive layer 48 is disposed on the bottom surface 301 of the cavity 30. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 can be used to attach the semiconductor die 20 to the bottom surface 301 of the cavity 30.

Figure 10C:
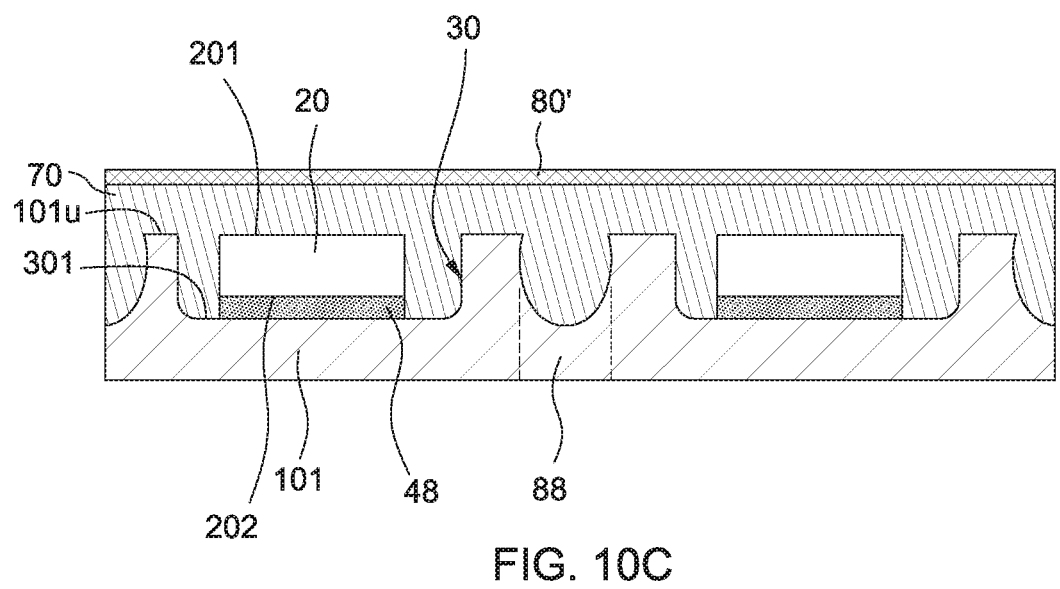

Referring to FIG. 10C, an insulation layer 70 is formed on the conductive base 101 and the semiconductor die 20 by a lamination technique. A material of the protection layer 70 may include, for example, a polypropylene resin or other suitable material. A portion of the insulation layer 70 is melted during lamination. A conductive layer 80' is disposed on the upper surface 701 of the insulation layer 70 by coating, sputtering, plating or another suitable technique. The conductive layer 80' may include, for example, aluminum or copper, or an alloy thereof (such as AlCu).

Figure 10D:
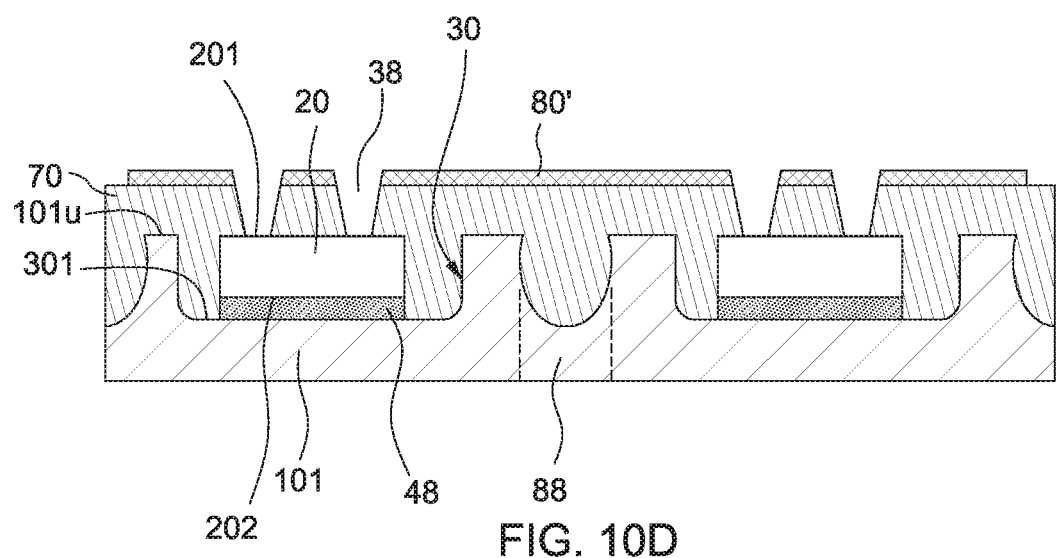
Figure 10E:
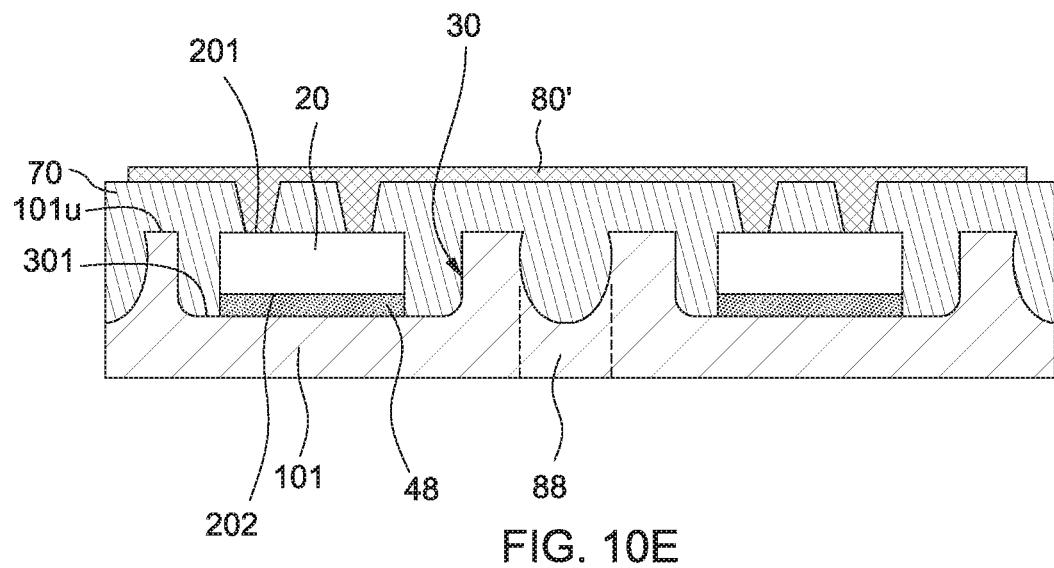

Referring to FIG. 10D, vias 38 are formed through the insulation later 70 from the surface of the conductive layer 80'. The vias 38 may be formed, for example, by drilling. Referring to FIG. 10E, a thickness of conductive layer 80' is increased by coating, sputtering, plating or another suitable technique. The connect bars 88 and 89 may be etched.

The embodiments of the manufacturing method after FIG. 10E are similar to the manufacturing method shown in FIGS. 9F-9J. The connect bar 88 and the protrusion 89 are removed by a suitable technique, such as an etching process. After removal, the subsequent manufacturing methods are not shown, since the subsequent manufacturing method for manufacturing the semiconductor device package 4 of FIG. 7 is similar to the manufacturing method shown in FIGS. 9F-9J.

Figure 11A:
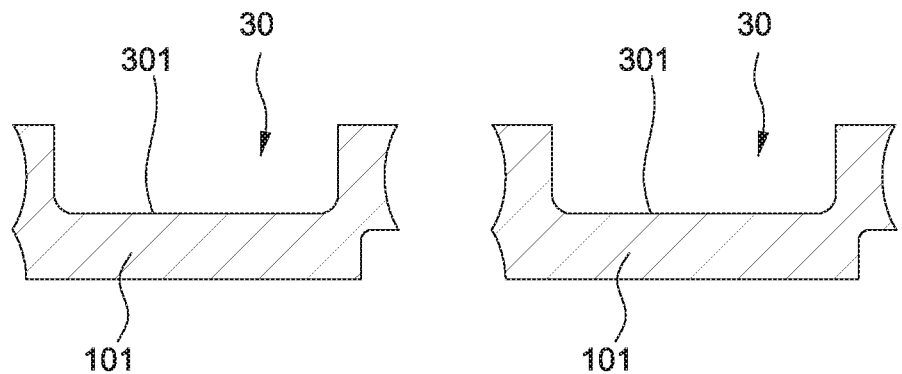
FIG. 11A, FIG. 11B, FIG. 11C, FIG. 11D, FIG. 11E, FIG. 11F, FIG. 11G, FIG. 11H, FIG. 11I, and FIG. 11J illustrate some embodiments of a method of manufacturing the semiconductor device package depicted FIG. 6.

FIGS. 11A-11J illustrate some embodiments of a method of manufacturing the semiconductor device package 4 of FIG. 7. In FIGS. 11A-11J, the cross-sectional view is taken along line B'-B' of FIG. 8. Referring to FIG. 11A, the conductive base 101 is provided. The conductive base 101 includes an upper surface 101*u* and a surface 101*b* opposite to the upper surface 101*u*. The conductive base 101 also includes a lateral surface 103. The lateral surface 103 includes a portion 103*a* and a portion 103*b*. A material of the conductive base 101 includes, for example, copper or other metal, or a metal alloy, or other conductive material. The conductive base 101 defines the cavity 30 in the upper surface 101*u*. The cavity 30 has the bottom surface 301. In some embodiments, the conductive base 101 is provided with the cavity 30 and is not etched to form the cavity 30.

Figure 11B:
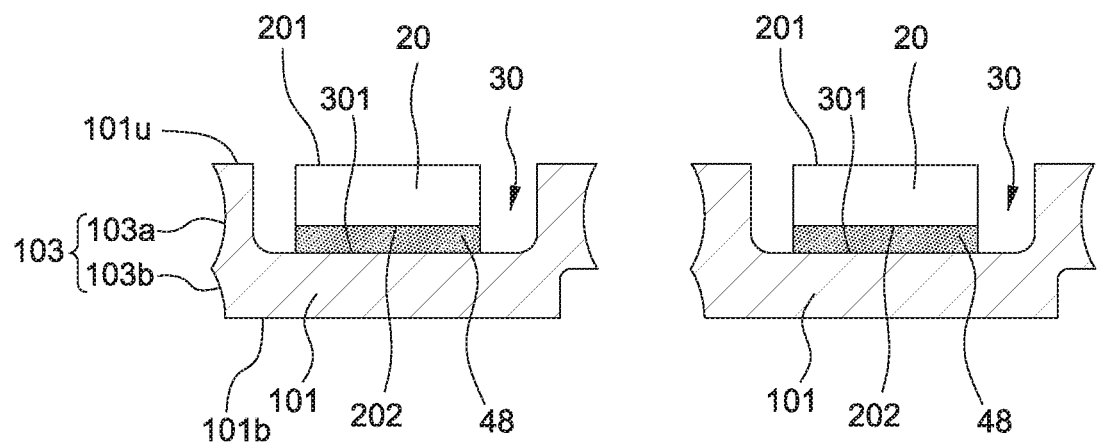

Referring to FIG. 11B, the semiconductor die 20 is disposed in the cavity 30 and attached to the bottom surface 301 of the cavity through the adhesive layer 48.

Figure 11C:
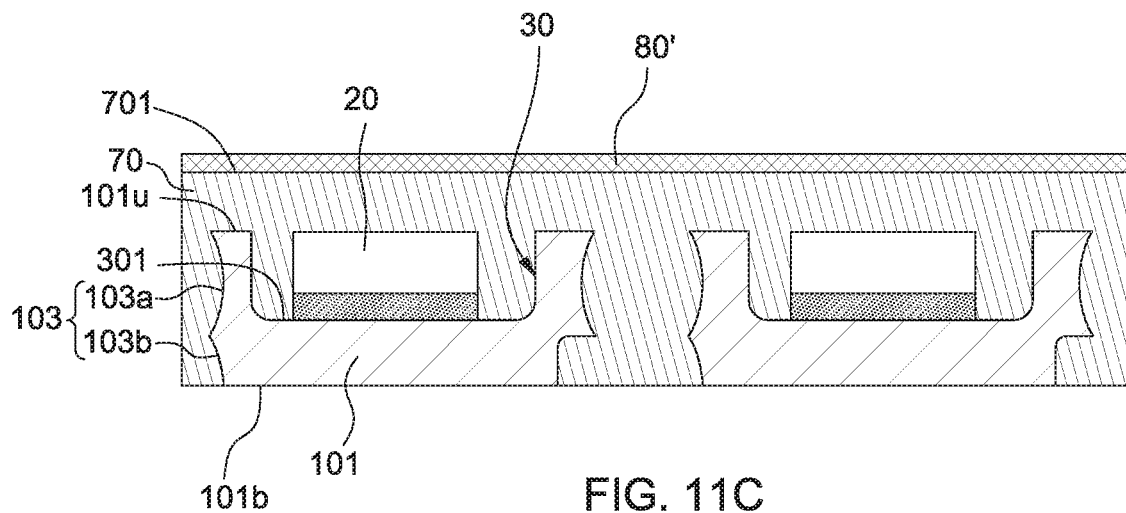

Referring to FIG. 11C, an insulation layer 70 is formed on the conductive base 101 and the semiconductor die 20 by a lamination technique. A material of the protection layer 70 may include, for example, a polypropylene resin or other suitable material. A portion of the insulation layer 70 is melted during lamination. The insulation later 70 covers the portion 103*a* and the portion 103*b* of the lateral surface 103. A conductive layer 80' is disposed on the upper surface 701 of the insulation layer 70 by coating, sputtering, plating or another suitable technique. The conductive layer 80' may include, for example, aluminum or copper, or an alloy thereof (such as AlCu).

Figure 11D:
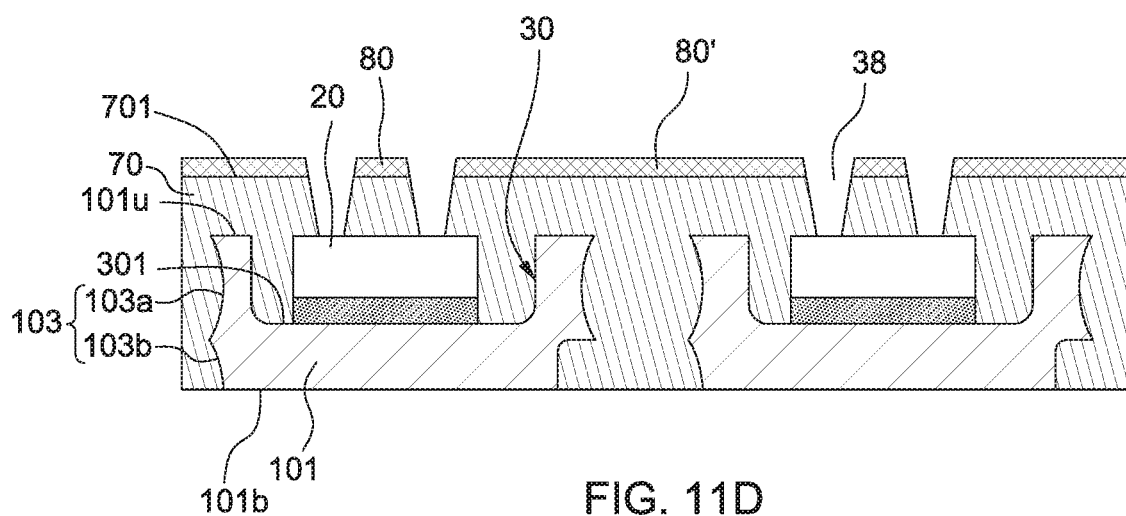
Figure 11E:
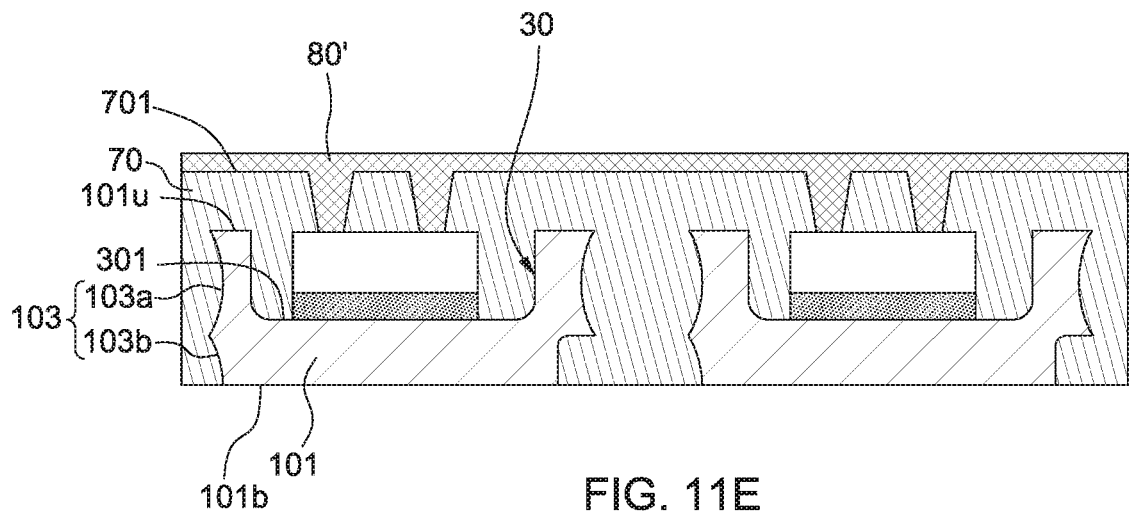

Referring to FIG. 11D, vias 38 are formed through the insulation later 70 from the surface of the conductive layer 80'. The vias 38 may be formed, for example, by drilling. Referring to FIG. 11E, a thickness of conductive layer 80' is increased by coating, sputtering, plating or another suitable technique.

Figure 11F:
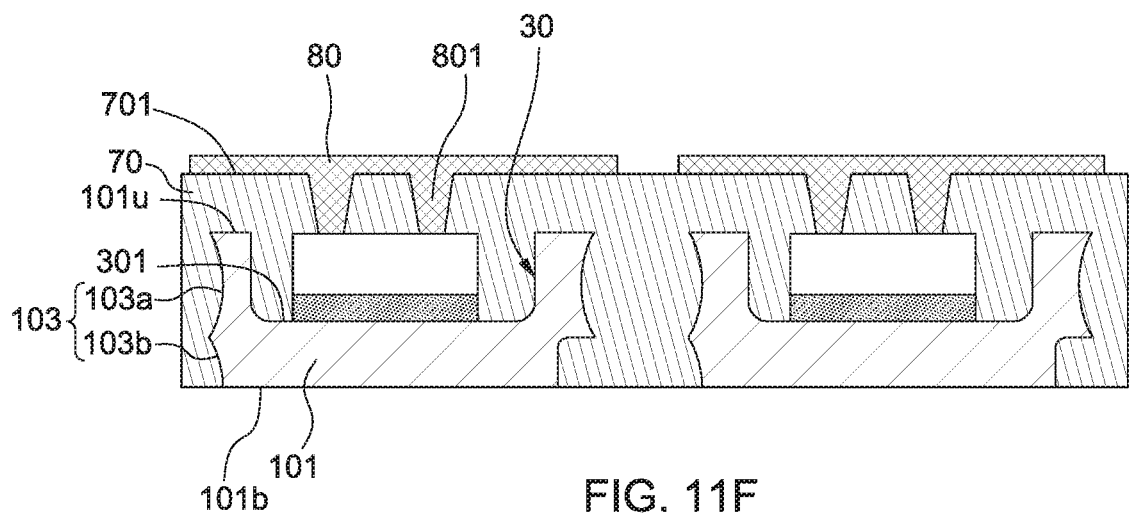

Referring to FIG. 11F, a portion of the conductive layer 80' is removed by a suitable technique, such as an etching process. The conductive layer 80 and the interconnection structures 801 are formed after etching.

Figure 11G:
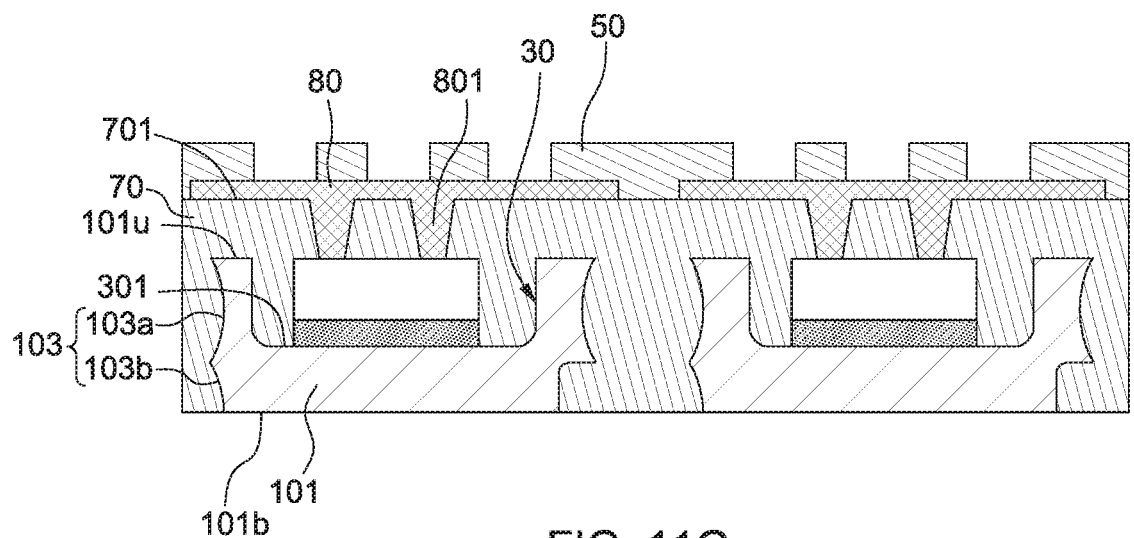

Referring to FIG. 11G, an insulating layer 50 is disposed on the upper surface 701 of the protection layer 70 and covers a portion of the surface of the conductive layer 80. The conductive layer 80 is exposed through vias 37.

Figure 11H:
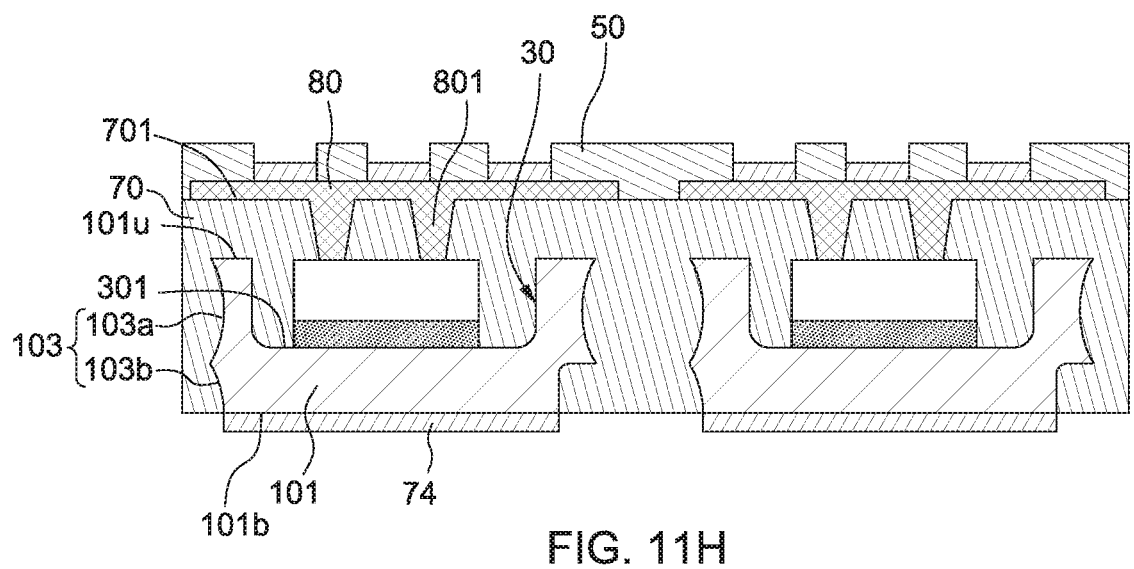
Figure 11I:
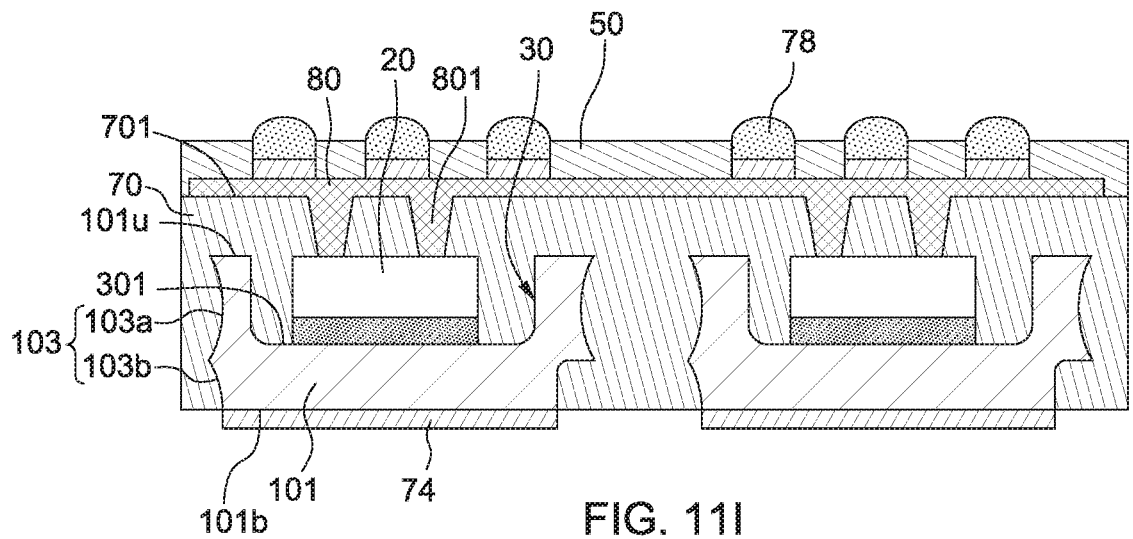
Figure 11J:
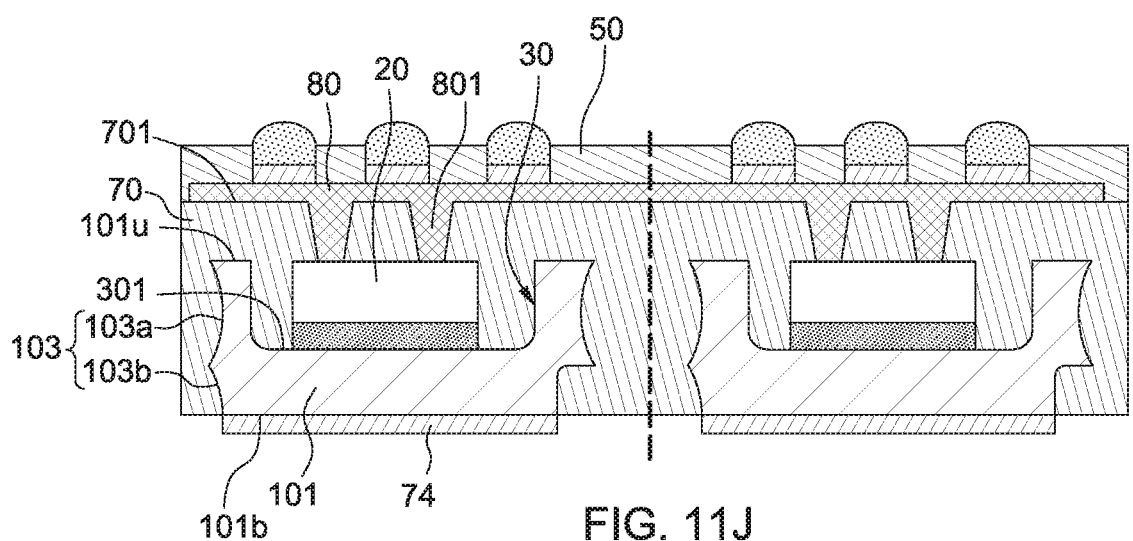

Referring to FIG. 11H, the surface finish layer 74 is formed on the surface 101*b* of the conductive base 101. The surface finish layer 74 may include any suitable conductive material (such as, for example, nickel (Ni), palladium (Pd), gold (Au), silver (Ag), Cu, and combinations of metals). Conductive pads are disposed on the exposed surface of the conductive layer 80 which is not covered by the insulating layer 50. Referring to FIG. 11I, the conductive connects 78 are filled into, or formed in, the vias 37 to cover the conductive pads. Referring to FIG. 11J, the semiconductor device package 4 as illustrated in FIG. 7 is formed by cutting through the sawing line as shown in the dotted line of FIG. 11J.

Figure 12:
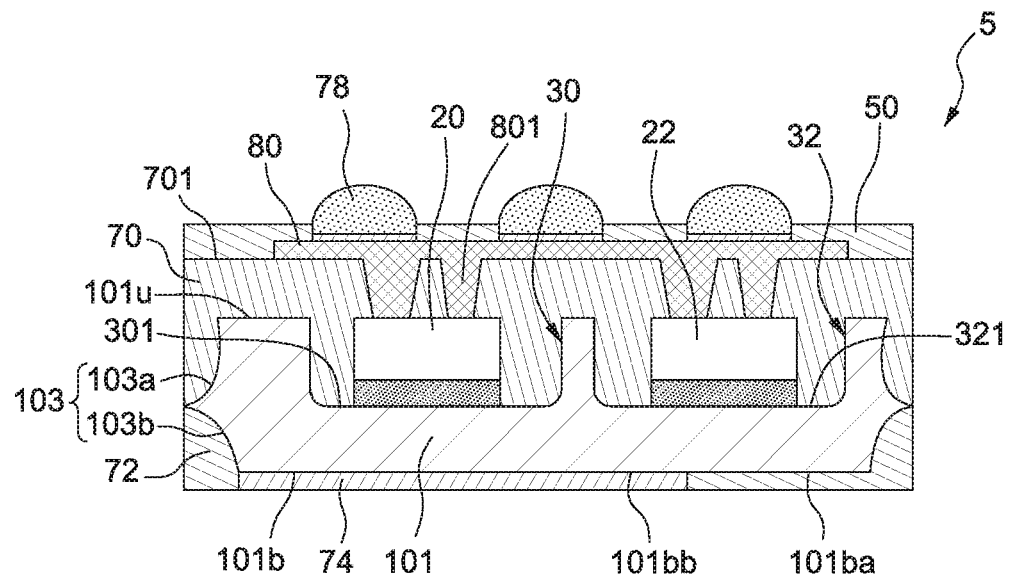
FIG. 12 is a cross-sectional view of some embodiments of a semiconductor device package in accordance with a fifth aspect of the present disclosure.

FIG. 12 is a cross-sectional view of some embodiments of a semiconductor device package 5 in accordance with a fifth aspect of the present disclosure. The semiconductor device package 5 is similar in some ways to the semiconductor device package 4 of FIG. 7, and some same-numbered components are not described again with respect to FIG. 12. The semiconductor device package 5 includes a conductive base 101, semiconductor dies 20 and 22, adhesive layers 48, insulation layers 50, 70 and 72, patterned conductive layers 80, interconnection structures 801, a surface finish layer 74, and conductive connects 78. The semiconductor device package 5 includes two cavities 30 and 32. The conductive base 101 defines the cavity 30 in the upper surface 101*u*. The conductive base 101 also defines the cavity 32 in the upper surface 101*u*. The cavity 30 has a bottom surface 301. The cavity 32 has a bottom surface 321. The surface finish layer 74 is formed on a second part 101*bb* of the surface 101*b* of the conductive base 101. A first part 101*ba* of the surface 101*b* of the conductive base 101 is covered by the insulation layer 72.

Figure 13:
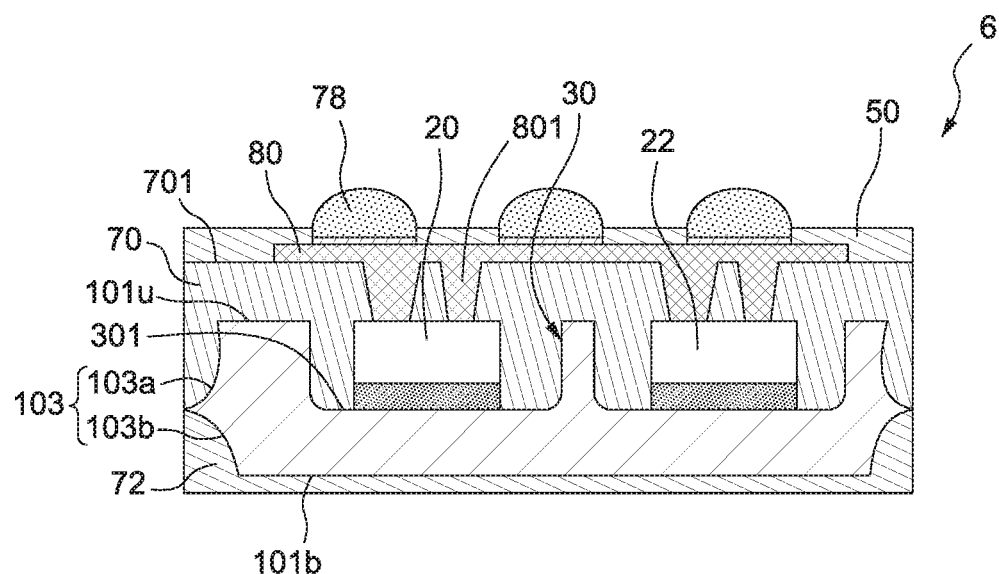
FIG. 13 is a cross-sectional view of some embodiments of a semiconductor device package in accordance with a sixth aspect of the present disclosure.

FIG. 13 is a cross-sectional view of some embodiments of a semiconductor device package 6 in accordance with a sixth aspect the present disclosure. The semiconductor device package 6 is similar in some ways to the semiconductor device package 4 of FIG. 7, and some same-numbered components are not described again with respect to FIG. 13. The semiconductor device package 6 includes a conductive base 101, semiconductor dies 20 and 22, conductive adhesive layers 48, insulation layers 50, 70 and 72, patterned conductive layers 80, interconnection structures 801, and conductive connects 78. The semiconductor device package 6 includes two cavities 30 and 32. The conductive base 101 defines the cavity 30 in the upper surface 101*u*. The conductive base 101 also defines the cavity 32 in the upper surface 101*u*. The cavity 30 has a bottom surface 301. The cavity 32 has a bottom surface 321. The insulation layer 70 covers the portion 103*a* of the lateral surface 103 and the insulation layer 72 covers the portion 103*b* of the lateral surface 103. The insulation layer 72 also covers the surface 101*b* of the conductive base 101.

Figure 14:
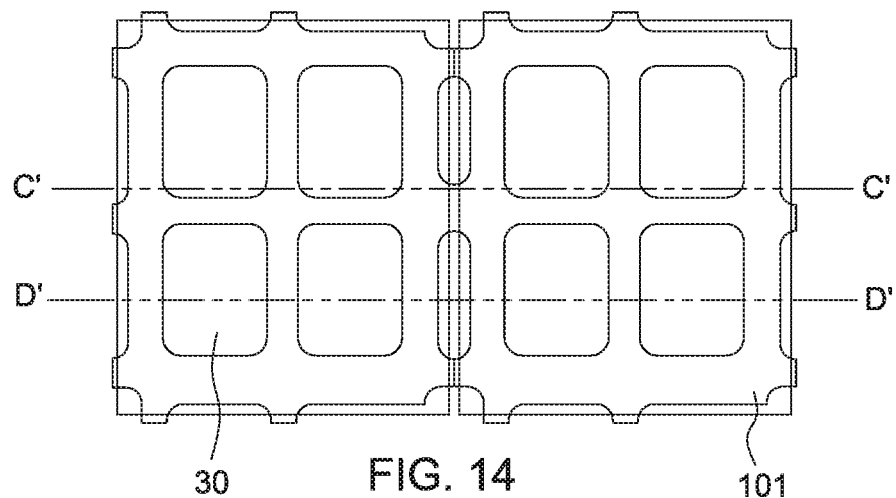
FIG. 14 is a top view of some embodiments of a conductive base in accordance with some aspects of the present disclosure.

FIG. 14 is a top view of some embodiments of a conductive base 101 in accordance with some aspects of the present disclosure. The conductive base 101 of FIG. 14 includes four units, each unit including two cavities 30.

Figure 15:
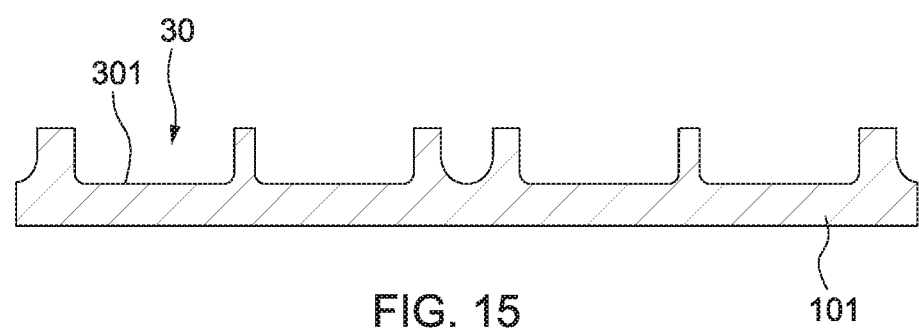
FIG. 15 is a cross-sectional view of some embodiments of a conductive base in accordance with some aspects of the present disclosure.

FIG. 15 is a cross-sectional view of some embodiments of a conductive base 101 taken along line C'-C' of FIG. 14 in accordance with some aspects of the present disclosure. In FIG. 15, the conductive base 101 includes two units before cutting. Each unit includes two cavities 30.

Figure 16:
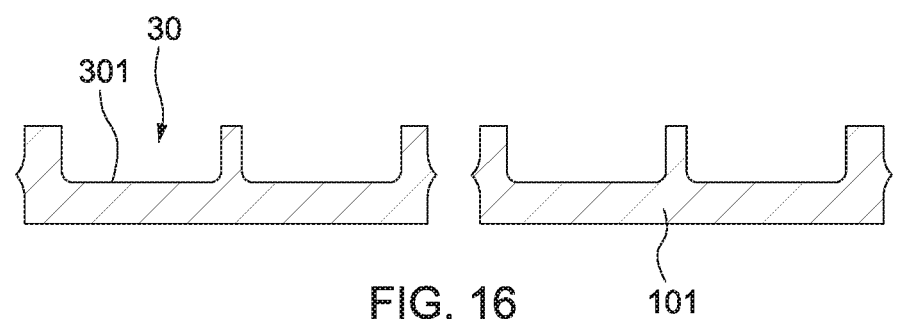
FIG. 16 is a cross-sectional view of some embodiments of a conductive base in accordance some aspects of the present disclosure.

FIG. 16 is a cross-sectional view of some embodiments of a conductive base 101 taken along line D'-D' of FIG. 14 in accordance with some aspects of the present disclosure. As shown in FIG. 16, each conductive base 101 includes two cavities 30.

Figure 17:
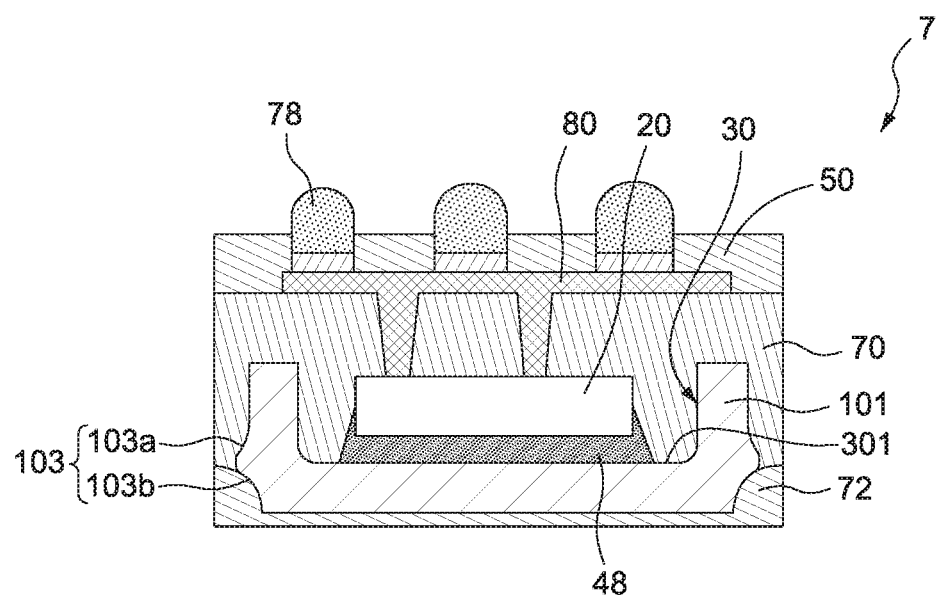
FIG. 17 is a cross-sectional view of some embodiments of a semiconductor device package in accordance with a seventh aspect of the present disclosure.

FIG. 17 is a cross-sectional view of some embodiments of a semiconductor device package 7 in accordance with a seventh aspect of the present disclosure. The semiconductor device package 7 is similar in some ways to the semiconductor device package 4 of FIG. 7, and some same-numbered components are not described again with respect to FIG. 17. The semiconductor device package 7 includes a conductive base 101, a semiconductor die 20, conductive adhesive layers 48, insulation layers 50, 70 and 72, patterned conductive layers 80, interconnection structures 801, and conductive connects 78. The insulation layer 70 covers the portion 103*a* of the lateral surface 103 and the insulation layer 72 covers the portion 103*b* of the lateral surface 103. The insulation layer 72 also covers the surface 103*b* of the conductive base 103. The insulation layer 70 adjacent to the portion 103*a* has a curved shape that fills in a recess defined by the portion 103*a*.

Figure 18:
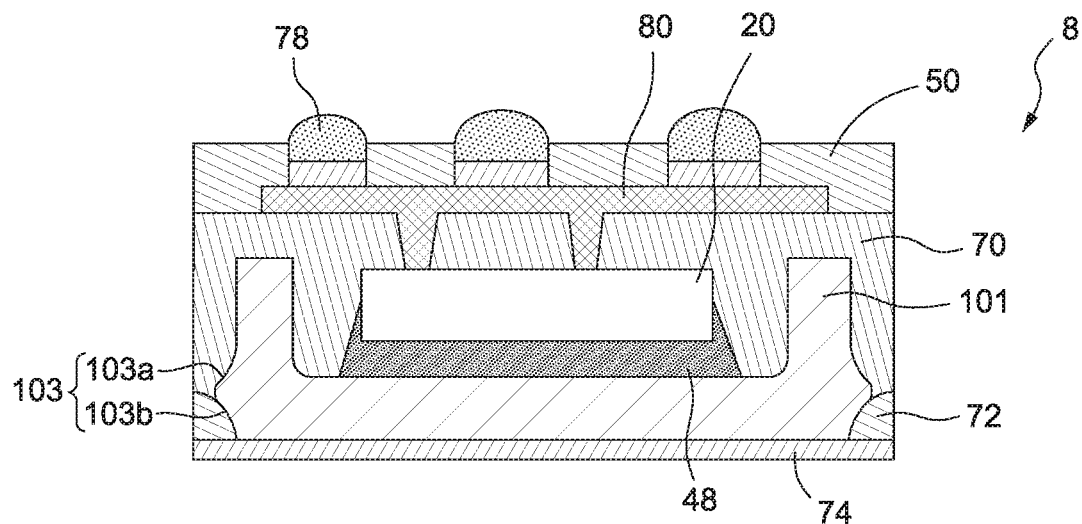
FIG. 18 is a cross-sectional view of some embodiments of a semiconductor device package in accordance with an eighth aspect of the present disclosure.

FIG. 18 is a cross-sectional view of some embodiments of a semiconductor device package 8 in accordance with an eighth aspect of the present disclosure. The semiconductor device package 8 is similar in some ways to the semiconductor device package 4 of FIG. 7, and some same-numbered components are not described again with respect to FIG. 18. The semiconductor device package 8 includes a conductive base 101, a semiconductor die 20, conductive adhesive layers 48, insulation layers 50, 70 and 72, patterned conductive layers 80, interconnection structures 801, a finish layer 74 and conductive connects 78. The insulation layer 70 covers the portion 103*a* of the lateral surface 103 and the insulation layer 72 covers the portion 103*b* of the lateral surface 103. The surface finish layer 74 covers the surface 103*b* of the conductive base 103. The insulation layer 70 adjacent to the portion 103*a* includes a curved shape that fills in a recess defined by the portion 103*a*.

Figure 19A:
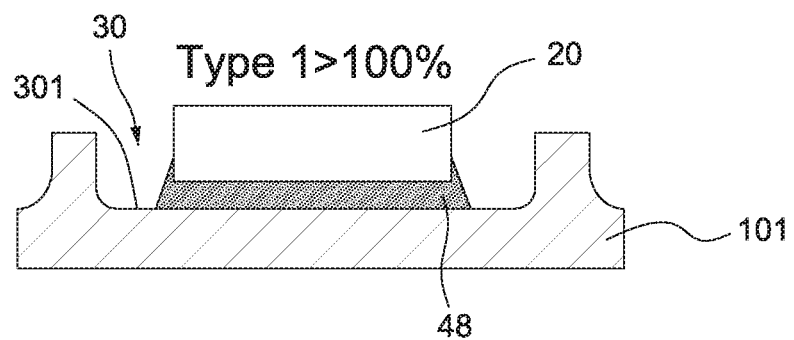
FIG. 19A and FIG. 19B are cross-sectional views of a semiconductor device package in accordance with some embodiments of the present disclosure.
Figure 19B:
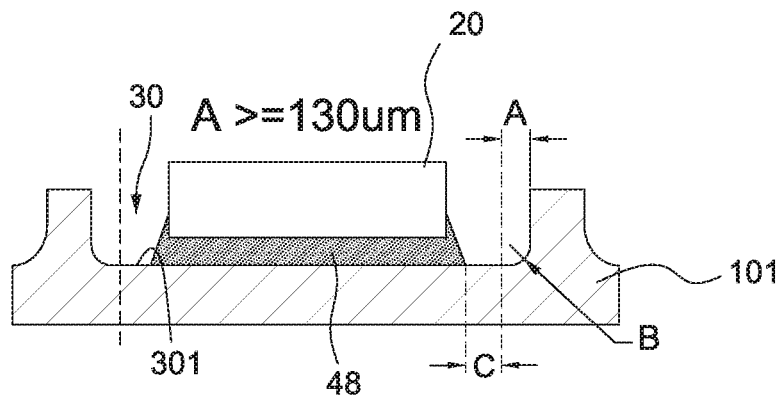

FIG. 19A and FIG. 19B are cross-sectional views of a semiconductor device package in accordance with some embodiments of the present disclosure. In FIGS. 19A and 19B, the embodiments are shown for the purpose of describing a type of the conductive adhesive layer 48. In Type 1, the conductive adhesive layer 48 covers a portion of the surface 301 of the cavity 30 and contacts a portion of one or more sidewalls of the semiconductor die 20. The conductive adhesive layer 48 attaches the die 20 to the surface 301 of the cavity 30. In FIG. 19B, the conductive adhesive layer 48 is separated from the corner B (which is the joint of the sidewall and the bottom of the cavity) of the cavity 30, which can provide for avoiding or mitigating a structural crack of the insulation layer 70 (not shown). To achieve this advantage, a distance A between the conductive adhesive layer 48 and the sidewall of the cavity 30 can be larger than a distance in a range of about 110 µm to about 130 µm. A distance C between a main portion (e.g. more than 50%, or more than 75%, or more than 90%, or more than 95%, or more than 99%) of the conductive adhesive layer 48 and the corner B can be a distance in a range of about 70 µm (micrometers) to about 90 µm.

Figure 20A:
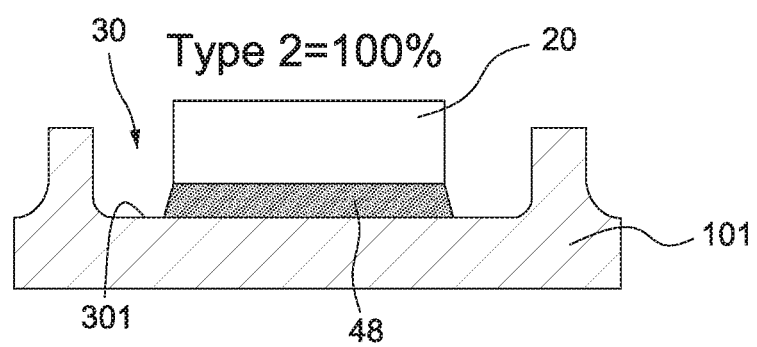
FIG. 20A and FIG. 20B are cross-sectional views of a semiconductor device package in accordance with some embodiments of the present disclosure.
Figure 20B:
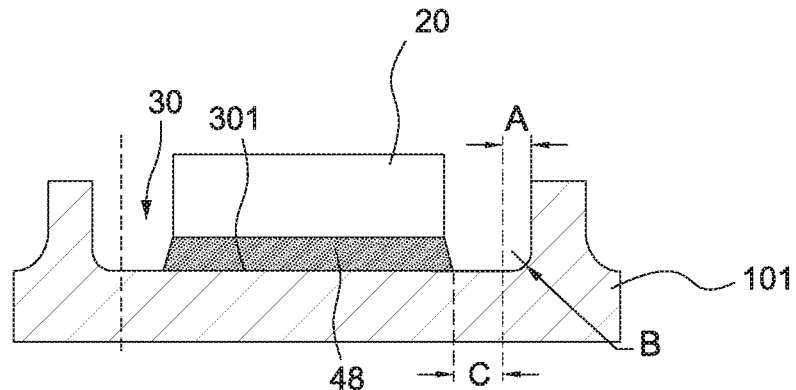

FIG. 20A and FIG. 20B are cross-sectional views of a semiconductor device package in accordance with some embodiments of the present disclosure. In FIGS. 20A and 20B, the embodiments are shown for the purpose of describing type of the conductive adhesive layer 48. In Type 2, the conductive adhesive layer 48 covers a portion of the surface 301 of the cavity 30 and does not contact a portion of one or more sidewalls of the semiconductor die 20. The conductive adhesive layer 48 contacts about 100% of the surface 201 of the die 20. The conductive adhesive layer 48 attaches the die 20 to the surface 301 of cavity 30. In the embodiments depicted in FIG. 20B, a distance A between the conductive adhesive layer 48 and the sidewall of the cavity 30 can be larger than a distance in a range of about 110 µm to about 130 µm. A distance C between a main portion (e.g. more than 50%, or more than 75%, or more than 90%, or more than 95%, or more than 99%) of the conductive adhesive layer 48 and the corner B can be a distance in a range of about 70 µm to about 90 µm.

Figure 21A:
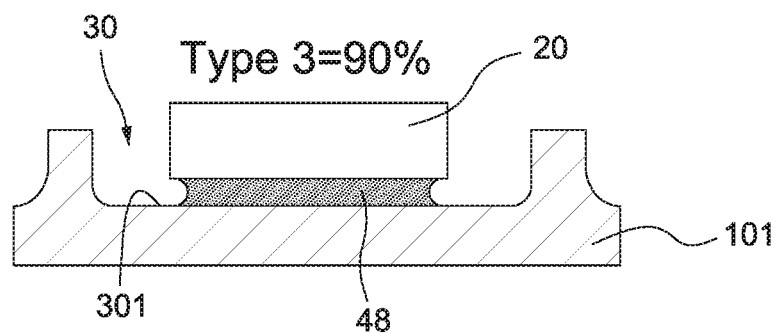
FIG. 21A and FIG. 21B are cross-sectional views of a semiconductor device package in accordance with some embodiments of the present disclosure.
Figure 21B:
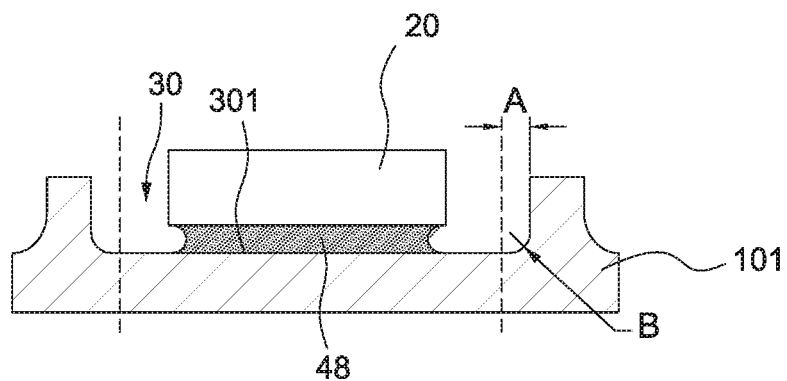

FIG. 21A and FIG. 21B are cross-sectional views of a semiconductor device package in accordance with some embodiments of the present disclosure. In FIGS. 21A and 21B, the embodiments are shown for the purpose of describing the type of the conductive adhesive layer 48. In Type 3, the conductive adhesive layer 48 covers a portion of the surface 301 of the cavity 30 and the conductive adhesive layer 48 contacts about 90%, or less, of the surface 201 of the die 20. In FIG. 21B, a distance A between the conductive adhesive layer 48 and the sidewall of the cavity 30 can be larger than a distance in a range of about 110 µm to about 130 µm. This can provide for reducing an amount of the adhesive layer 48, which can reduce a cost of materials.

Figure 22A:
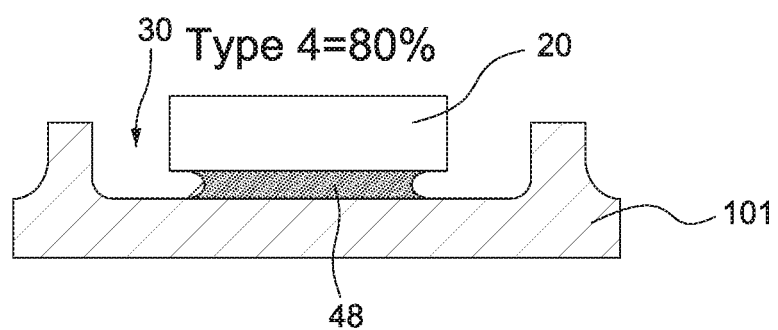
FIG. 22A and FIG. 22B are cross-sectional views of a semiconductor device package in accordance with some embodiments of the present disclosure.
Figure 22B:
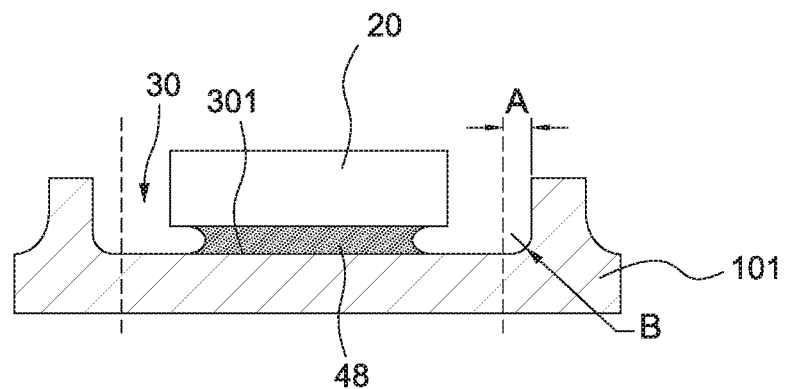

FIG. 22A and FIG. 22B are cross-sectional views of a semiconductor device package in accordance with some embodiments of the present disclosure. In FIGS. 22A and 22B, the embodiments are shown for the purpose of describing the type of the conductive adhesive layer 48. In Type 4, the conductive adhesive layer 48 covers a portion of the surface 301 of the cavity 30 and the conductive adhesive layer 48 contacts about 80%, or less, of the surface 201 of the die 20. In FIG. 22B, a distance A between the conductive adhesive layer 48 and the sidewall of the cavity 30 can be larger than a distance in a range of about 110 µm to about 130 µm. This can provide for reducing an amount of the adhesive layer 48, which can reduce a cost of materials.

Figure 23A:
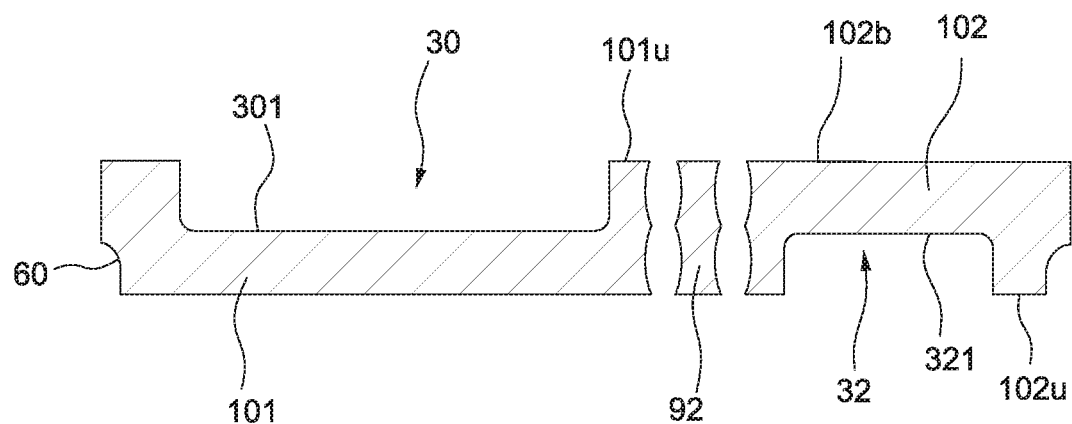
FIG. 23A, FIG. 23B, FIG. 23C, FIG. 23D, FIG. 23E, FIG. 23F, FIG. 23G, FIG. 23H, and FIG. 23I illustrate some embodiments of a method of manufacturing a semiconductor device package according to a ninth aspect.

FIGS. 23A-23I illustrate some embodiments of a method of manufacturing a semiconductor device package 10. Referring to FIG. 23A, conductive bases 101 and 102 are provided. The conductive base 101 includes an upper surface 101u and a surface 101b opposite to the upper surface 101u. The conductive base 102 includes an upper surface 102u and a surface 102b opposite to the upper surface 102u. A material of the conductive bases 101 and 102 includes, for example, copper or other metal, or a metal alloy, or other conductive material. A connecting element 90 is formed, for example, by drilling. The conductive base 101 defines a cavity 30 in the upper surface 101u. The conductive base 102 defines a cavity 32 in the upper surface 102u. The cavity 30 has bottom surface 301. The cavity 32 has bottom surface 321. In some embodiments, the conductive base 101 is provided with the cavity 30 and is not etched to form the cavity 30. That is, the upper surface 101u of the conductive base 101 is not removed by an etching technique. The unetched structure of the conductive base 101, which may provide a robust or strong structure, is readily handled to facilitate subsequent electrical measurements/tests. The conductive base 101 defines one or more curved structures 60. Curved structures 60 of the conductive base 101 are smoothed and can help to redistribute stress and avoid or mitigate damage to the insulation layer 70 during a lamination process. The structures of the conductive bases 101 and 102 may be formed similar manners.

Figure 23B:
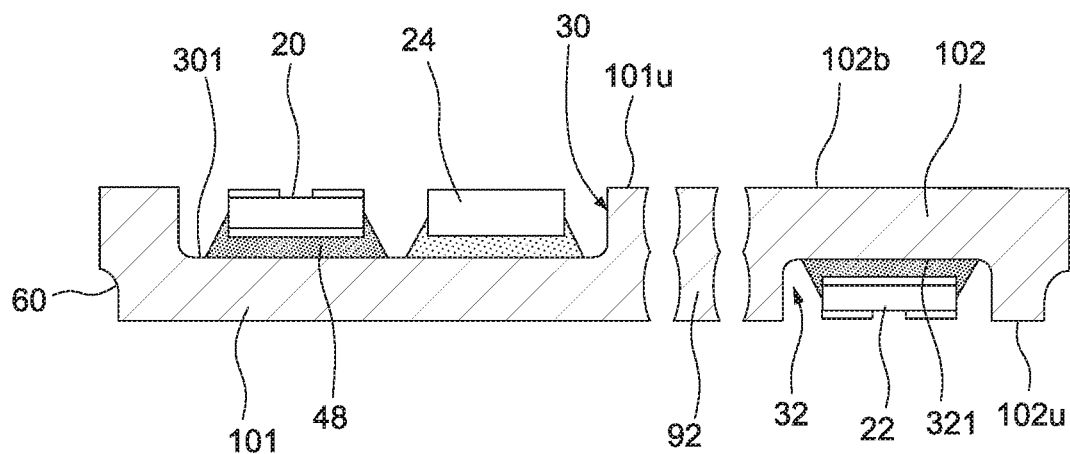

Referring to FIG. 23B, conductive adhesive layers 48 is disposed on the bottom surface 301 of the cavity 30 and on the bottom surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 is used to attach the semiconductor die 20 to the bottom surface 301 of the cavity 30. The semiconductor dies 22 and 24 may be disposed in a similar manner.

Figure 23C:
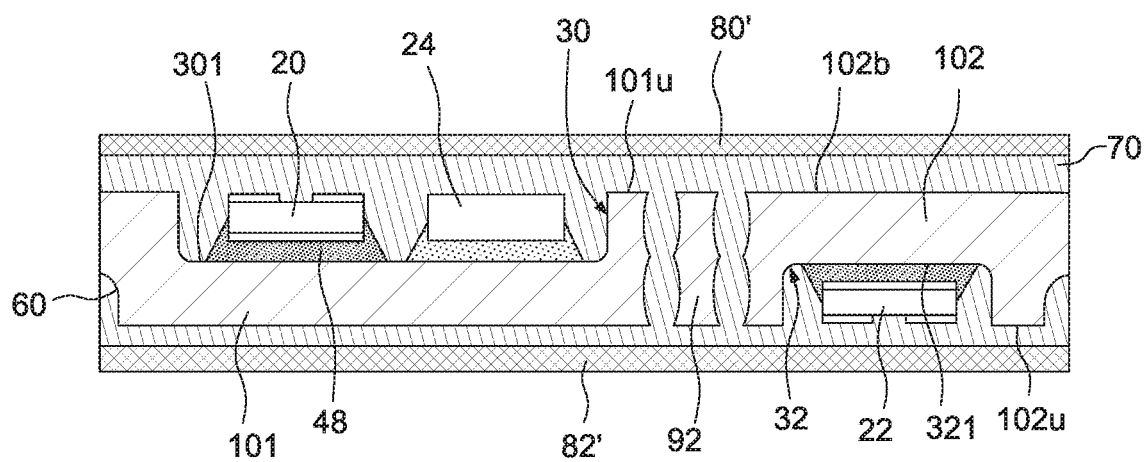

Referring to FIG. 23C, a protection layer 70 is formed on the conductive bases 101 and 102 and the semiconductor dies 20, 22 and 24 by a lamination technique. The insulation layer 70 also covers the curved structures 60. A material of the insulation layer 70 may include, for example, a polypropylene resin or other suitable material. A portion of the insulation layer 70 is melted during lamination. A conductive layer 80' is disposed on the upper surface 701 of the insulation layer 70 by coating, sputtering, plating or another suitable technique. A conductive layer 82' is disposed on the surface 702 of the insulation layer 70 by coating, sputtering, plating or another suitable technique. The conductive layers 80' and 82' may include, for example, aluminum or copper, or an alloy thereof (such as AlCu).

Figure 23D:
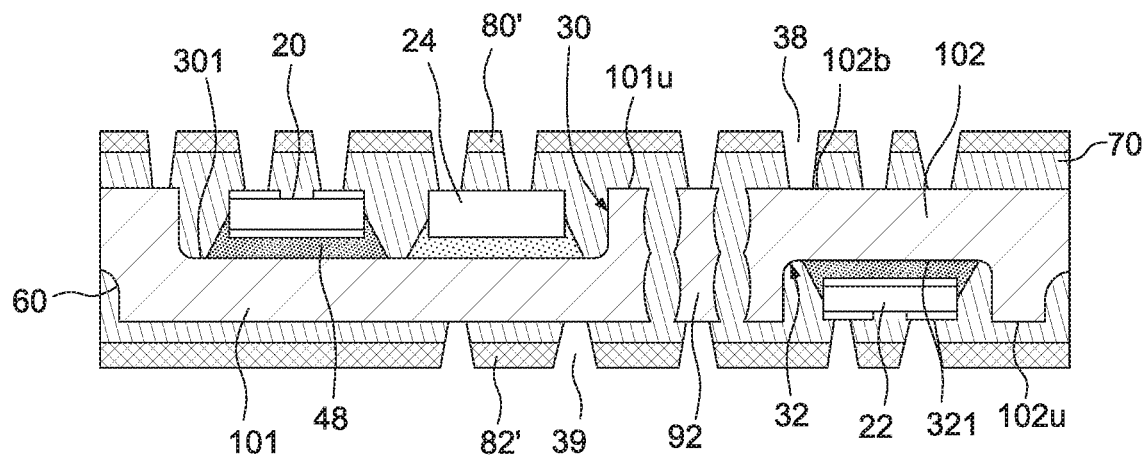

Referring to FIG. 23D, vias 38 are formed through the insulation later 70 from the surface of the conductive layer 80' and vias 39 are formed through the insulation later 70 from the surface of the conductive layer 82'. The vias 38 and 39 may be formed, for example, by drilling.

Figure 23E:
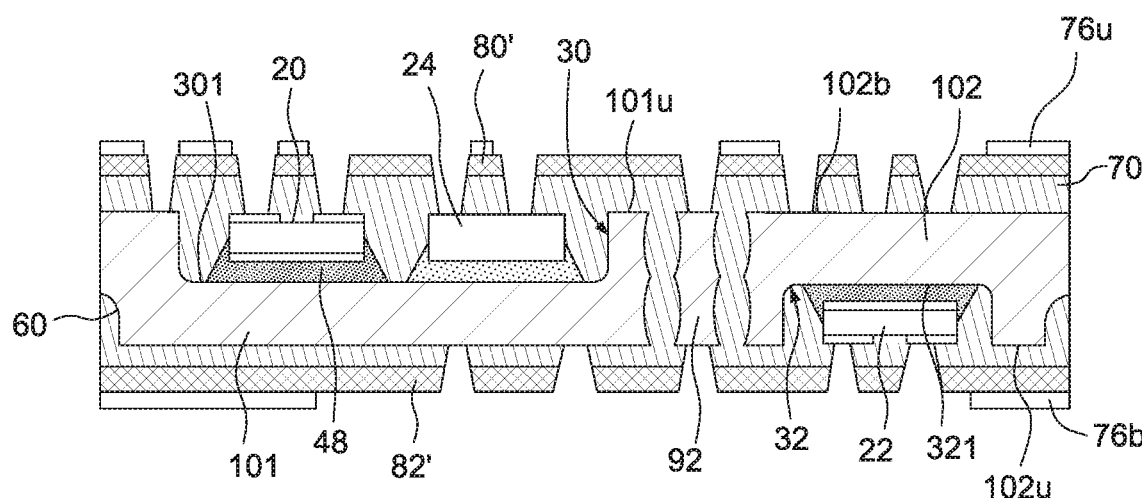
Figure 23F:
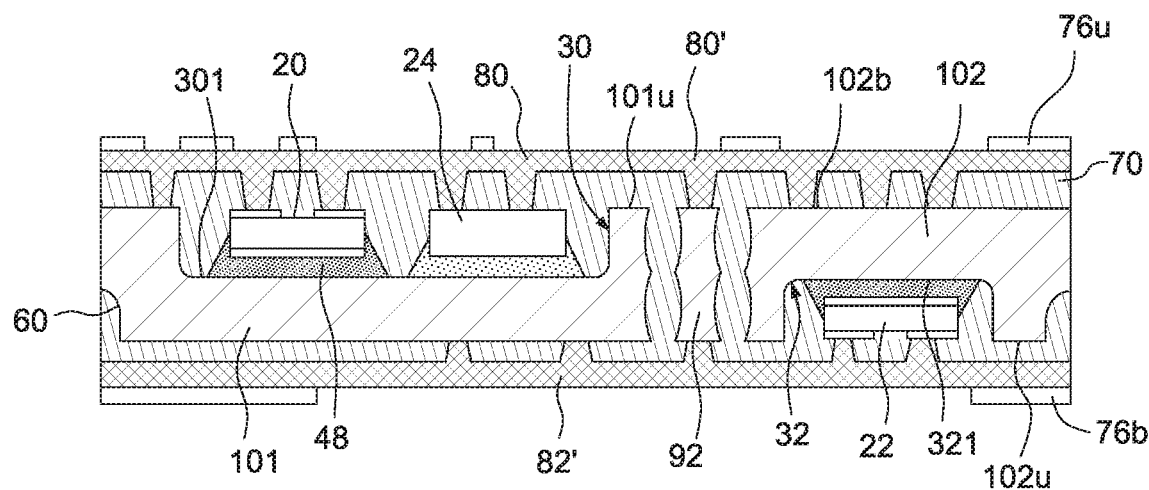

Referring to FIG. 23E, a patterned photoresist layer 76u is disposed on the conductive layer 80' and a patterned photoresist layer 76b is disposed on the conductive layer 82'. The patterned photoresist layers 76u and 76b may be formed by coating or another suitable technique. The patterned photoresist layers 76u and 76b may include a positive photoresist or other suitable material. Referring to FIG. 23F, a thickness of conductive layers 80' and 82' are increased by coating, sputtering, plating or another suitable technique.

Figure 23G:
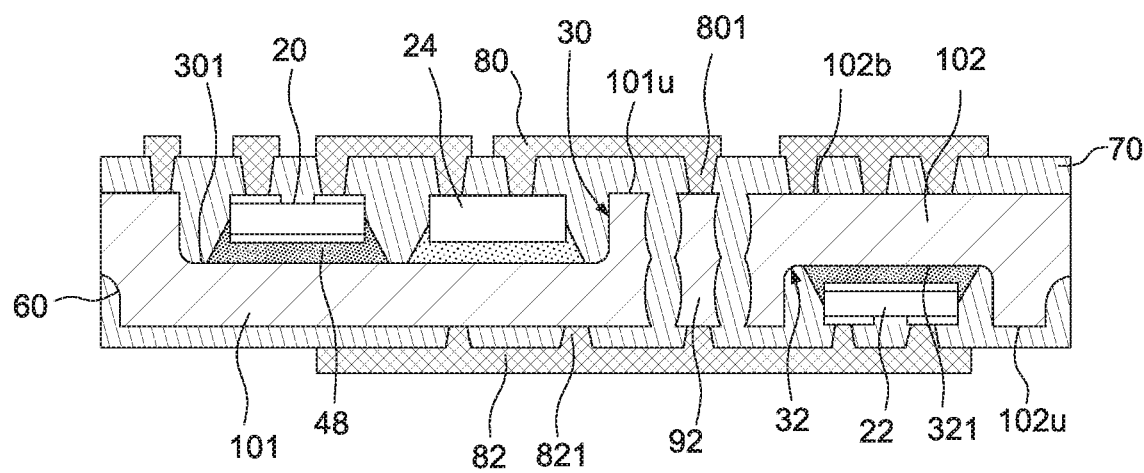

Referring to FIG. 23G, the patterned photoresist layers 76u and 76b are removed by a suitable technique, such as an etching process. The conductive layers 80 and 82 and the interconnection structures 801 and 821 are formed.

Figure 23H:
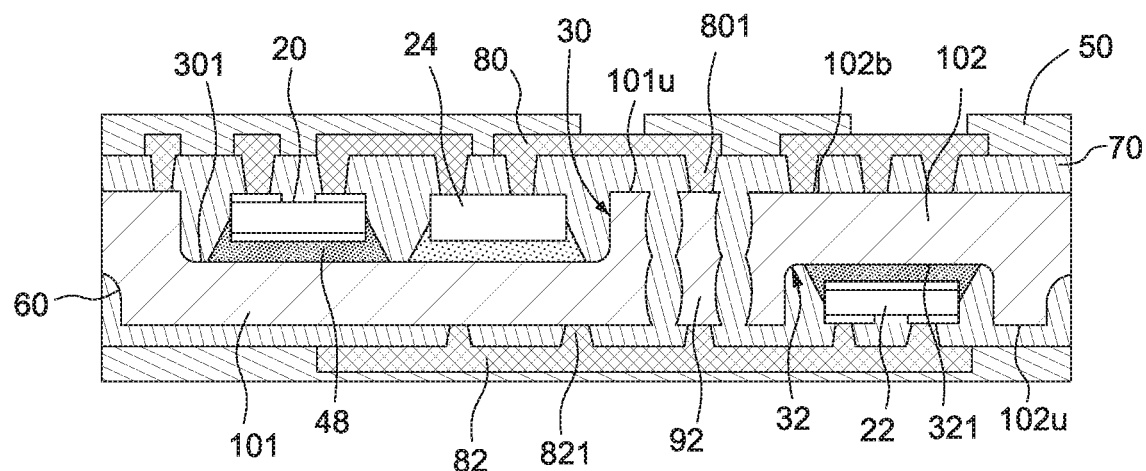

Referring to FIG. 23H, an insulating layer 50 is disposed on the upper surface 701 of the protection layer 70 and an insulating layer 52 is disposed on the upper surface 702 of the protection layer 70. The insulating layer 50 covers the patterned conductive layers 80 and the insulating layer 52 covers the patterned conductive layers 82. A material of one or both of the insulating layers 50 and 52 may include an epoxy resin or other insulating materials used additionally or alternatively.

Figure 23I:
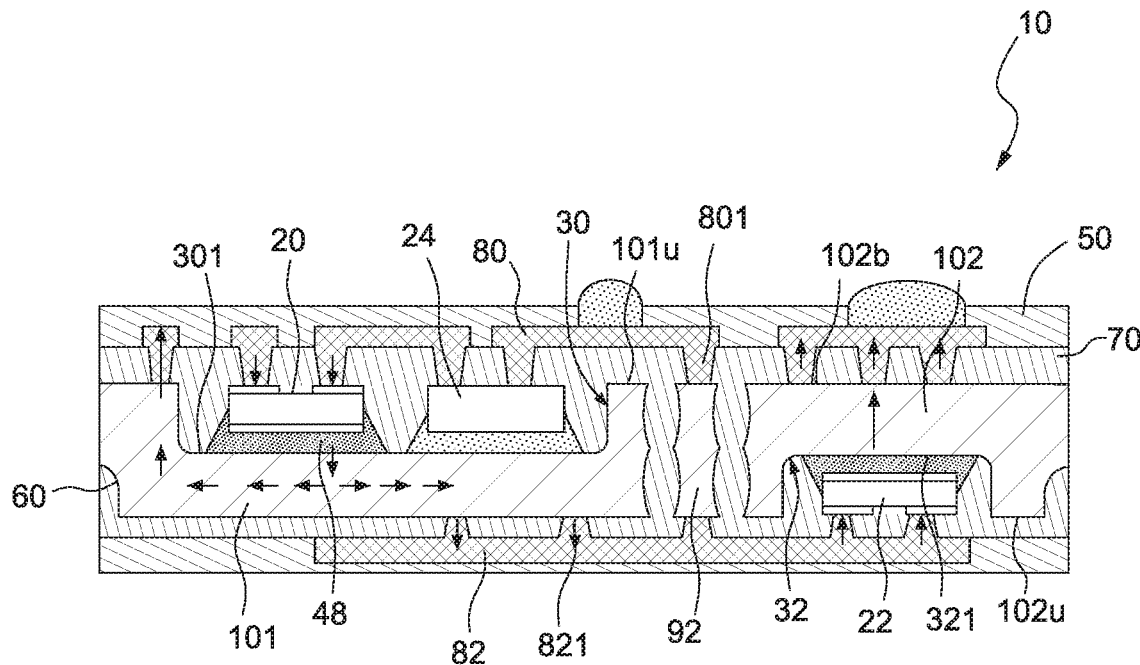

Referring to FIG. 23I, the conductive connects 78 are filled into, or formed in the vias 37 to form the semiconductor device package 10. The conductive connects 78 may include solder balls.

Figure 24A:
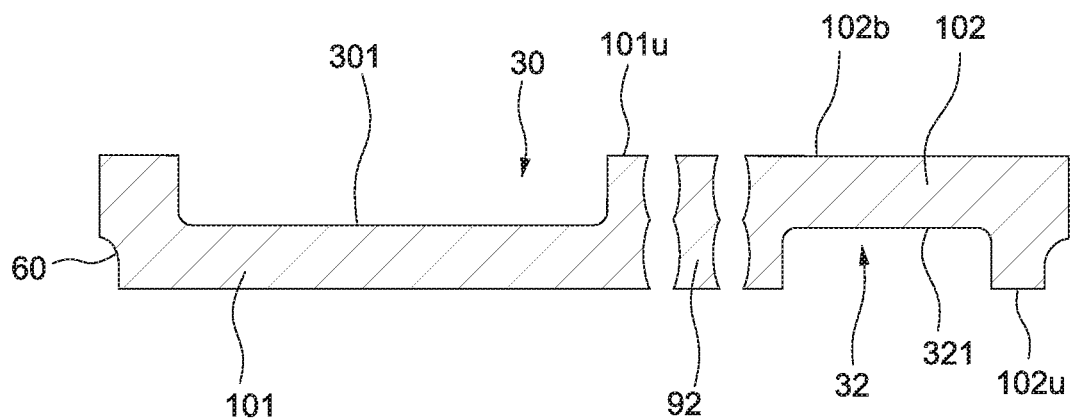
FIG. 24A, FIG. 24B, FIG. 24C, FIG. 24D, FIG. 24E, FIG. 24F, FIG. 24G, FIG. 24H, FIG. 24I, and FIG. 24J illustrate some embodiments of a method of manufacturing a semiconductor device package according to a tenth aspect.

FIGS. 24A-24J illustrate some embodiments of a method of manufacturing a semiconductor device package 11. Referring to FIG. 24A, conductive bases 101 and 102 are provided. The conductive base 101 includes an upper surface 101u and a surface 101b opposite to the upper surface 101u. The conductive base 102 includes an upper surface 102u and a surface 102b opposite to the upper surface 102u. A material of the conductive bases 101 and 102 includes, for example, copper or other metal, or a metal alloy, or other conductive material. A connecting element 90 is formed, for example, by drilling. The conductive base 101 defines a cavity 30 in the upper surface 101u. The conductive base 102 defines a cavity 32 in the upper surface 102u. The conductive bases 101 and 102 define one or more curved structures 60.

Figure 24B:
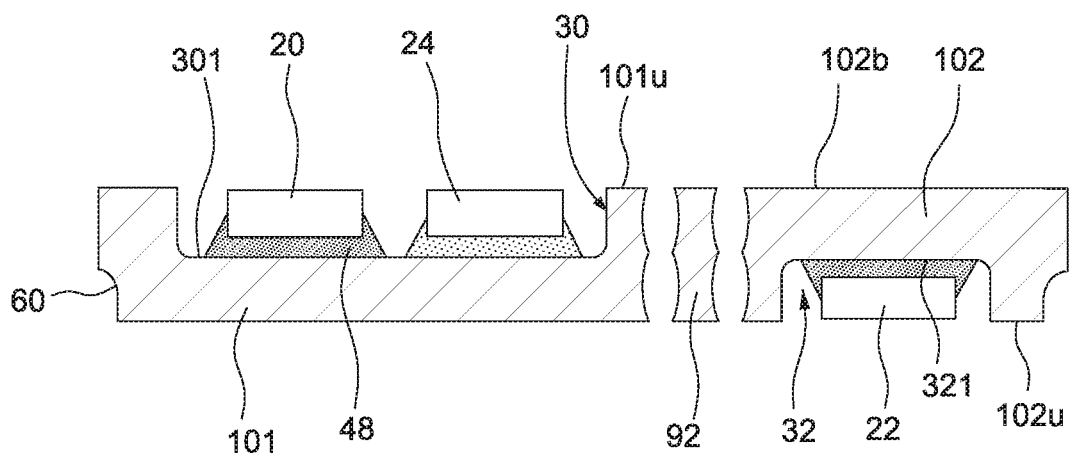

Referring to FIG. 24B, conductive adhesive layers 48 are disposed on the bottom surface 301 of the cavity 30 and on the bottom surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 can be used to attach the semiconductor die 20 to the bottom surface 301 of the cavity 30. The semiconductor dies 22 and 24 may be disposed in a similar manner.

Figure 24C:
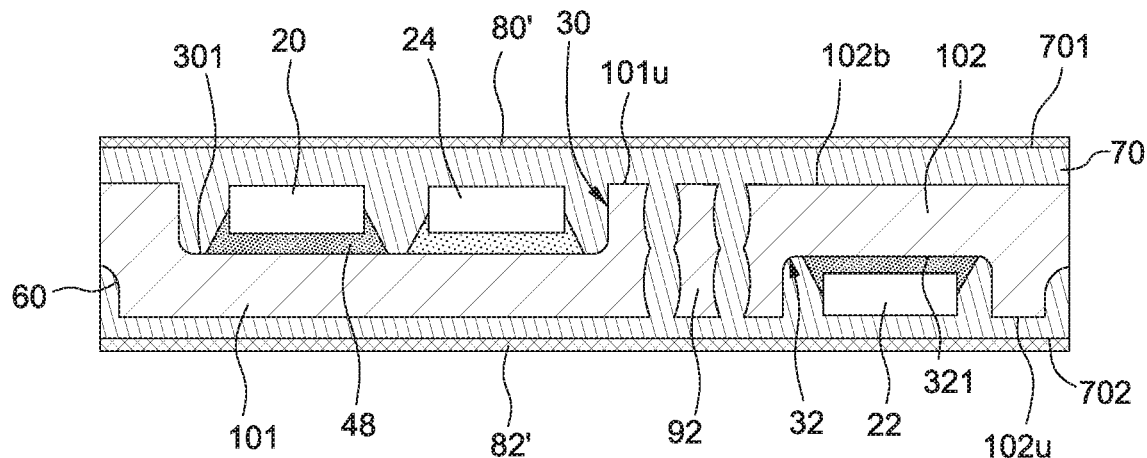

Referring to FIG. 24C, an insulation layer 70 is formed on the conductive bases 101 and 102 and the semiconductor dies 20, 22 and 24 by a lamination technique. The insulation layer 70 also covers the curved structures 60. A material of the insulation layer 70 may include, for example, a polypropylene resin or other suitable material. A portion of the insulation layer 70 is melted during lamination. A conductive layer 80' is disposed on the upper surface 701 of the insulation layer 70 by coating, sputtering, plating or another suitable technique. A conductive layer 82' is disposed on the surface 702 of the insulation layer 70 by coating, sputtering, plating or another suitable technique.

Figure 24D:
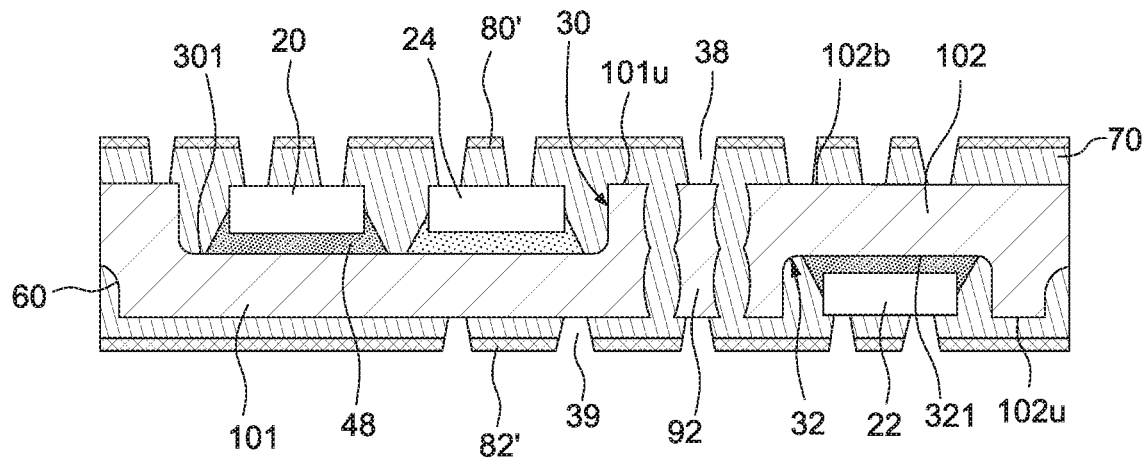

Referring to FIG. 24D, vias 38 are formed through the insulation later 70 from the surface of the conductive layer 80' and vias 39 are formed through the insulation later 70 from the surface of the conductive layer 82'. The vias 38 and 39 may be formed, for example, by drilling.

Figure 24E:
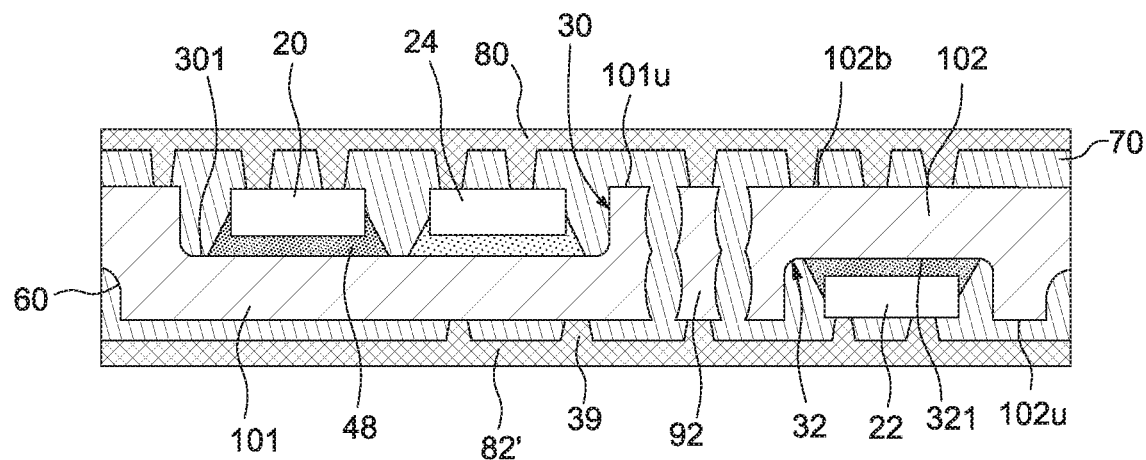

Referring to FIG. 24E, the vias 38 are filled with a conductive material similar to, or the same as, a material of the conductive layer 80' and the vias 39 are filled with a conductive material similar to, or the same as, a material of the conductive layer 82'. A thickness of conductive layer 80' and 82' is increased by coating, sputtering, plating or another suitable technique.

Figure 24F:
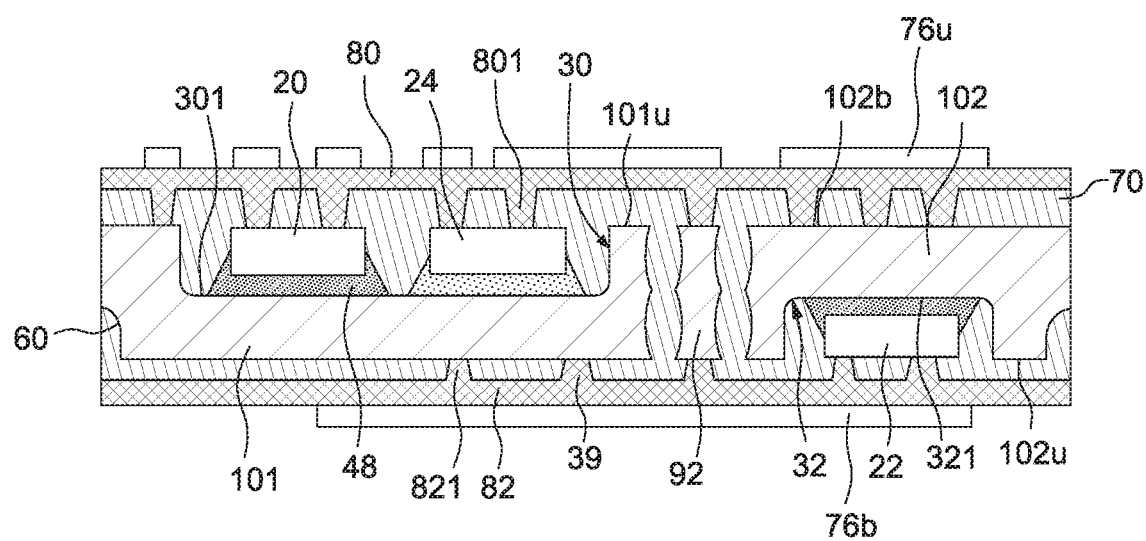

Referring to FIG. 24F, a patterned photoresist layer 76u is disposed on the conductive layers 80' and a patterned photoresist layer 76b is disposed on the conductive layers 82'. The patterned photoresist layers 76u and 76b may include a positive photoresist or other suitable material.

Figure 24G:
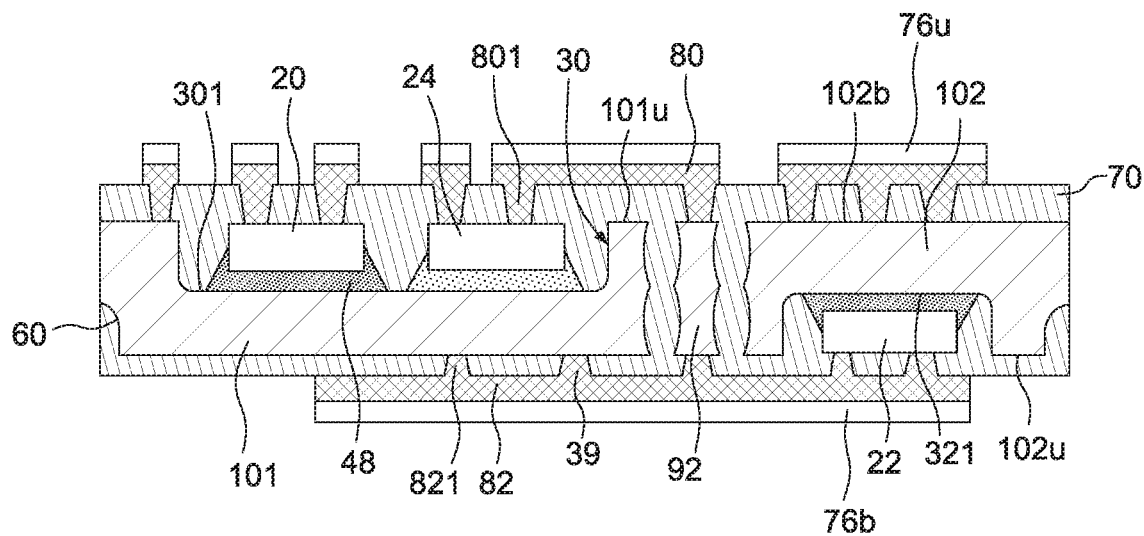

Referring to FIG. 24G, a portion of the conductive layer 80' which is not covered by the patterned photoresist layer 76u is removed by, for example, etching or drilling. A portion of the conductive layer 82' which is not covered by the patterned photoresist layer 76b is removed by, for example, etching or drilling. After etching, the patterned conductive layers 80 and 82, interconnection structures 801 and 821 are formed.

Figure 24H:
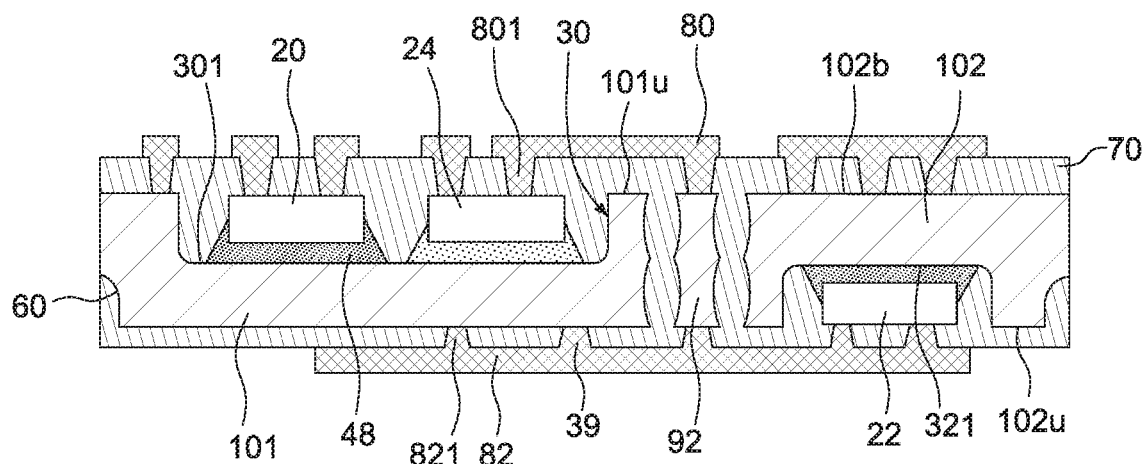

Referring to FIG. 24H, the patterned photoresist layers 76u and 76b are removed by a suitable technique, such as an etching process. After etching, a portion of the upper surface 701 of the protection layer 70 is exposed and a portion of the surface 702 of the protection layer 70 is exposed.

Figure 24I:
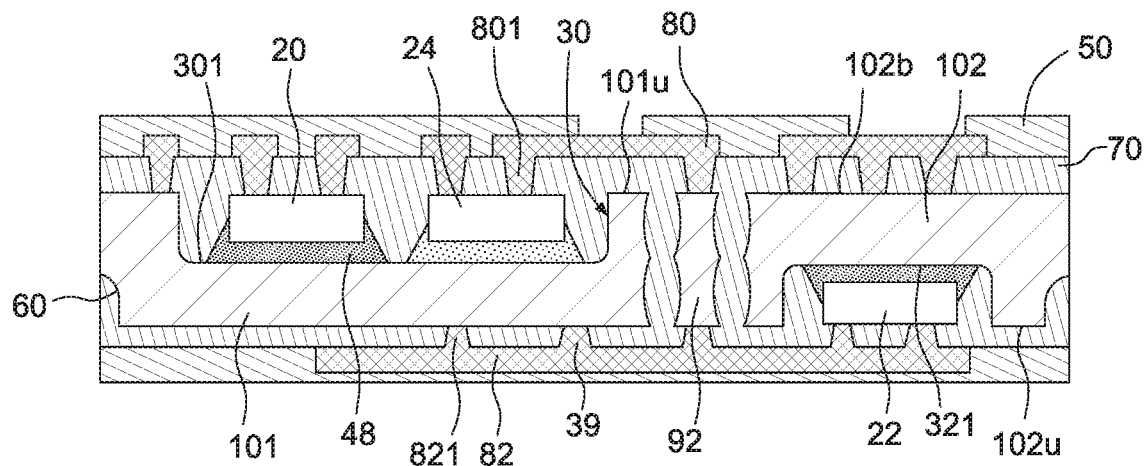
Figure 24J:
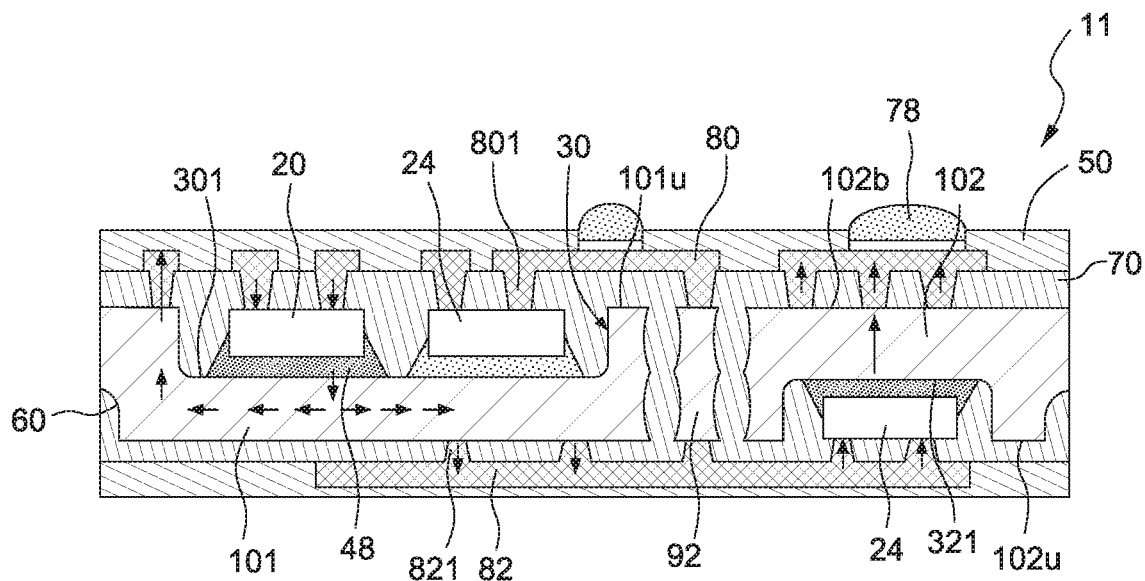

Referring to FIG. 24I, an insulating layer 50 is disposed on the upper surface 701 of the protection layer 70 and an insulating layer 52 is disposed on the upper surface 702 of the protection layer 70. The insulating layer 50 covers the patterned conductive layers 80 and the insulating layer 52 covers the patterned conductive layers 82. A material of one or both of the insulating layers 50 and 52 may include an epoxy resin or other insulating materials used additionally or alternatively. Referring to FIG. 24J, the conductive connects 78 are filled into the vias 37 to form the semiconductor device package 11. The conductive connects 78 may include solder balls.

Figure 25A:
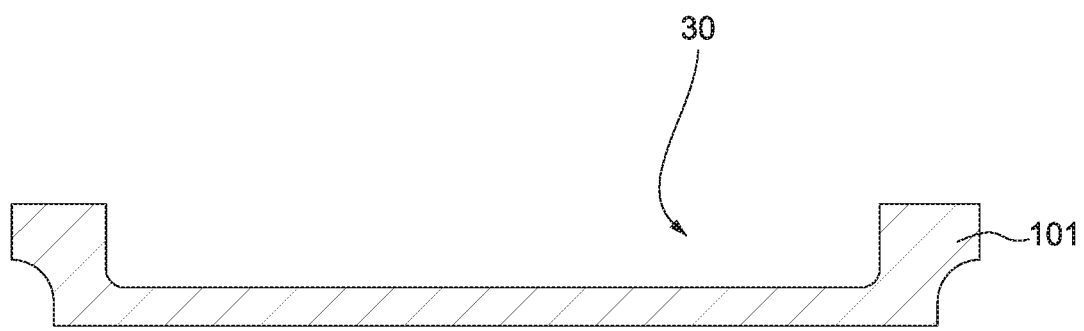
FIG. 25A, FIG. 25B, FIG. 25C, FIG. 25D, FIG. 25E, FIG. 25F, FIG. 25G, FIG. 25H, FIG. 25I, and FIG. 25J illustrate some embodiments of a method of manufacturing a semiconductor device package according to an eleventh aspect.

FIGS. 25A-25J illustrate some embodiments of a method of manufacturing a semiconductor device package 12. Referring to FIG. 25A, a conductive base 101 is provided. The conductive base 101 includes an upper surface 101u and a surface 101b opposite to the upper surface 101u. A material of the conductive base 101 includes, for example, copper or other metal, or a metal alloy, or other conductive material. The conductive base 101 defines a cavity 30 in the upper surface 101u. The cavity 30 has a bottom surface 301.

Figure 25B:
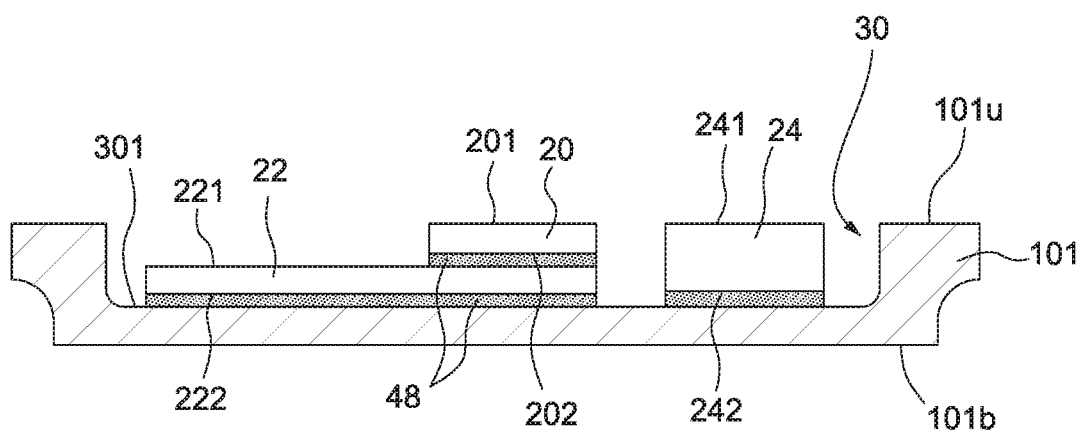

Referring to FIG. 25B, a conductive adhesive layer 48 is disposed on the bottom surface 301 of the cavity 30. The conductive adhesive layer 48 may include, for example, a conductive gel or epoxy film (epoxy mixed with a conductive material). A semiconductor die 22 is disposed on the conductive adhesive layer 48 in the bottom surface 301 of the cavity 30. The conductive adhesive 48 can be used to attach the semiconductor die 22 to the bottom surface 301 of the cavity 30. The semiconductor die 22 has an active surface 221 and a surface 222 opposite the upper surface 221. A semiconductor die 20 has an active surface 201 and a surface 202 opposite the upper surface 201. The semiconductor die 20 is stacked on the active surface 221 of the semiconductor die 22 through a conductive adhesive layer 48. The semiconductor die 24 has an active surface 241 and a surface 242 opposite the upper surface 241. The semiconductor die 24 is disposed on the conductive adhesive layer 48 in the bottom surface 301 of the cavity 30.

Figure 25C:
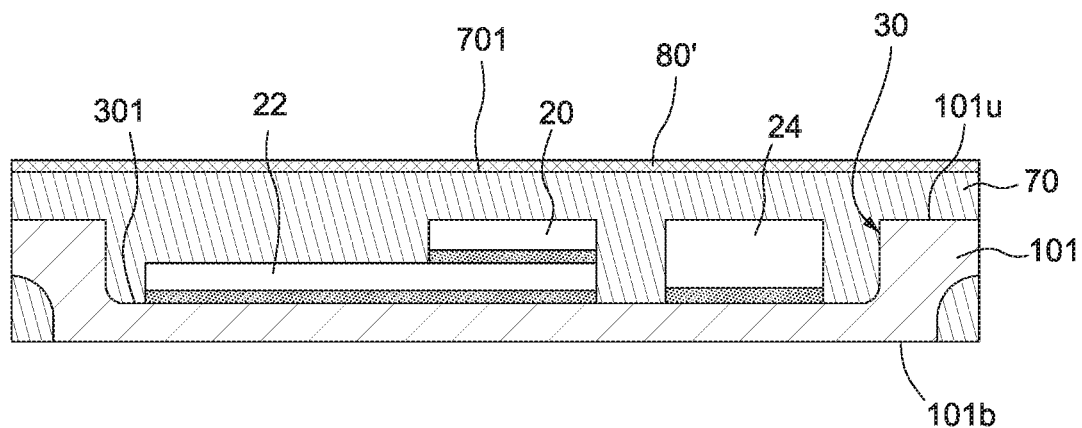

Referring to FIG. 25C, a protection layer 70 is disposed on the semiconductor dies 20, 22 and 24 and fills the cavity 30. The protection layer 70 has a surface 701. In some embodiments, a material of the protection layer 70 may include a polypropylene resin; however, other suitable materials may be additionally or alternatively used. The conductive layer 80' is disposed on the surface 701 of the protection layer 70. A material of conductive layer 80' may include, for example, copper or other metal, or a metal alloy, or other conductive material.

Figure 25D:
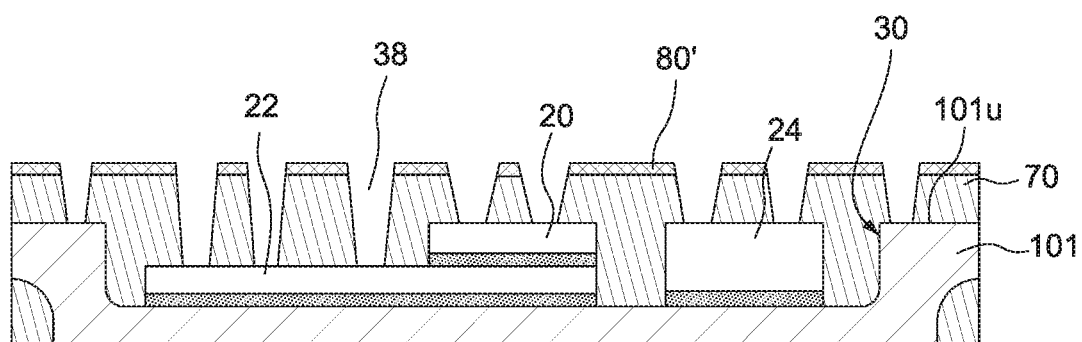

Referring to FIG. 25D, vias 38 are formed through the protection later 70 from the surface of the conductive layer 80'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101u of the conductive base 101 are exposed.

Figure 25E:
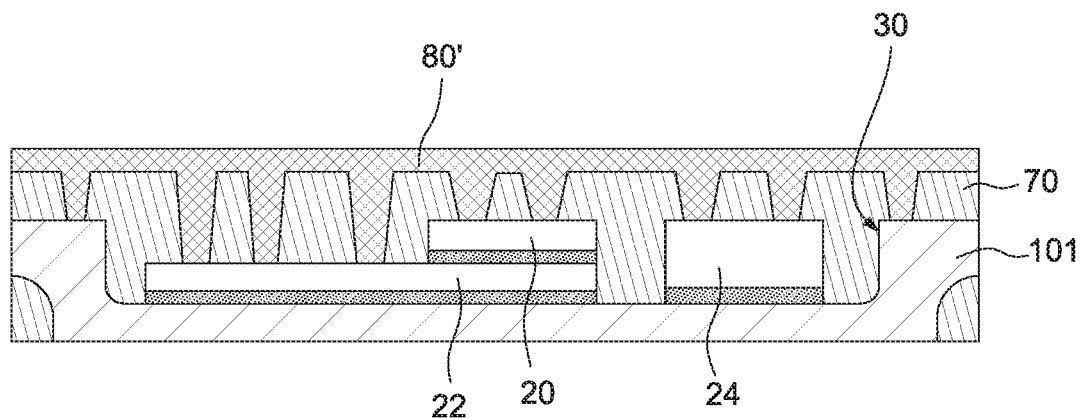

Referring to FIG. 25E, the vias 38 are filled with a conductive material similar to, or the same as, a material of the conductive layer 80'. A thickness of conductive layer 80' is increased by coating, sputtering, plating or another suitable technique.

Figure 25F:
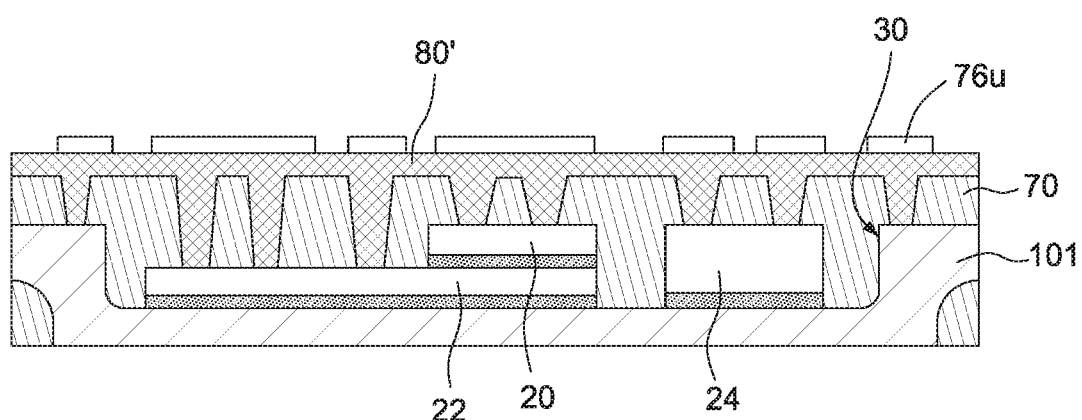

Referring to FIG. 25F, a patterned photoresist layer 76u is disposed on the conductive layers 80'. The patterned photoresist layer 76u may include a positive photoresist or other suitable material.

Figure 25G:
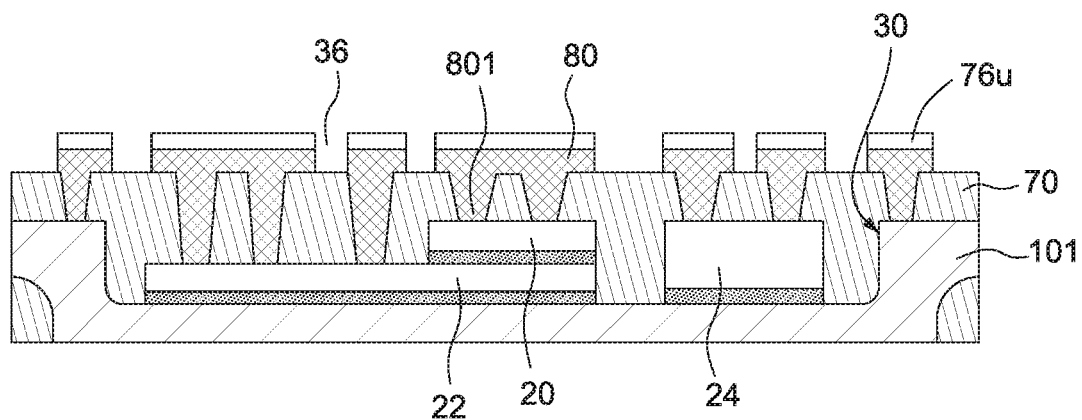

Referring to FIG. 25G, vias 36 are formed through the insulation later 70 from the surface of the conductive layer 80'. After the vias 36 are formed, the conductive layers 80 and the interconnection structures 801 are formed. The material of interconnection structures 801 and conductive layers 80 may include, for example, copper or other metal, or a metal alloy, or other conductive material.

Figure 25H:
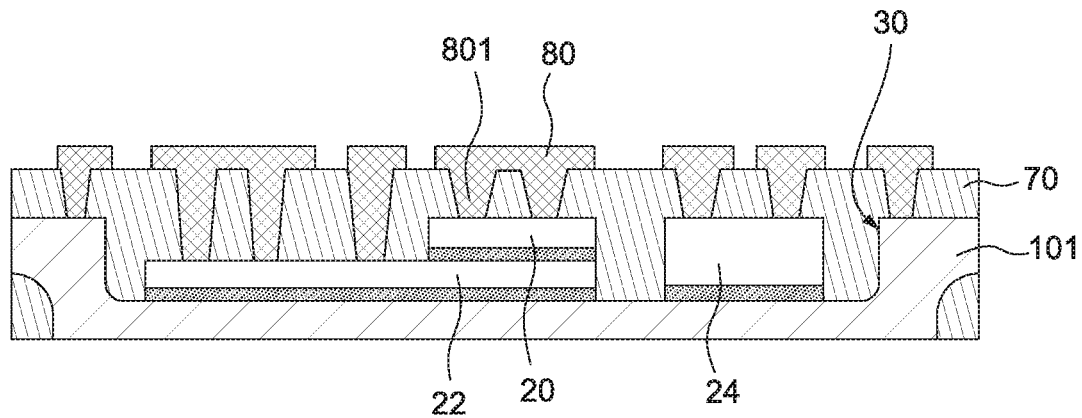

Referring to FIG. 25H, the patterned photoresist layer 76u is removed by a suitable technique, such as an etching process. The upper surfaces of the interconnection structures 801 are exposed.

Figure 25I:
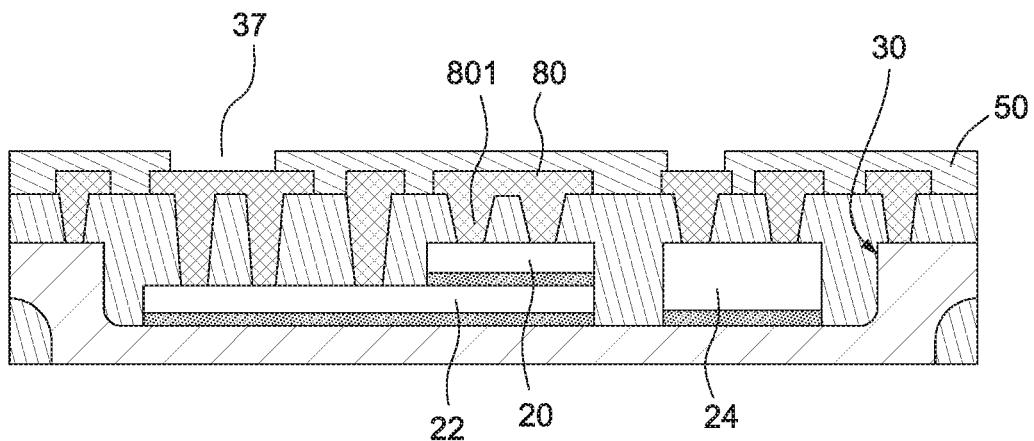

Referring to FIG. 25I, an insulating layer 50 is disposed on the upper surface 701 of the insulating layer 70. The insulating layer 50 covers the patterned conductive layers 80. A material of the insulating layer 50 may include an epoxy resin or other insulating materials used additionally or alternatively.

Figure 25J:
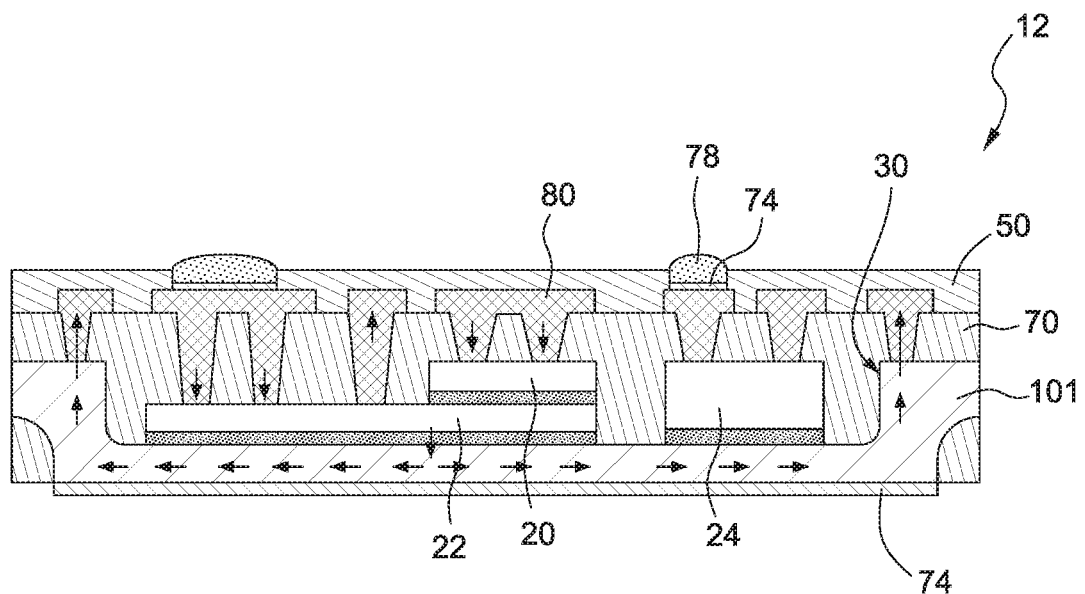

Referring to FIG. 25J, a surface finish layer 74 is disposed on the surface 101b of the conductive base 101. The surface finish layer 74 may include any suitable conductive material (such as, for example, nickel (Ni), palladium (Pd), gold (Au), silver (Ag), Cu, and combinations of metals). The conductive connects 78 are filled into, or formed in the vias 37 to form the semiconductor device package 12.

Figure 26A:
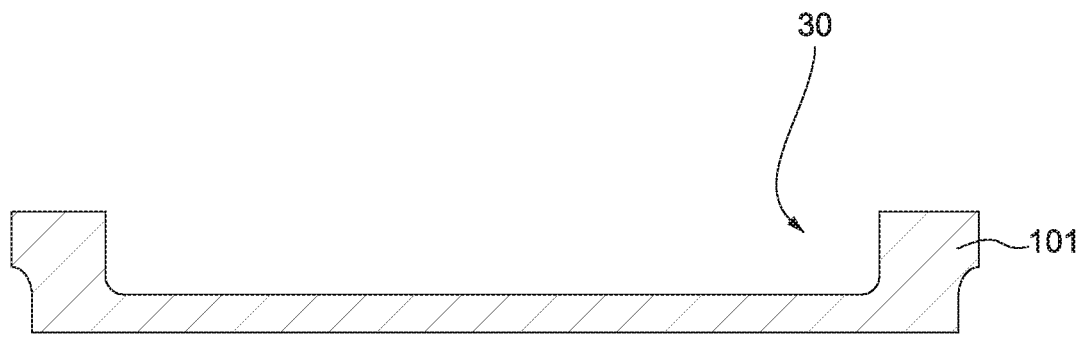
FIG. 26A, FIG. 26B, FIG. 26C, FIG. 26D, FIG. 26E, FIG. 26F, FIG. 26G, FIG. 26H, FIG. 26I, and FIG. 26J illustrate some embodiments of a method of manufacturing a semiconductor device package according to a twelfth aspect.

FIGS. 26A-26J illustrate some embodiments of a method of manufacturing a semiconductor device package 13. Referring to FIG. 26A, a conductive base 101 is provided. The conductive base 101 includes an upper surface 101u and a surface 101b opposite to the upper surface 101u. A material of the conductive base 101 includes, for example, copper or other metal, or a metal alloy, or other conductive material. The conductive base 101 defines a cavity 30 in the upper surface 101u. The cavity 30 has a bottom surface 301.

Figure 26B:
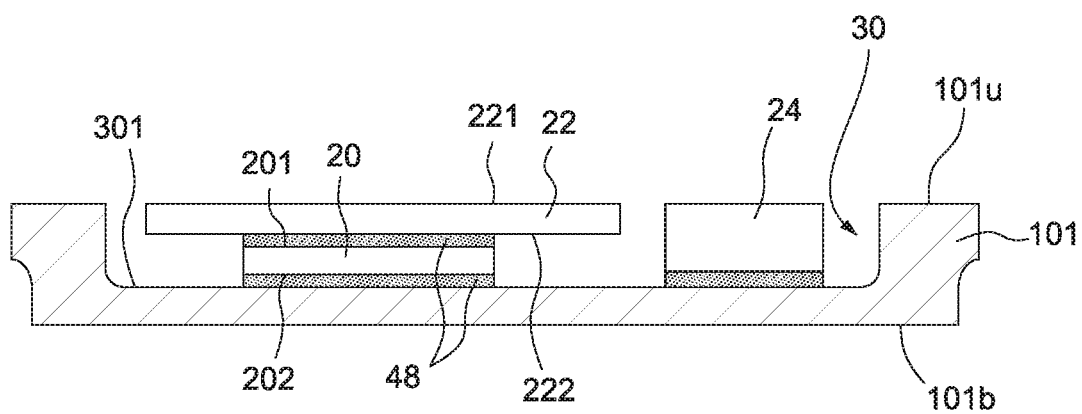

Referring to FIG. 26B, conductive adhesive layers 48 are disposed on the bottom surface 301 of the cavity 30. The conductive adhesive layer 48 may include, for example, a conductive gel or epoxy film (epoxy mixed with a conductive material). A semiconductor die 20 is disposed on the conductive adhesive layer 48 in the bottom surface 301 of the cavity 30. The conductive adhesive 48 can be used to attach the semiconductor die 20 to the bottom surface 301 of the cavity 30. The semiconductor die 20 has an active surface 201 and a surface 202 opposite the upper surface 201. A semiconductor die 22 has an active surface 221 and a surface 222 opposite the upper surface 221. The semiconductor die 22 is stacked on the active surface 201 of the semiconductor die 20 through a conductive adhesive layer 48. The semiconductor die 24 has an active surface 241 and a surface 242 opposite the upper surface 241. The semiconductor die 24 is disposed on the conductive adhesive layer 48 in the bottom surface 301 of the cavity 30.

Figure 26C:
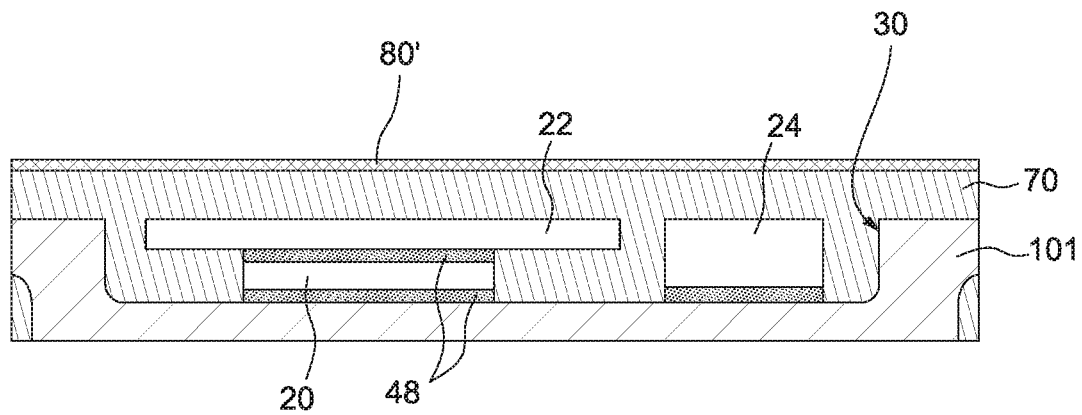

Referring to FIG. 26C, an insulation layer 70 is disposed on the semiconductor dies 20, 22 and 24 and fills the cavity 30. The insulation layer 70 has a surface 701. In some embodiments, a material of the insulation layer 70 may include a polypropylene resin; however, other suitable materials may be additionally or alternatively used. The conductive layer 80' is disposed on the surface 701 of the insulation layer 70. A material of conductive layer 80' may include, for example, copper or other metal, or a metal alloy, or other conductive material.

Figure 26D:
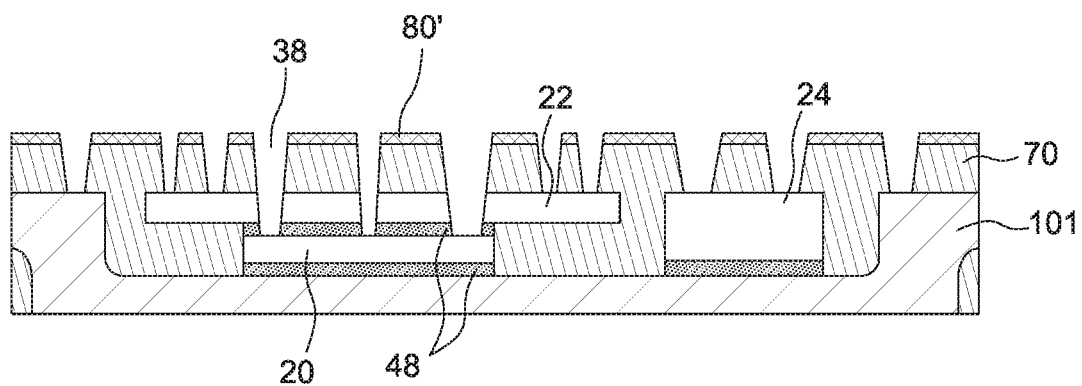

Referring to FIG. 26D, vias 38 are formed through the insulation later 70 from the surface of the patterned conductive layer 80'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101u of the conductive base 101 are exposed.

Figure 26E:
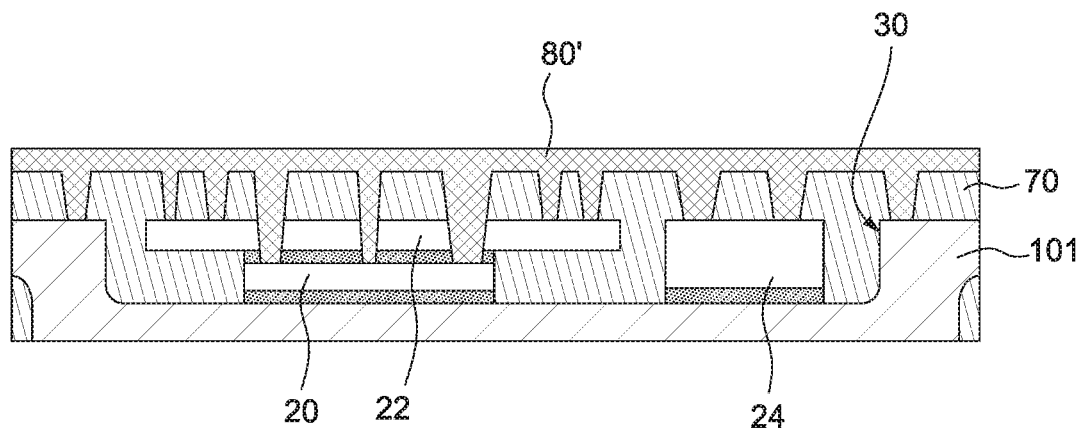

Referring to FIG. 26E, the vias 38 are filled with a conductive material similar to, or the same as, a material of the conductive layer 80'. A thickness of conductive layer 80' is increased by coating, sputtering, plating or another suitable technique.

Figure 26F:
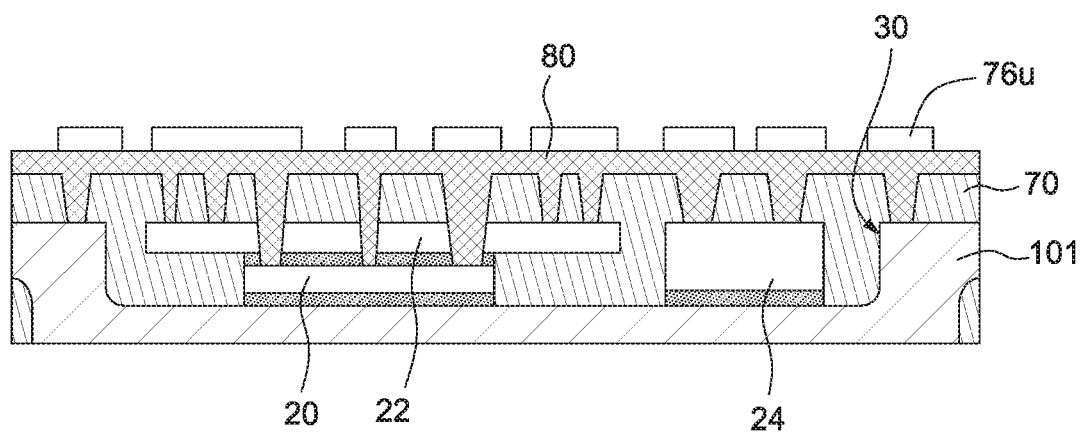

Referring to FIG. 26F, patterned photoresist layer 76u is disposed on the conductive layers 80'. The patterned photoresist layer 76u may include a positive photoresist or other suitable material.

Figure 26G:
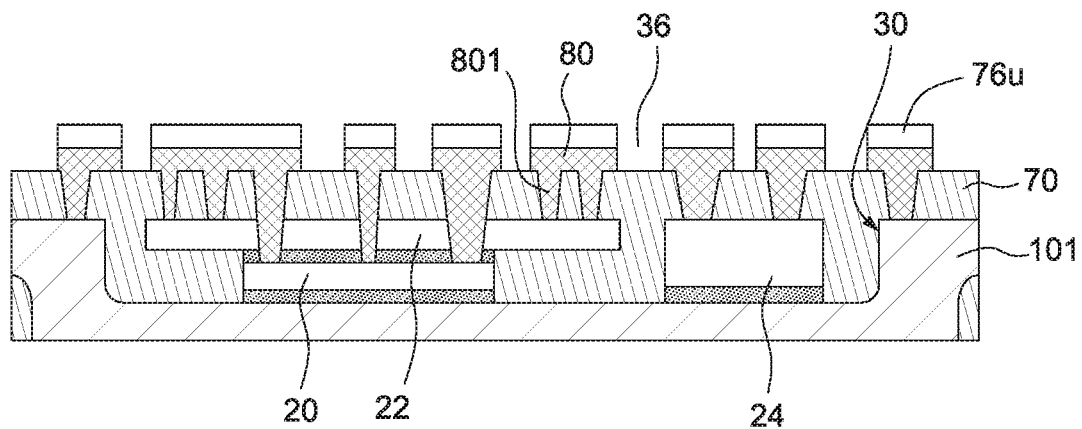

Referring to FIG. 26G, vias 36 are formed through the insulation later 70 from the surface of the conductive layer 80'. After the vias 36 are formed, the conductive layers 80 and the interconnection structures 801 are formed. The material of interconnection structures 801 and conductive layers 80 may include, for example, copper or other metal, or a metal alloy, or other conductive material.

Figure 26H:
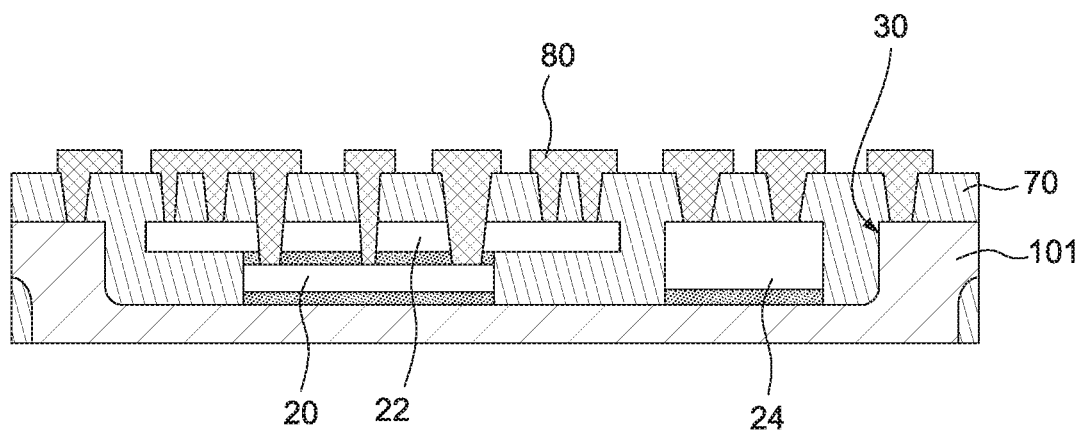
Figure 26I:
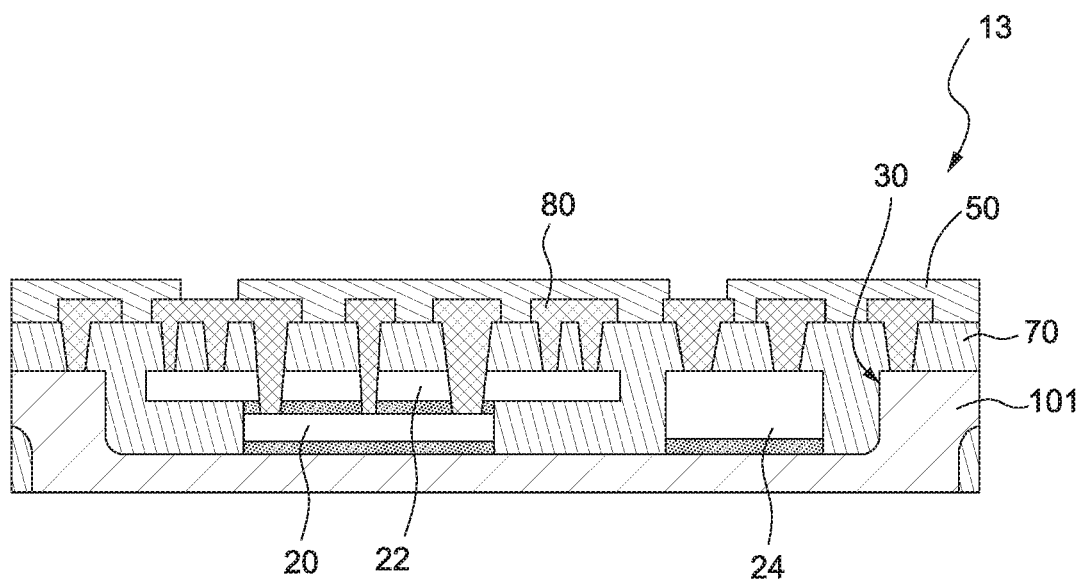
Figure 26J:
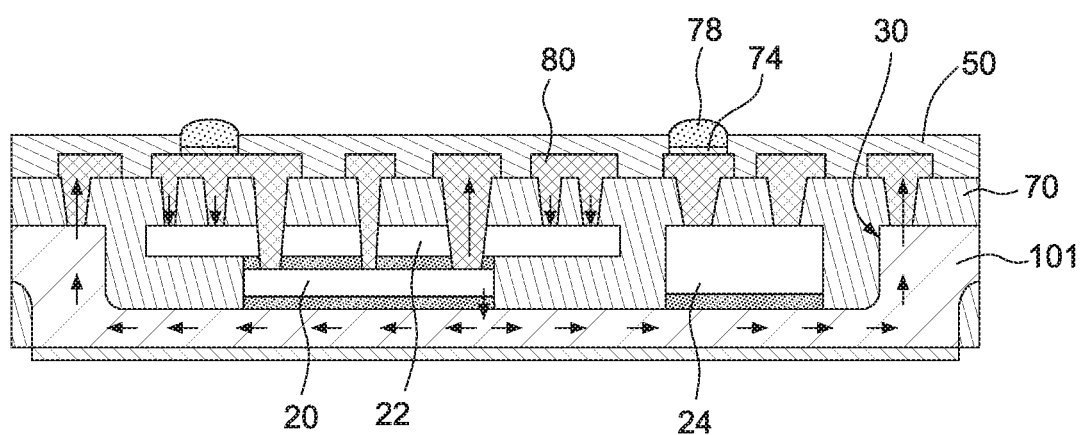

Referring to FIG. 26H, the patterned photoresist layer 76u is removed by a suitable technique, such as an etching process. The upper surfaces of the conductive layers 80 are exposed. Referring to FIG. 26I, an insulating layer 50 is disposed on the upper surface 701 of the protection layer 70. The insulating layer 50 covers the patterned conductive layers 80. A material of the insulating layer 50 may include a polypropylene resin or other insulating materials used additionally or alternatively. Referring to FIG. 26J, a surface finish layer 74 is disposed on the surface 101b of the conductive base 101. The surface finish layer 74 may include any suitable conductive material (such as, for example, nickel (Ni), palladium (Pd), gold (Au), silver (Ag), Cu, and combinations of metals). The conductive connects 78 are filled into, or formed in, the vias 37 to form the semiconductor device package 13.

Figure 27A:
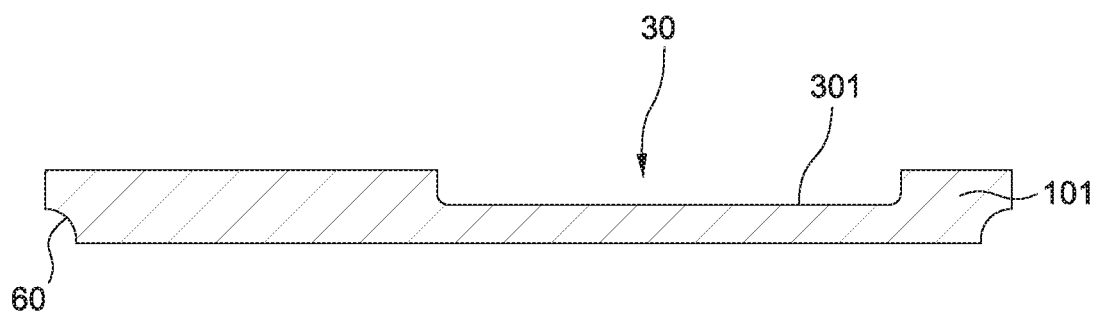
FIG. 27A, FIG. 27B, FIG. 27C, FIG. 27D, FIG. 27E, FIG. 27F, FIG. 27G, FIG. 27H, FIG. 27I, FIG. 27J, FIG. 27K, FIG. 27L, and FIG. 27M illustrate some embodiments of a method of manufacturing a semiconductor device package according to a thirteenth aspect.

FIGS. 27A-27M illustrate some embodiments of a method of manufacturing a semiconductor device package 14. Referring to FIG. 27A, a conductive base 101 is provided. The conductive base 101 includes an upper surface 101u and a surface 101b opposite to the upper surface 101u. The conductive base 101 defines curved structures 60. A material of the conductive base 101 includes, for example, copper or other metal, or a metal alloy, or other conductive material. The conductive base 101 defines a cavity 30 in the upper surface 101u. The cavity 30 has a bottom surface 301.

Figure 27B:
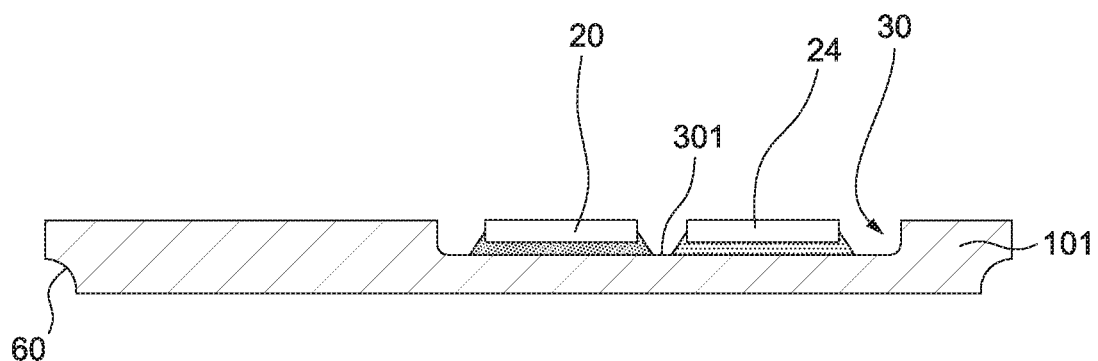

Referring to FIG. 27B, conductive adhesive layers 48 are disposed on the bottom surface 301 of the cavity 30. The conductive adhesive layer 48 may include, for example, a conductive gel or epoxy film (epoxy mixed with a conductive material). A semiconductor die 20 is disposed on the conductive adhesive layer 48 in the bottom surface 301 of the cavity 30. The conductive adhesive 48 is used to attach the semiconductor die 20 to the bottom surface 301 of the cavity 30. The semiconductor die 20 has an active surface 201 and a surface 202 opposite the upper surface 201. A semiconductor die 24 is disposed on the conductive adhesive layer 48 in the bottom surface 301 of the cavity 30. The conductive adhesive 48 can be used to attach the semiconductor die 24 to the bottom surface 301 of the cavity 30. The semiconductor die 24 has an active surface 241 and a surface 242 opposite the upper surface 201.

Figure 27C:
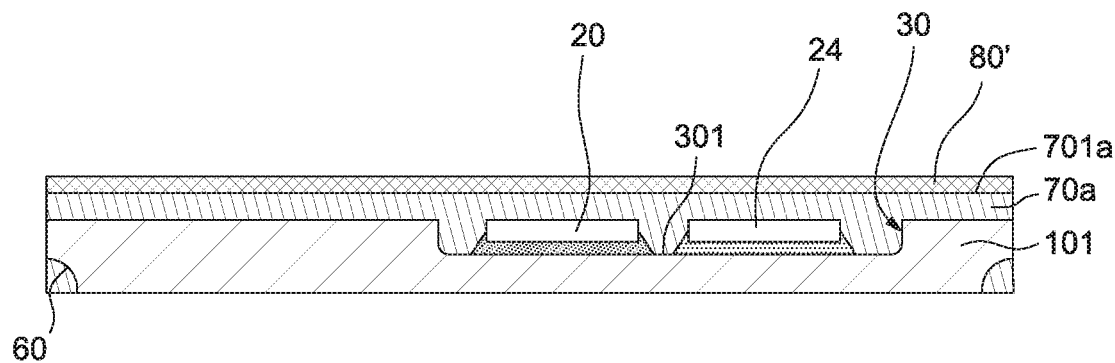

Referring to FIG. 27C, a protection layer 70a is disposed on the semiconductor dies 20 and 24 and fills the cavity 30 and the curved structures 60. The protection layer 70a has a surface 701a. In some embodiments, a material of the protection layer 70a may include a polypropylene resin; however, other suitable materials may be additionally or alternatively used. The conductive layer 80' is disposed on the surface 701a of the protection layer 70a. A material of conductive layer 80' may include, for example, copper or other metal, or a metal alloy, or other conductive material.

Figure 27D:
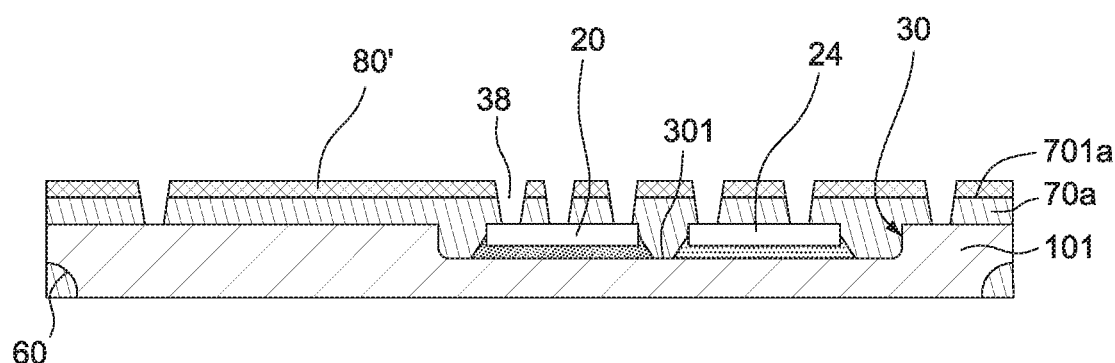

Referring to FIG. 27D, vias 38 are formed through the protection later 70a from the surface of the patterned conductive layer 80'. The vias 38 may be formed, for example, by drilling. After the vias 38 are formed, a portion of the surface 201 of the semiconductor die 20, a portion of the surface 241 of the semiconductor die 24, and a portion of the surface 101u of the conductive base 101 are exposed.

Figure 27E:
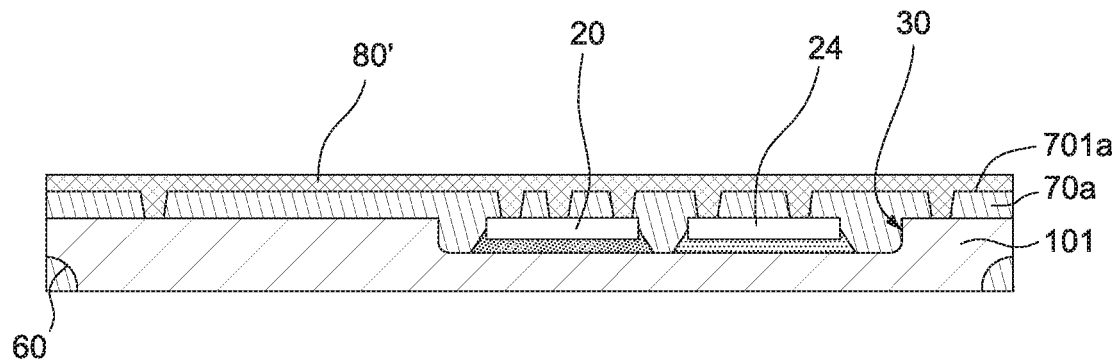

Referring to FIG. 27E, the vias 38 are filled with the conductive material similar to, or the same as, a material of the conductive layer 80'. A thickness of conductive layer 80' is increased by coating, sputtering, plating or another suitable technique.

Figure 27F:
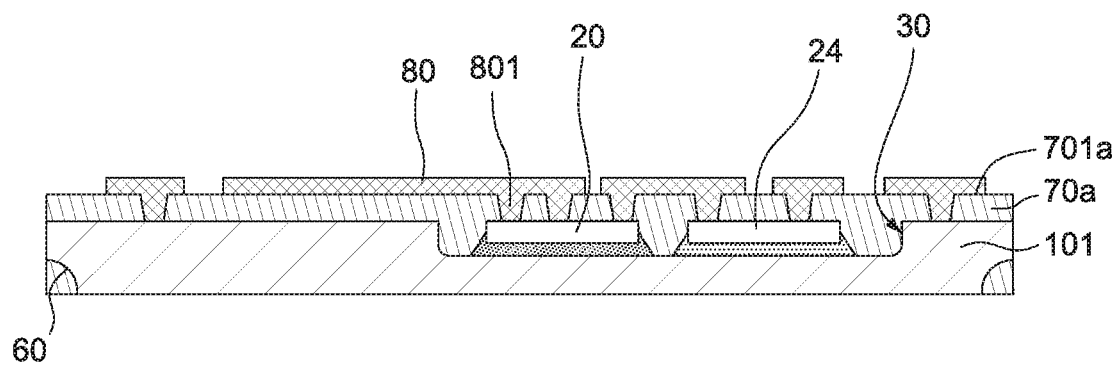
Figure 27G:
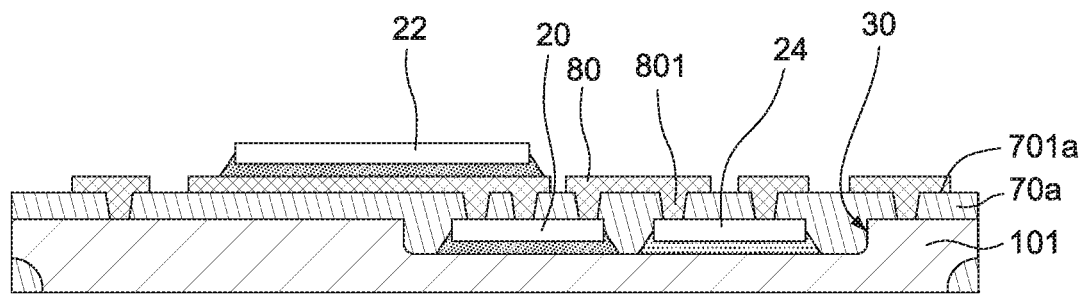

Referring to FIG. 27F, the conductive layers 80 and the interconnection structures 801 are formed by photo-lithography techniques. The material of interconnection structures 801 and conductive layers 80 may include, for example, copper or other metal, or a metal alloy, or other conductive material. Referring to FIG. 27G, a semiconductor die 22 is disposed on the interconnection structures 801 through the conductive adhesive layer 48. The semiconductor dies 20 and 22 may be a power die, and the semiconductor die 24 may be a control die.

Figure 27H:
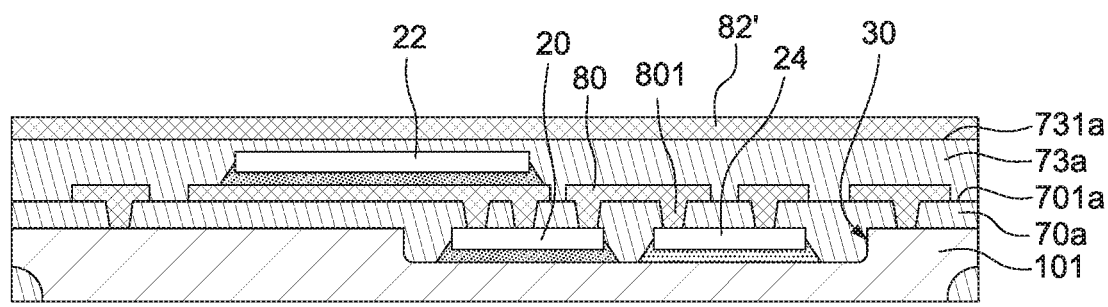

Referring to FIG. 27H, an insulation layer 73a is disposed on the semiconductor die 22 and covers the interconnection structures 801. The insulation layer 73a has a surface 731a. In some embodiments, a material of the insulation layer 73a may include a polypropylene resin; however, other suitable materials may be additionally or alternatively used. A conductive layer 82' is disposed on the surface 731a of the insulation layer 73a. A material of conductive layer 82' may include, for example, copper or other metal, or a metal alloy, or other conductive material.

Figure 27I:
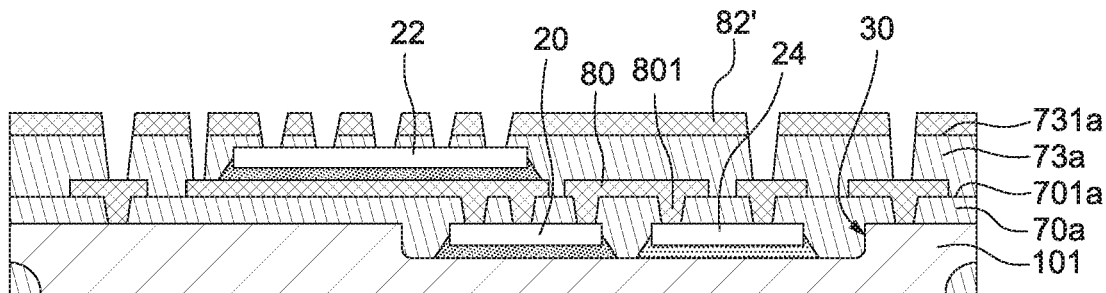

Referring to FIG. 27I, vias 38' are formed through the protection later 73a from the surface of the patterned conductive layer 82'. The vias 38' may be formed, for example, by drilling. After the vias 38' are formed, a portion of the surface 221 of the semiconductor die 22 and a portion of the surface of the interconnection structures 801 are exposed.

Figure 27J:
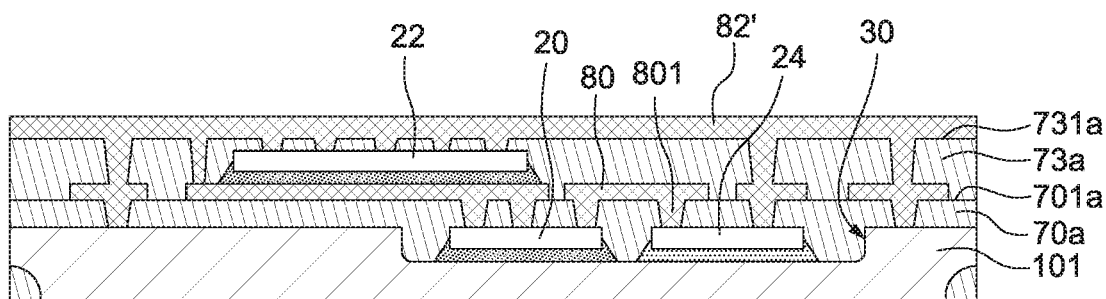

Referring to FIG. 27J, the vias 38 are filled with a conductive material similar to a material of the conductive layer 82'. A thickness of conductive layer 82' is increased by coating, sputtering, plating or another suitable technique.

Figure 27K:
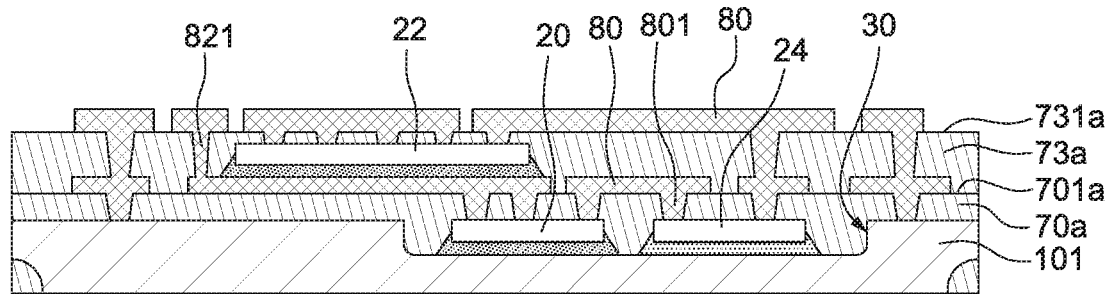

Referring to FIG. 27K, the conductive layers 82 and the interconnection structures 821 are formed by photo-lithography techniques. The material of interconnection structures 821 and conductive layers 82 may include, for example, copper or other metal, or a metal alloy, or other conductive material.

Figure 27L:
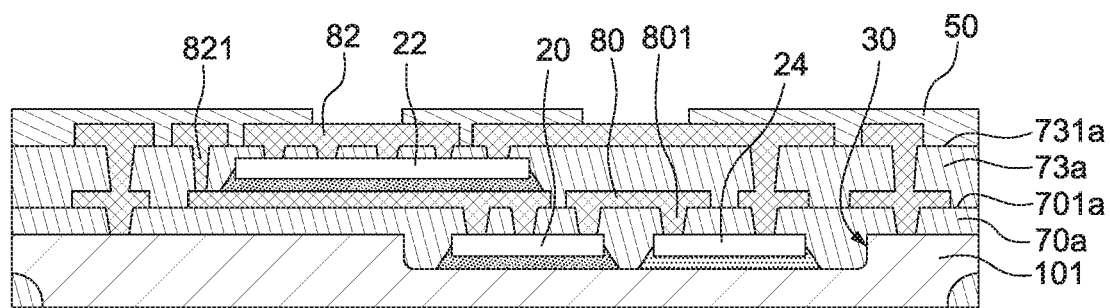
Figure 27M:
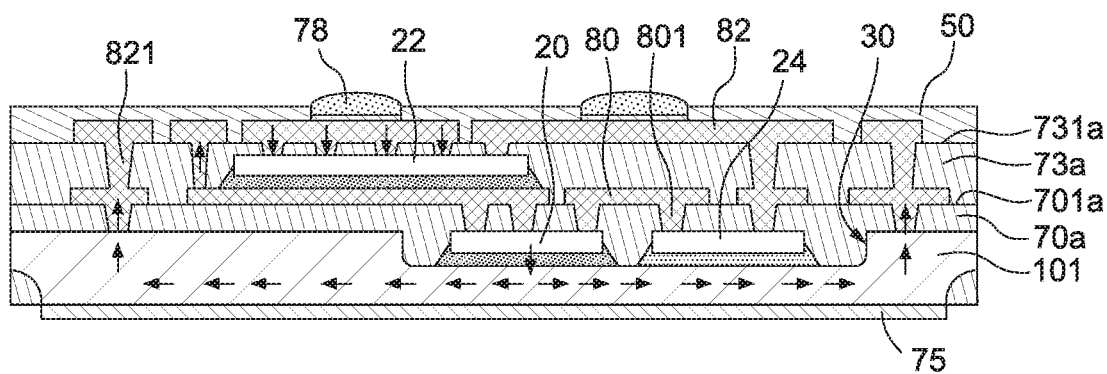

Referring to FIG. 27L, an insulating layer 50 is disposed on the upper surface 721 of the insulation layer 73a. The insulating layer 50 covers the patterned conductive layers 82. A material of the insulating layer 50 may include an epoxy resin or other insulating materials used additionally or alternatively. Referring to FIG. 27M, the conductive connects 75 are filled into, or formed in the vias 37 to form the semiconductor device package 14.

Figure 28A:
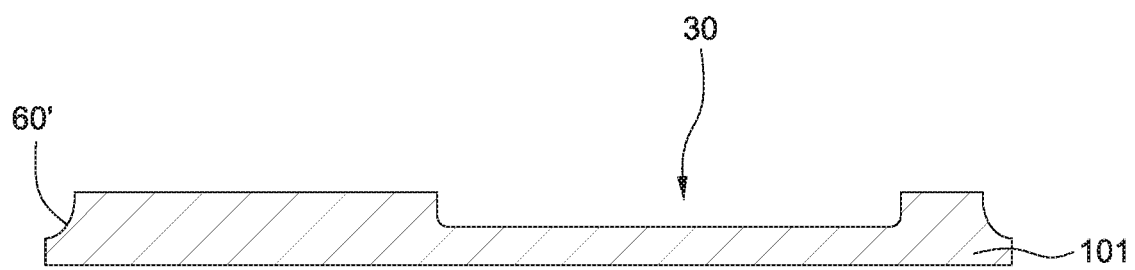
FIG. 28A, FIG. 28B, FIG. 28C, FIG. 28D, FIG. 28E, FIG. 28F, FIG. 28G, FIG. 28H, FIG. 28I, FIG. 28J, FIG. 28K, FIG. 28L, and FIG. 28M illustrate some embodiments of a method of manufacturing a semiconductor device package according to a fourteenth aspect.

FIGS. 28A-28M illustrate some embodiments of a method of manufacturing a semiconductor device package 15. Referring to FIG. 28A, a conductive base 101 is provided. The conductive base 101 includes an upper surface 101u and a surface 101b opposite to the upper surface 101u. The conductive base 101 defines upper curved structures 60'. A material of the conductive base 101 is, for example, copper or other metal, or a metal alloy, or other conductive material. The conductive base 101 defines a cavity 30 in the upper surface 101u. The cavity 30 has a bottom surface 301.

Figure 28B:
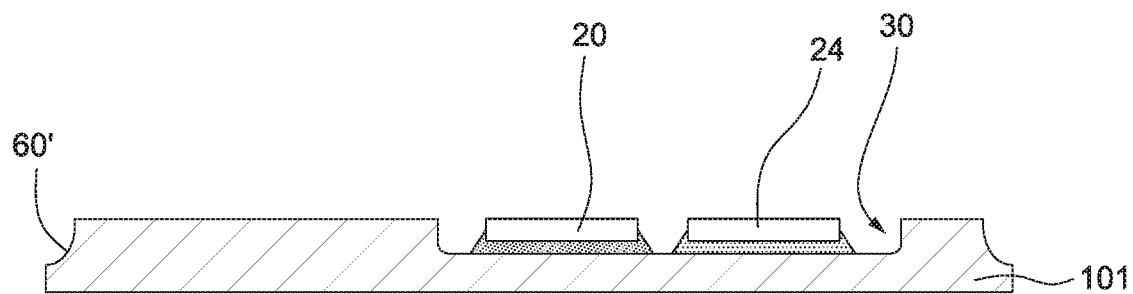

Referring to FIG. 28B, conductive adhesive layers 48 are disposed on the bottom surface 301 of the cavity 30. The conductive adhesive layer 48 may include, for example, a conductive gel or epoxy film (epoxy mixed with a conductive material). A semiconductor die 20 is disposed on the conductive adhesive layer 48 in the bottom surface 301 of the cavity 30. The conductive adhesive 48 can be used to attach the semiconductor die 20 to the bottom surface 301 of the cavity 30. The semiconductor die 20 has an active surface 201 and a surface 202 opposite the upper surface 201. A semiconductor die 24 is disposed on the conductive adhesive layer 48 in the bottom surface 301 of the cavity 30. The conductive adhesive 48 can be used to attach the semiconductor die 24 to the bottom surface 301 of the cavity 30. The semiconductor die 24 has an active surface 241 and a surface 242 opposite the upper surface 201.

Figure 28C:
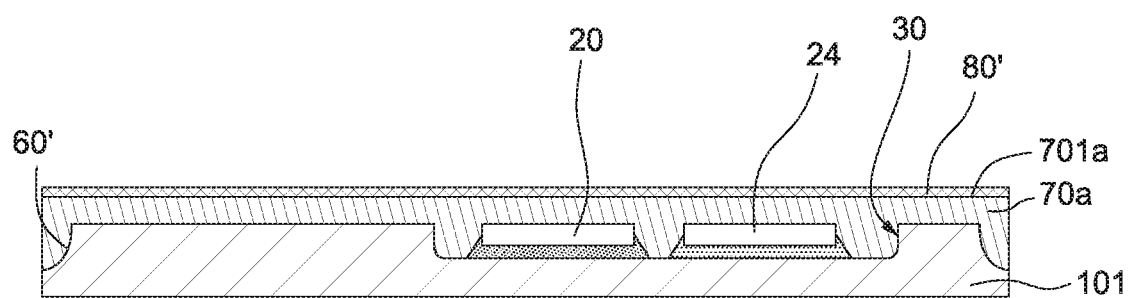

Referring to FIG. 28C, a protection layer 70a is disposed on the semiconductor dies 20 and 24 and fills the cavity 30 and the upper curved structures 60'. The protection layer 70a has a surface 701a. In some embodiments, a material of the protection layer 70a may include a polypropylene resin; however, other suitable materials may be additionally or alternatively used. The conductive layer 80' is disposed on the surface 701a of the protection layer 70a. A material of conductive layer 80' may include, for example, copper or other metal, or a metal alloy, or other conductive material.

Figure 28D:
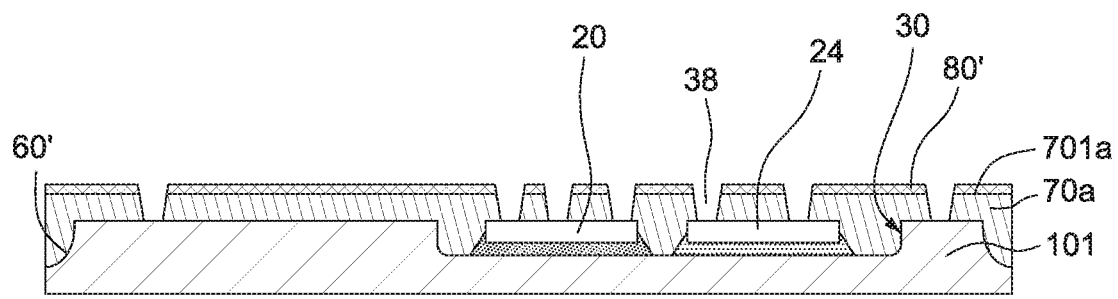

Referring to FIG. 28D, vias 38 are formed through the protection later 70a from the surface of the patterned conductive layer 80'. The vias 38 may be formed, for example, by drilling. After the vias 38 are formed, a portion of the surface 201 of the semiconductor die 20, a portion of the surface 241 of the semiconductor die 24, and a portion of the surface 101u of the conductive base 101 are exposed.

Figure 28E:
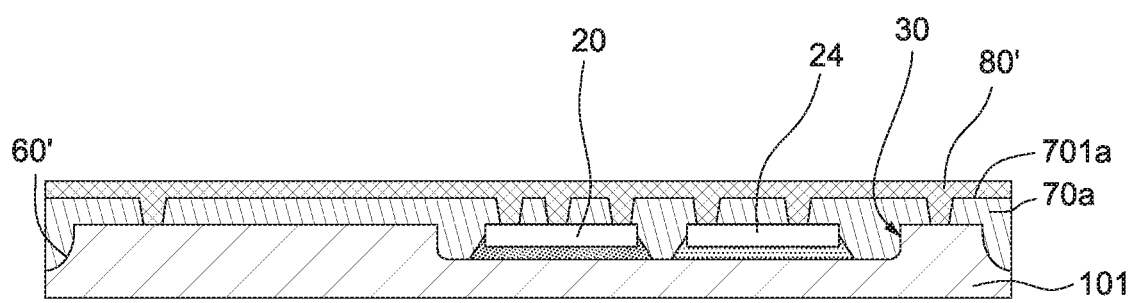

Referring to FIG. 28E, the vias 38 are filled with the conductive material similar to, or the same as, a material of the conductive layer 80'. A thickness of conductive layer 80' is increased by coating, sputtering, plating or another suitable technique.

Figure 28F:
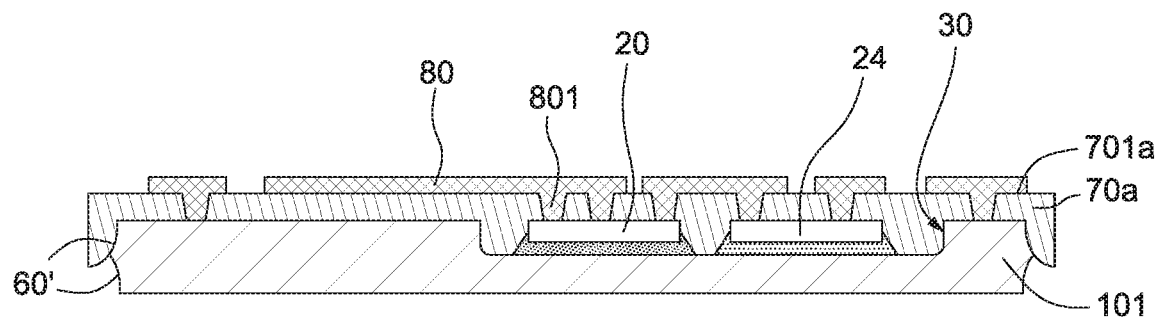

Referring to FIG. 28F, the conductive layers 80 and the interconnection structures 801 are formed by photo-lithography techniques. The material of interconnection structures 801 and conductive layers 80 may include, for example, copper or other metal, or a metal alloy, or other conductive material. The portion of the conductive base 101 below the upper curved structures 60' is removed by etching to form the curved structures 60.

Figure 28G:
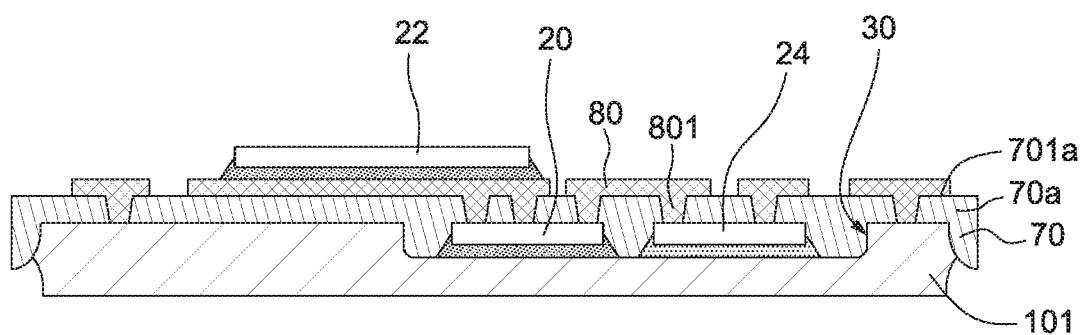

Referring to FIG. 28G, a semiconductor die 22 is disposed on the interconnection structures 801 through the conductive adhesive layer 48. The semiconductor dies 20 and 22 may be a power die, and the semiconductor die 24 may be a control die.

Figure 28H:
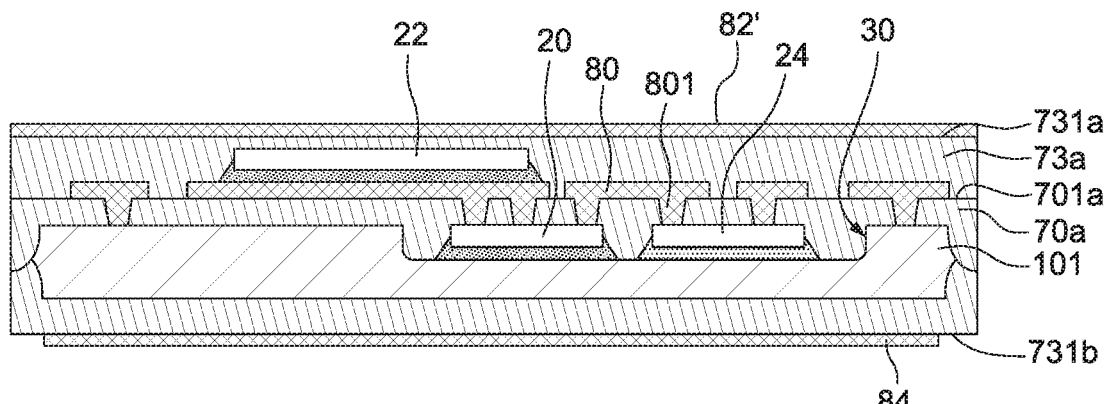

Referring to FIG. 28H, an insulation layer 73a is disposed on the semiconductor die 22 and the surface 101b of the conductive base 101. The insulation layer 73a covers the interconnection structures 801 and fills the curved structures 60. The insulation layer 73a has a surface 731a and a surface 731b. In some embodiments, a material of the protection layer 73a may include a polypropylene resin; however, other suitable materials may be additionally or alternatively used. A conductive layer 82' is disposed on the surface 731a of the insulation layer 73a and a conductive layer 84 is disposed on the surface 731b of the insulation layer 73a. A material of conductive layer 82' and 84 may include, for example, copper or other metal, or a metal alloy, or other conductive material.

Figure 28I:
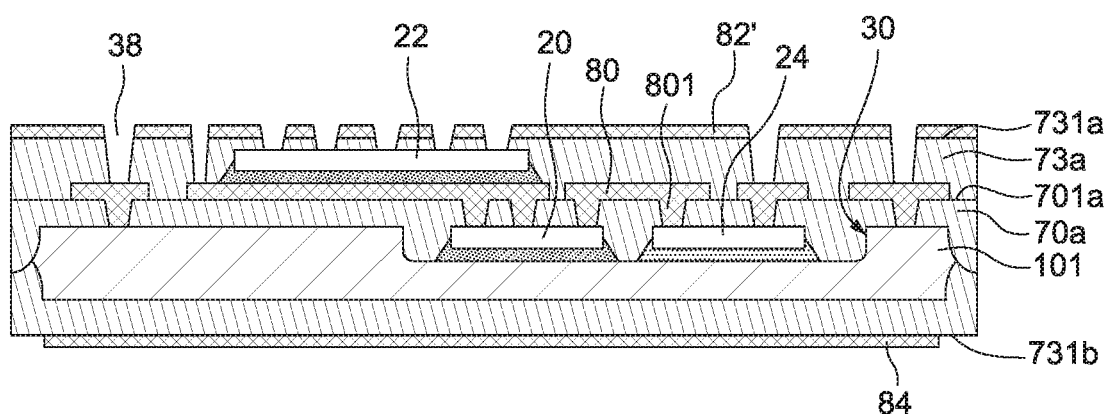

Referring to FIG. 28I, vias 38' are formed through the insulation later 73a from the surface of the patterned conductive layer 82'. The vias 38' may be formed, for example, by drilling. After the vias 38' are formed, a portion of the surface 221 of the semiconductor die 22 and a portion of the surface of the interconnection structures 801 are exposed.

Figure 28J:
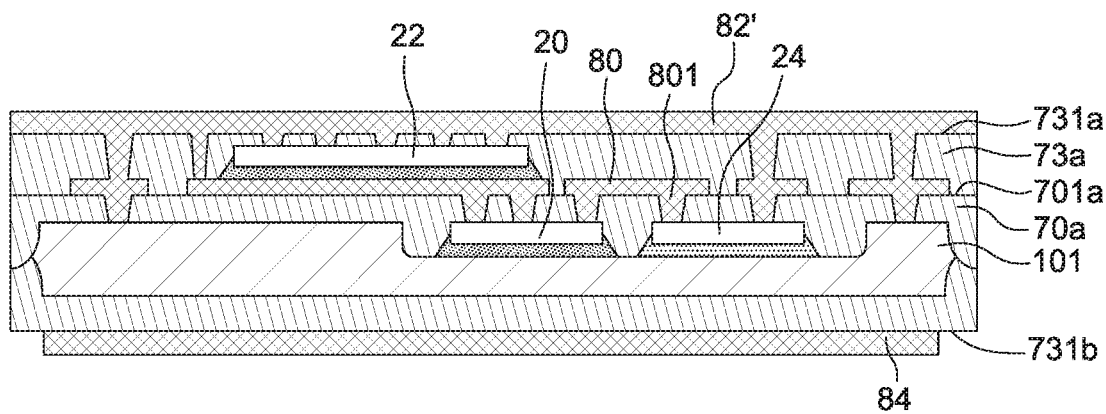
Figure 28K:
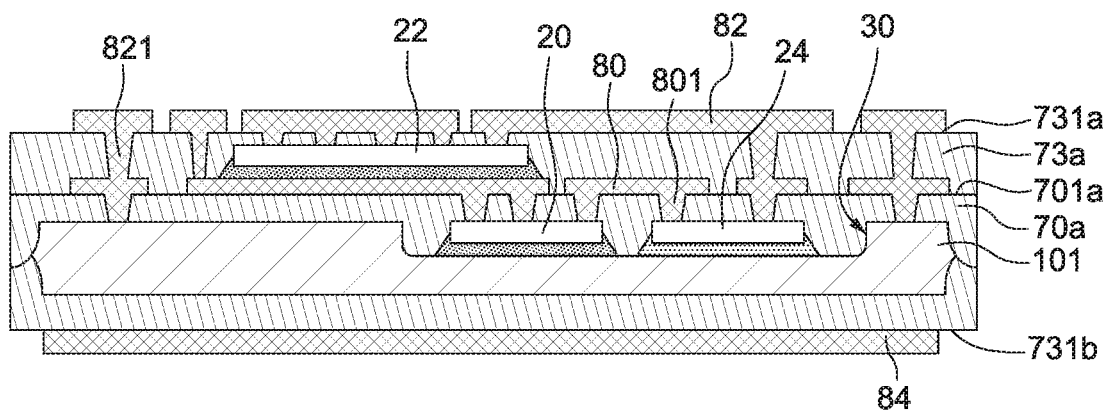

Referring to FIG. 28J, the vias 38 are filled with the conductive material similar to, or the same as, a material of the conductive layer 82'. A thickness of conductive layer 82' is increased by coating, sputtering, plating or another suitable technique. Referring to FIG. 28K, the conductive layers 82 and the interconnection structures 821 are formed by photo-lithography techniques. The material of interconnection structures 821 and conductive layers 82 may include, for example, copper or other metal, or a metal alloy, or other conductive material.

Figure 28L:
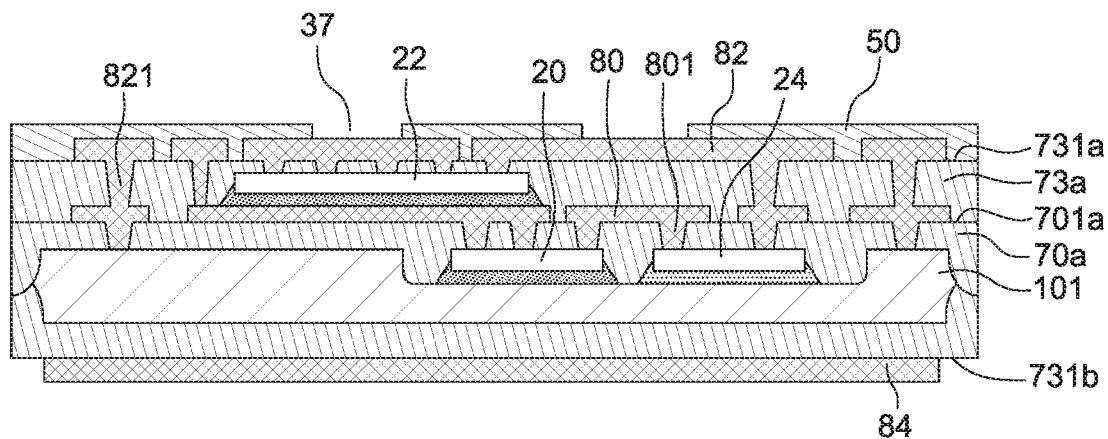
Figure 28M:
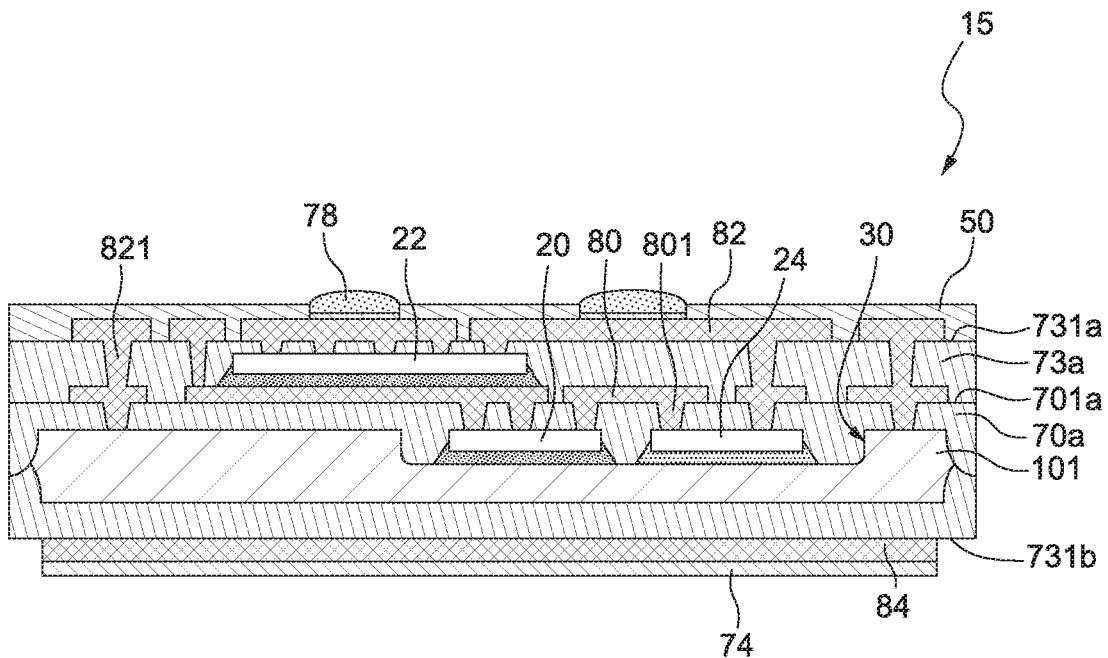

Referring to FIG. 28L, an insulating layer 50 is disposed on the upper surface 731a of the insulation layer 73a. The insulating layer 50 covers the patterned conductive layers 82. A material of the insulating layer 50 may include an epoxy resin or other insulating materials used additionally or alternatively. Referring to FIG. 28M, the conductive connects 78 are filled into the vias 37. A surface finish layer 74 is formed on the conductive layer 84 to form the semiconductor device package 15. The surface finish layer 74 may include any suitable conductive material (such as, for example, nickel (Ni), palladium (Pd), gold (Au), silver (Ag), Cu, and combinations of metals).

Figure 29A:
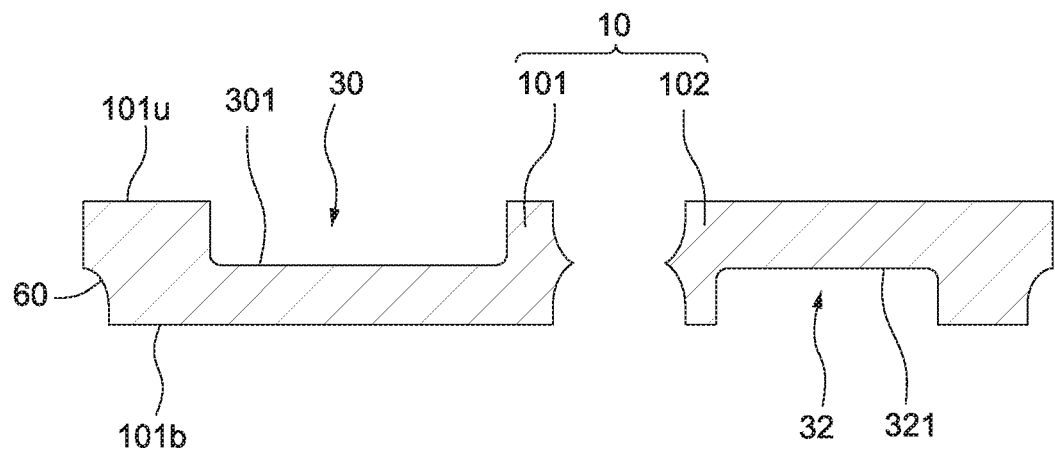
FIG. 29A, FIG. 29B, FIG. 29C, FIG. 29D, FIG. 29E, FIG. 29F, FIG. 29G, FIG. 29H, and FIG. 29I illustrate some embodiments of a method of manufacturing a semiconductor device package according to a fifteenth aspect.

FIGS. 29A-29I illustrate some embodiments of a method of manufacturing at semiconductor device package 16. Referring to FIG. 29A, conductive bases 101 and 102 are provided. The conductive base 101 includes an upper surface 101u and a surface 101b opposite to the upper surface 101u. The conductive base 102 includes an upper surface 102u and a surface 102b opposite to the upper surface 102u. A material of the conductive bases 101 and 102 includes, for example, copper or other metal, or a metal alloy, or other conductive material. The conductive base 101 defines a cavity 30 in the upper surface 101u. The conductive base 102 defines a cavity 32 in the upper surface 102u. The cavity 30 has bottom surface 301. The cavity 32 has bottom surface 321. The conductive base 101 defines one or more curved structures 60. Curved structures 60 of the conductive base 101 are smoothed, and can help to redistribute stress and to avoid or mitigate damage to the insulation layer 70 during lamination. The structure of the conductive bases 101 and 102 may be formed in the same manner.

Figure 29B:
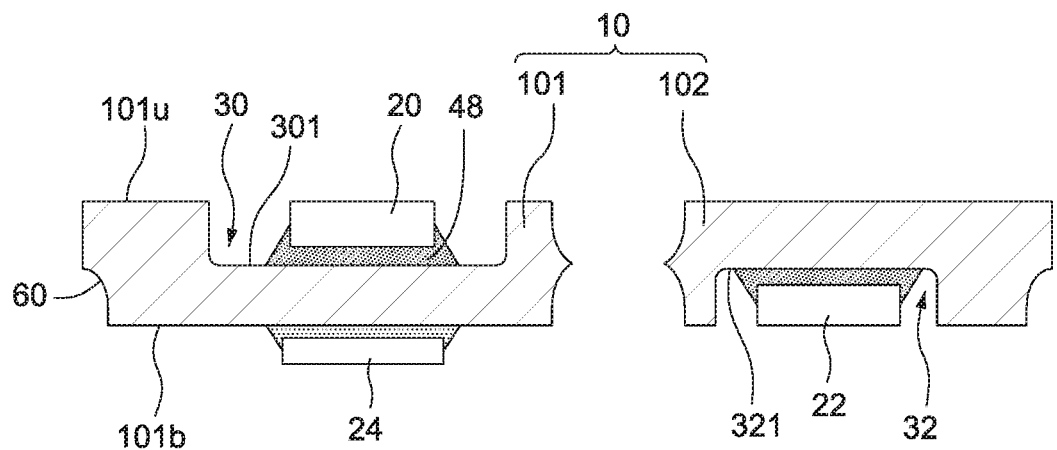

Referring to FIG. 29B, conductive adhesive layers 48 are disposed on the bottom surface 301 of the cavity 30, on the surface 101b of the conductive base 101 and on the bottom surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 can be used to attach the semiconductor die 20 to the bottom surface 301 of the cavity 30. The semiconductor dies 22 and 24 may be disposed through the attaching of the conductive adhesive layer 48.

Figure 29C:
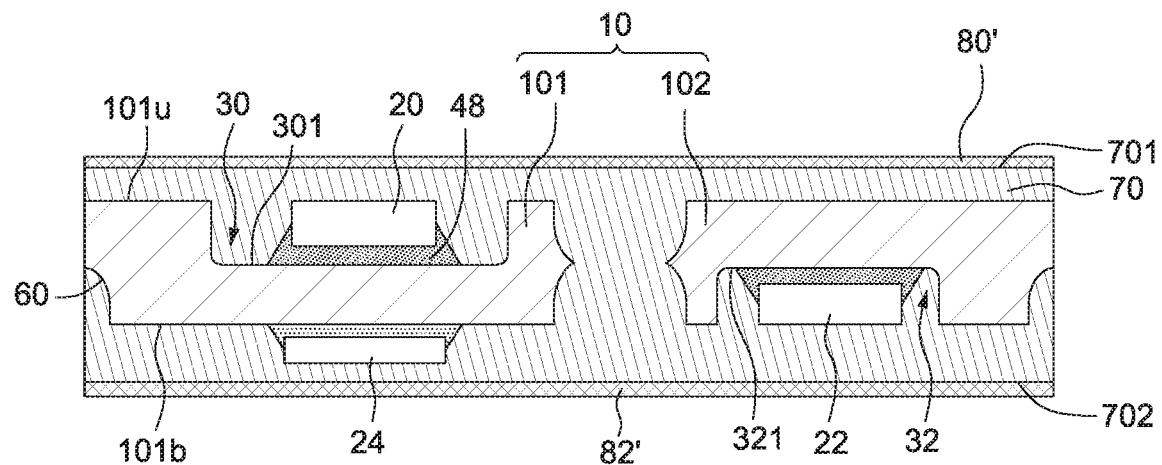

Referring to FIG. 29C, an insulation layer 70 is disposed on the semiconductor dies 20, 22 and 24 and fills the cavities 30 and 32. The insulation layer 70 has a surface 701 and a surface 702. In some embodiments, a material of the insulation layer 70 may include a polypropylene resin; however, other suitable materials may be additionally or alternatively used. The conductive layer 80' is disposed on the surface 701 of the insulation layer 70 and the conductive layer 82' is disposed on the surface 702 of the insulation layer 70. A material of conductive layer 80' and 82' may include, for example, copper or other metal, or a metal alloy, or other conductive material.

Figure 29D:
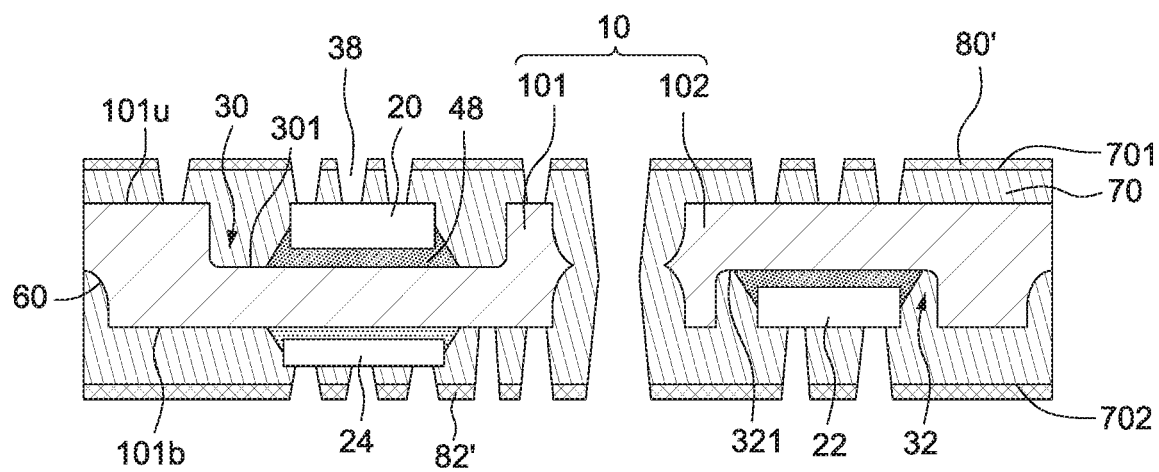

Referring to FIG. 29D, vias 38 are formed through the insulation later 70 from the surface of the patterned conductive layers 80' and 82'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101u of the conductive base 101 are exposed.

Figure 29E:
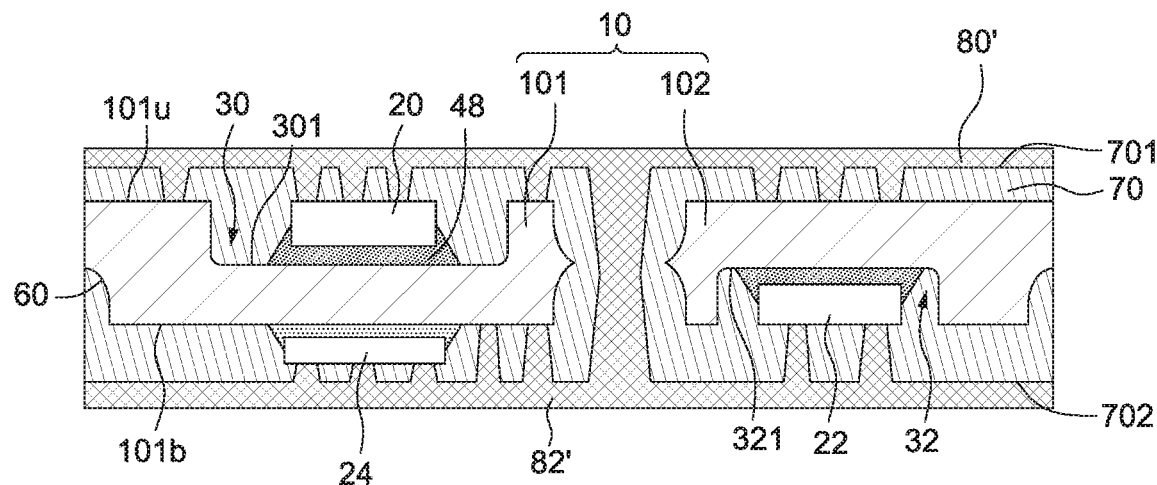

Referring to FIG. 29E, the vias 38 are filled with the conductive material similar to, or the same as, a material of the conductive layers 80' and 82'. Thicknesses of conductive layers 80' and 82' are increased by coating, sputtering, plating or another suitable technique.

Figure 29F:
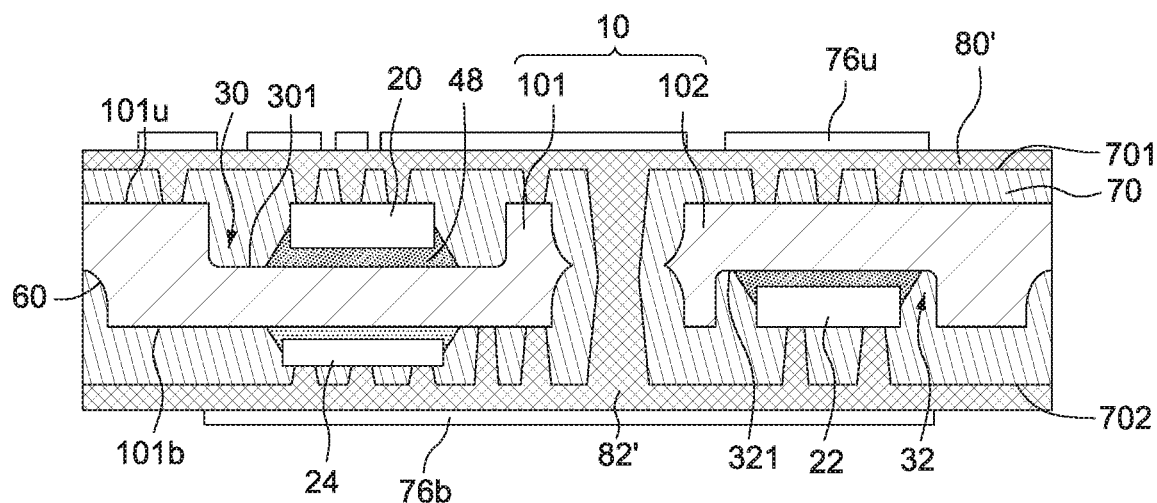

Referring to FIG. 29F, a patterned photoresist layer 76u is disposed on the conductive layers 80' and a patterned photoresist layer 76b is disposed on the conductive layer 82'. The patterned photoresist layers 76u and 76b may include a positive photoresist or other suitable material.

Figure 29G:
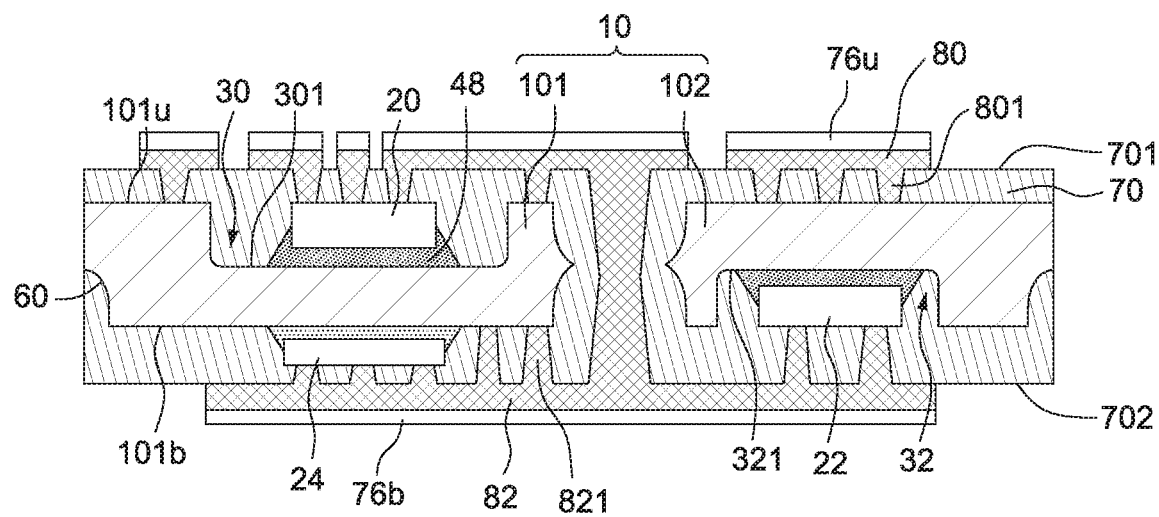

Referring to FIG. 29G, a portion of the conductive layers 80' and 82' is removed. After removal, the conductive layers 80 and 82 and the interconnection structures 801 and 821 are formed.

Figure 29H:
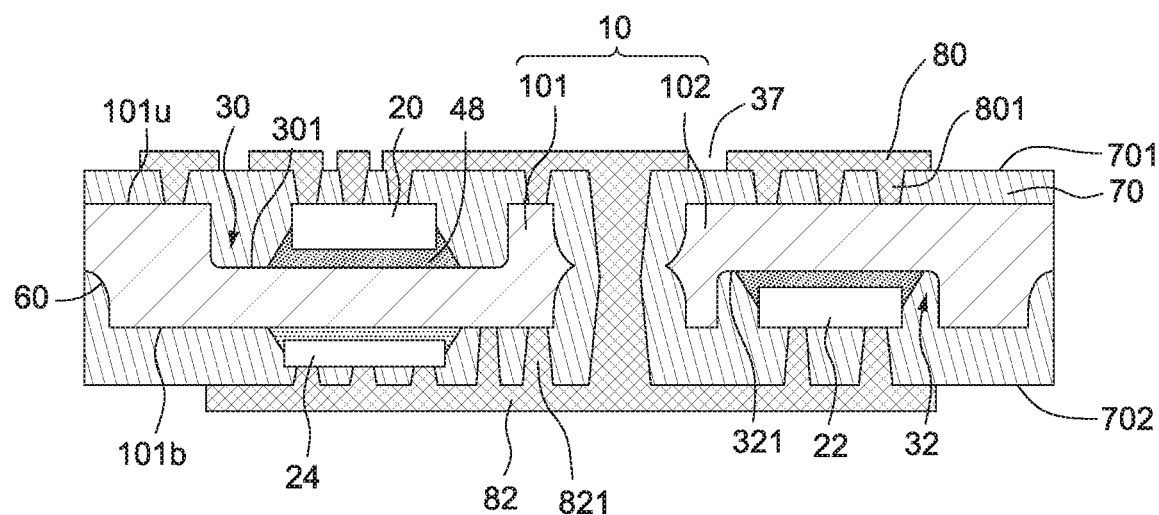

Referring to FIG. 29H, the patterned photoresist layers 76u and 76b are removed by a suitable technique, such as an etching process. After etching, a portion of the upper surface 701 of the insulation layer 70 is exposed and a portion of the surface 702 of the insulation layer 70 is exposed.

Figure 29I:
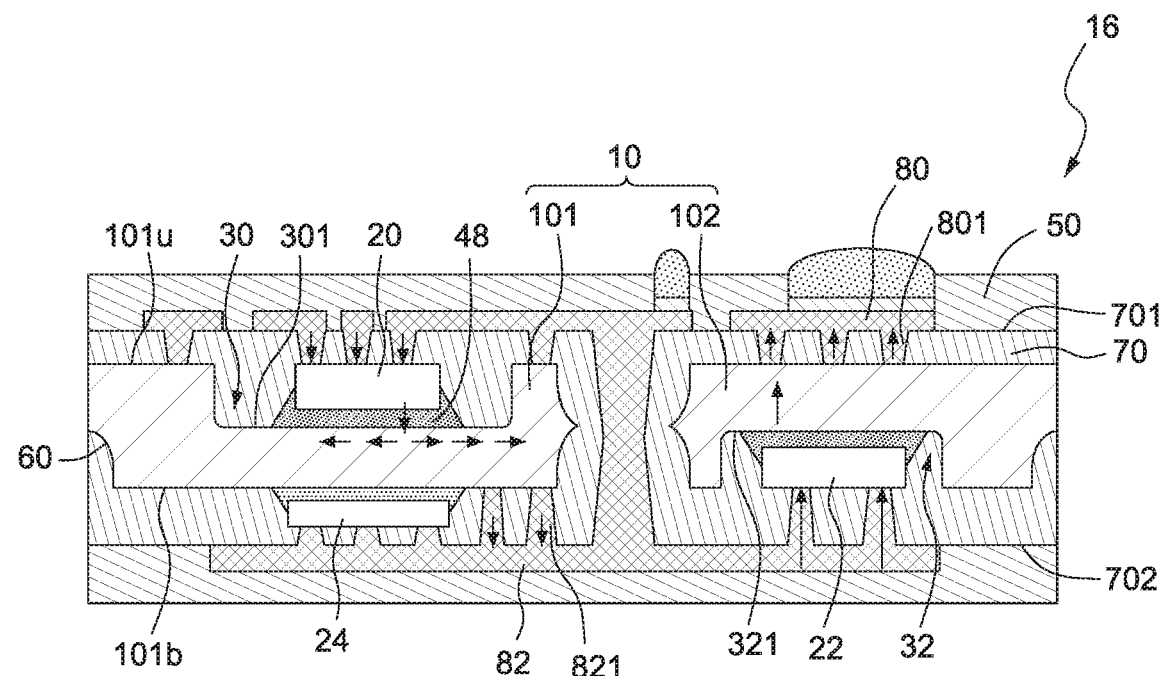

Referring to FIG. 29I, an insulating layer 50 is disposed on the upper surface 701 of the protection layer 70 and an insulating layer 52 is disposed on the upper surface 702 of the protection layer 70. The insulating layer 50 covers the patterned conductive layers 80 and the insulating layer 52 covers the patterned conductive layers 82. A material of one or both of the insulating layers 50 and 52 may include a polypropylene resin or other insulating materials used additionally or alternatively. The conductive connects 78 are filled into, or formed in, the vias 37 to form the semiconductor device package 16. The conductive connects 78 may include solder balls.

Figure 30A:
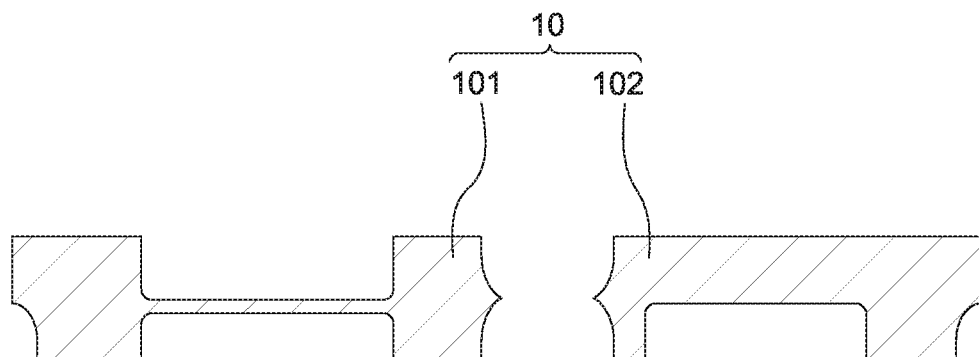
FIG. 30A, FIG. 30B, FIG. 30C, FIG. 30D, FIG. 30E, FIG. 30F, FIG. 30G, FIG. 30H, and FIG. 30I illustrate some embodiments of a method of manufacturing a semiconductor device package according to a sixteenth aspect.

FIGS. 30A-30I illustrate some embodiments of a method of manufacturing a semiconductor device package 17. Referring to FIG. 30A, conductive bases 101 and 102 are provided. The conductive base 101 includes an upper surface 101u and a surface 101b opposite to the upper surface 101u. The conductive base 102 includes an upper surface 102u and a surface 102b opposite to the upper surface 102u. A material of the conductive bases 101 and 102 includes, for example, copper or other metal, or a metal alloy, or other conductive material. The connecting element 90 is formed, for example, by drilling. The conductive base 101 defines a cavity 30 in the upper surface 101u. The conductive base 102 defines a cavity 32 in the upper surface 102u. The cavity 30 has bottom surface 301. The cavity 32 has bottom surface 321. The conductive base 101 defines one or more curved structures 60. Curved structures 60 of the conductive base 101 are smoothed, and can help to redistribute stress and avoid or mitigate damage to the insulation layer 70 during lamination. The structure of the conductive bases 101 and 102 may be formed in the same manner.

Figure 30B:
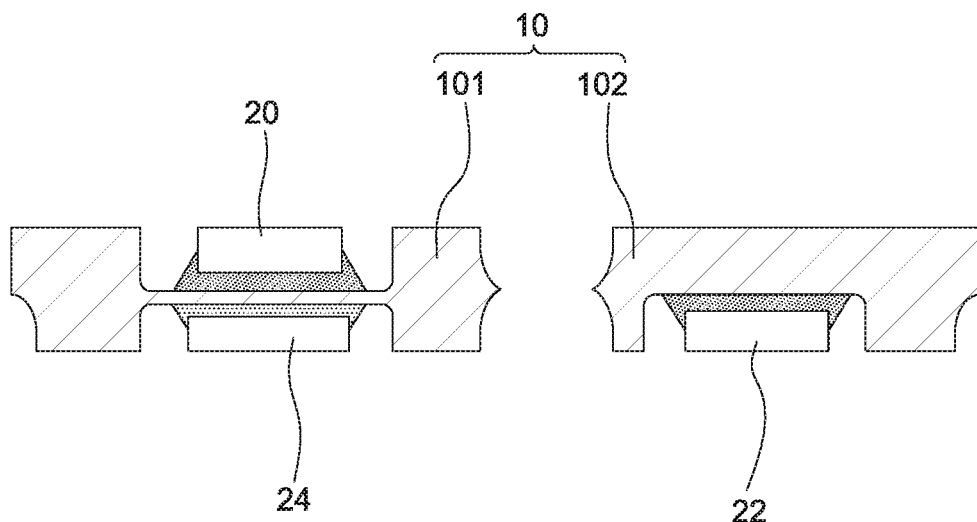

Referring to FIG. 30B, conductive adhesive layers 48 are disposed on the bottom surface 301 of the cavity 30, on the surface 101b of the conductive base 101 and on the bottom surface 321 of the cavity 32. The conductive adhesive layer 48 may include, for example, a conductive gel or epoxy film (epoxy mixed with a conductive material). A semiconductor die 20 is disposed on the conductive adhesive layer 48 in cavity 30. The conductive adhesive 48 can be used to attach the semiconductor die 20 to the bottom surface 301 of the cavity 30. The semiconductor dies 22 and 24 may be disposed through the attaching of the conductive adhesive layer 48.

Figure 30C:
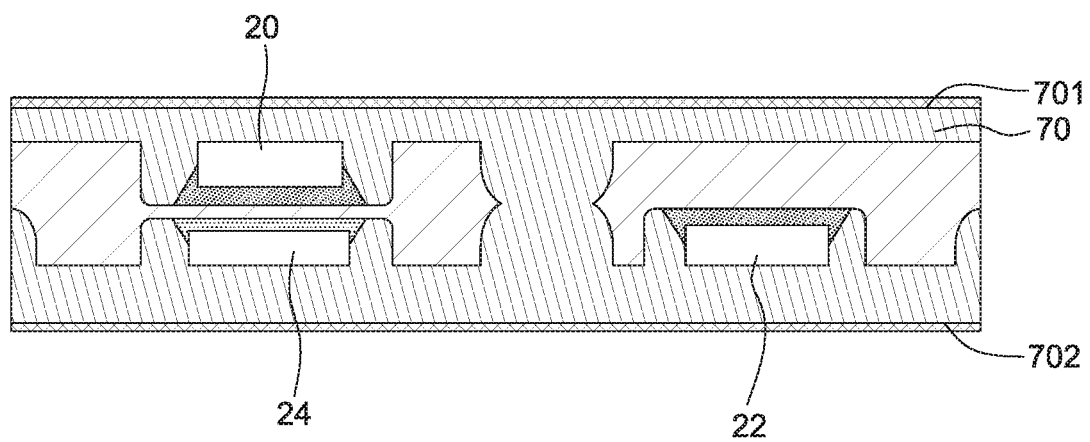

Referring to FIG. 30C, an insulation layer 70 is disposed on the semiconductor dies 20, 22 and 24 and fills the cavities 30 and 32. The insulation layer 70 has a surface 701 and a surface 702. In some embodiments, a material of the insulation layer 70 may include a polypropylene resin; however, other suitable materials may be additionally or alternatively used. The conductive layer 80' is disposed on the surface 701 of the insulation layer 70 and the conductive layer 82' is disposed on the surface 702 of the insulation layer 70. A material of conductive layer 80' and 82' may include, for example, copper or other metal, or a metal alloy, or other conductive material.

Figure 30D:
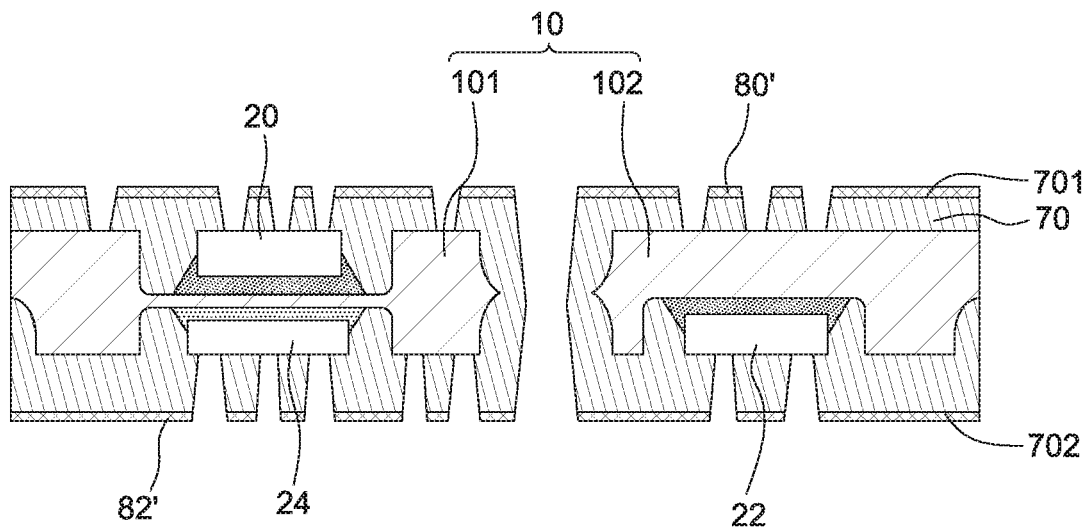

Referring to FIG. 30D, vias 38 are formed through the protection later 70 from the surface of the patterned conductive layers 80' and 82'. The vias 38 may be formed, for example, by drilling. After the vias 38 are formed, a portion of the surface 201 of the semiconductor die 20, a portion of the surface 221 of the semiconductor die 22, a portion of the surface 241 of the semiconductor die 24 and a portion of the surface 101u of the conductive base 101 are exposed.

Figure 30E:
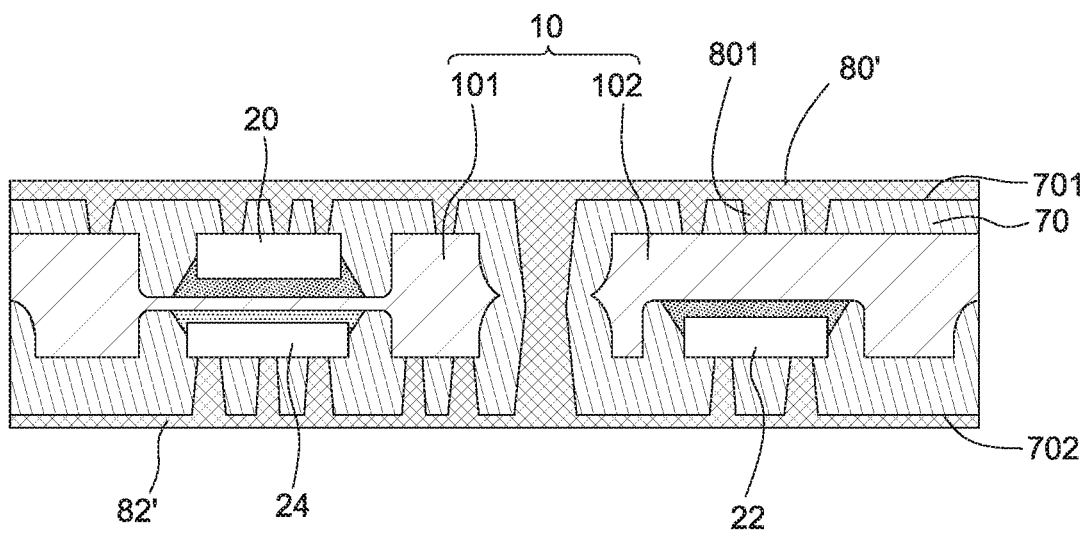

Referring to FIG. 30E, the vias 38 are filled with the conductive material similar to, or the same as, a material of the conductive layers 80' and 82'. Thicknesses of conductive layers 80' and 82' are increased by coating, sputtering, plating or another suitable technique.

Figure 30F:
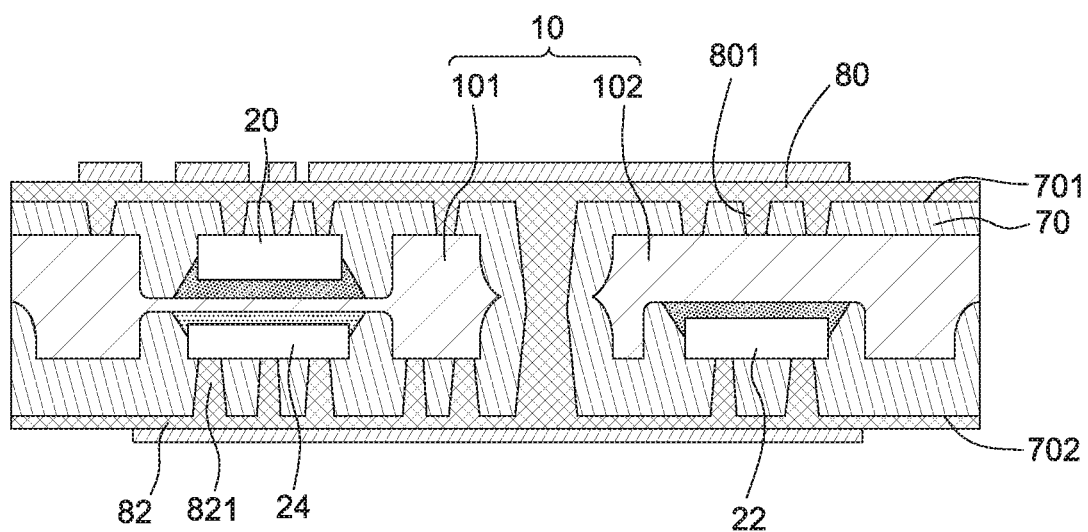

Referring to FIG. 30F, a patterned photoresist layer 76u is disposed on the conductive layers 80' and a patterned photoresist layer 76b is disposed on the conductive layer 82'. The patterned photoresist layers 76u and 76b may include a positive photoresist or other suitable material.

Figure 30G:
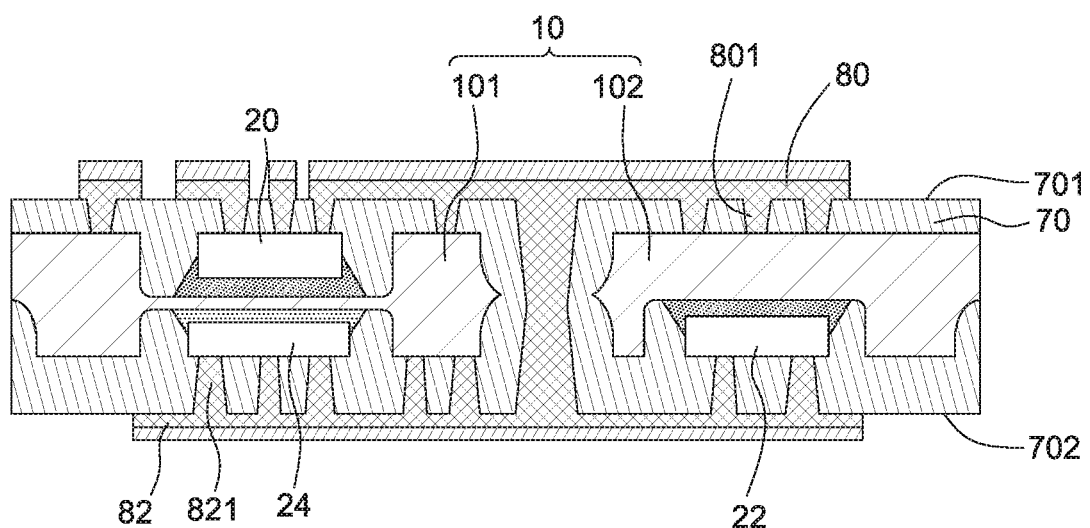
Figure 30H:
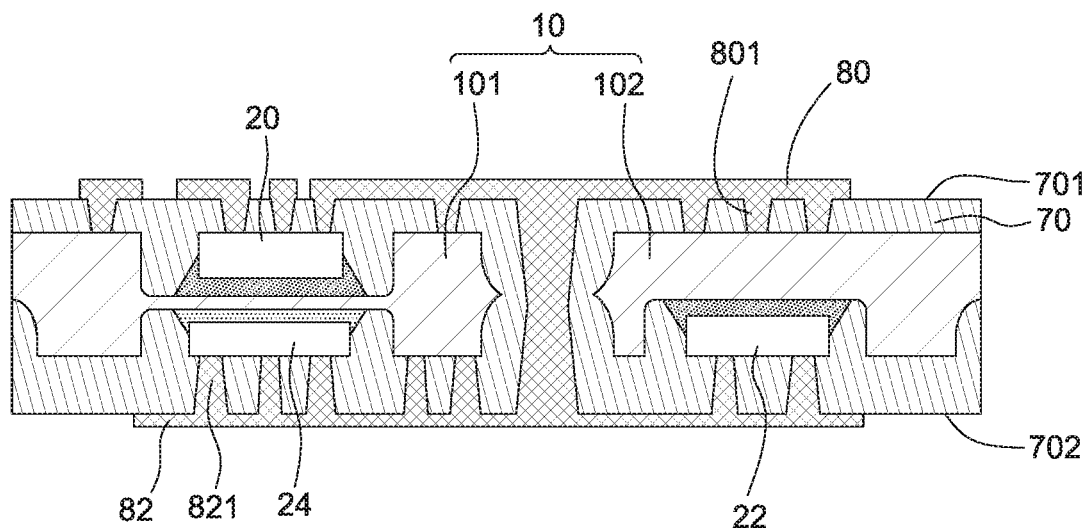

Referring to FIG. 30G, a portion of the conductive layers 80' and 82' is removed. After removal, the conductive layers 80 and 82 and the interconnection structures 801 and 821 are formed. Referring to FIG. 30H, the patterned photoresist layers 76u and 76b are removed by a suitable technique, such as an etching process. After etching, a portion of the upper surface 701 of the insulation layer 70 is exposed and a portion of the surface 702 of the insulation layer 70 is exposed.

Figure 30I:
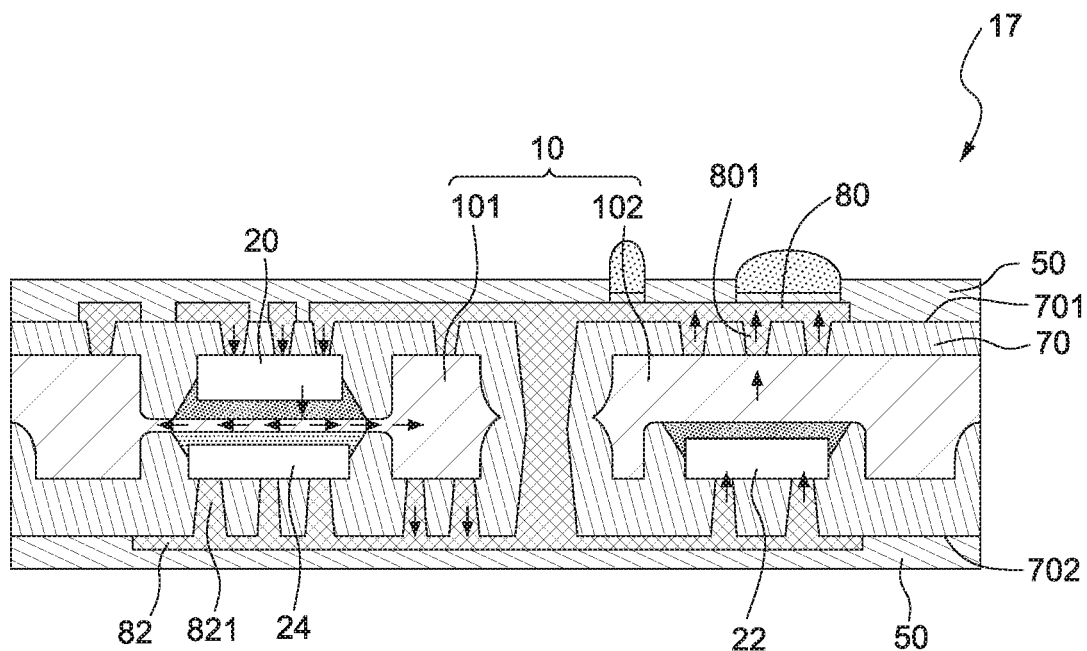

Referring to FIG. 30I, an insulating layer 50 is disposed on the upper surface 701 of the protection layer 70 and an insulating layer 52 is disposed on the upper surface 702 of the protection layer 70. The insulating layer 50 covers the patterned conductive layers 80 and the insulating layer 52 covers the patterned conductive layers 82. A material of one or both of the insulating layers 50 and 52 may include an epoxy resin or other insulating materials used additionally or alternatively. Next, the conductive connects 78 are filled into, or formed in, the vias 37 to form the semiconductor device package 17. The conductive connects 78 may include solder balls.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a variation of less than or equal to ±10% of the numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. Thus, the term "approximately equal" in reference to two values can refer to a ratio of the two values being within a range between and inclusive of 0.9 and 1.1.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

Two surfaces or sides can be deemed to be aligned if a displacement between the two surfaces is no greater than 0.5 μm, no greater than 1 μm, no greater than 5 μm, no greater than 10 μm, or no greater than 15 μm. In the description of some embodiments, a component provided "on" another component can encompass cases where the former component is directly on (e.g., in physical contact with) the latter component, as well as cases where one or more intervening components are located between the former component and the latter component.

While the present disclosure has been described and illustrated with reference to specific embodiments thereof, these descriptions and illustrations do not limit the present disclosure. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A semiconductor device package, comprising:
   a conductive base having a top surface, a bottom surface opposite to the top surface, and a lateral surface extended between the top surface of the conductive base and the bottom surface of the conductive base, wherein the lateral surface of the conductive base includes a first portion adjacent to the top surface of the conductive base and a second portion adjacent to the bottom surface of the conductive base;

a first insulation layer covering the first portion of the lateral surface of the conductive base; and a second insulation layer covering the second portion of the lateral surface of the conductive base, wherein the second insulation layer is exposed from the first insulation layer;

wherein a lower surface of the first insulation layer includes a first region and a second region, wherein an elevation of the first region is lower than an elevation of the second region.

2. The semiconductor device package of claim 1, further comprising an interface between the first portion and the second portion, wherein the interface is an outermost portion of the lateral surface of the conductive base.

3. The semiconductor device package of claim 1, wherein the elevation of the second region of the lower surface of the first insulation layer is substantially aligned with an elevation of an interface between the first portion and the second portion of the lateral surface of the conductive base.

4. A semiconductor device package, comprising:
a conductive base having a top surface, a bottom surface opposite to the top surface, and a lateral surface extended between the top surface of the conductive base and the bottom surface of the conductive base, wherein the lateral surface of the conductive base includes a first portion adjacent to the top surface of the conductive base and a second portion adjacent to the bottom surface of the conductive base;

a first insulation layer covering the first portion of the lateral surface of the conductive base; and a second insulation layer covering the second portion of the lateral surface of the conductive base, wherein the second insulation layer is exposed from the first insulation layer;

wherein an upper surface of the second insulation layer includes a first region and a second region, wherein an elevation of the first region is lower than an elevation of the second region;

wherein the elevation of the first region of the upper surface of the second insulation layer is substantially aligned with the bottom surface of conductive base.

5. A semiconductor device package, comprising:
a conductive base having a top surface, a bottom surface opposite to the top surface, and a lateral surface extended between the top surface of the conductive base and the bottom surface of the conductive base, wherein the lateral surface of the conductive base includes a first portion adjacent to the top surface of the conductive base and a second portion adjacent to the bottom surface of the conductive base;

a first insulation layer covering the first portion of the lateral surface of the conductive base;

a second insulation layer covering the second portion of the lateral surface of the conductive base, wherein the second insulation layer is exposed from the first insulation layer; and a first interface between the first insulation layer and second insulation layer and a second interface between the first insulation layer and second insulation layer, wherein an elevation of the first interface is higher than an elevation of the second interface.

6. A semiconductor device package, comprising:
a conductive base having a top surface, a bottom surface opposite to the top surface, and a lateral surface extended between the top surface of the conductive base and the bottom surface of the conductive base, wherein the lateral surface of the conductive base includes a first portion adjacent to the top surface of the conductive base and a second portion adjacent to the bottom surface of the conductive base;

a first insulation layer covering the first portion of the lateral surface of the conductive base; and a second insulation layer covering the second portion of the lateral surface of the conductive base, wherein the second insulation layer is exposed from the first insulation layer;

wherein at least a first portion of the bottom surface of the conductive base is exposed from the first insulation layer and the second insulation layer.

7. The semiconductor device package of claim 6, further comprising a surface finish layer disposed on the first portion of the bottom surface of the conductive base, and wherein a width of the surface finish layer defined by the first portion of the bottom surface of the conductive base is exposed from the second insulation layer.

8. A semiconductor device package, comprising:
a conductive base having a top surface, a bottom surface opposite to the top surface, and a lateral surface extended between the top surface of the conductive base and the bottom surface of the conductive base, wherein the lateral surface of the conductive base includes a first portion adjacent to the top surface of the conductive base and a second portion adjacent to the bottom surface of the conductive base;

a first insulation layer covering the first portion of the lateral surface of the conductive base; and a second insulation layer covering the second portion of the lateral surface of the conductive base, wherein the second insulation layer is exposed from the first insulation layer;

wherein a portion of the first insulation layer is embedded in the second insulation layer.

9. The semiconductor device package of claim 8, wherein an elevation of an outermost portion of an interface between the first insulation layer and the second insulation layer is lower than an elevation of an interface between the first portion and the second portion.

10. A semiconductor device package, comprising:
a conductive base having a first surface and a second surface opposite to the first surface;

a die disposed on the first surface of the conductive base;

a first insulation layer covering the die and the first surface of the conductive base; and a second insulation layer covering the second surface of the conductive base and the first insulation layer, wherein the second insulation layer does not contact the die;

wherein the conductive base further has a lateral surface extended between the first surface to the second surface of the conductive base, wherein the lateral surface has two curved surfaces, wherein the curvature centers of the two curved surfaces are respectively at different sides of an interface between the two curved surfaces.

11. The semiconductor device package of claim 10, wherein an elevation of an interface between the first insulation layer and the second insulation layer is substantially aligned with an elevation of the interface between the two curved surfaces.

12. The semiconductor device package of claim 10, wherein an interface between the first insulation layer and the second insulation layer is substantially extended along one of the two curved surfaces.

13. A semiconductor device package, comprising:
a conductive base having a first surface and a second surface opposite to the first surface;
a die disposed on the first surface of the conductive base;
a first insulation layer covering the die and the first surface of the conductive base; and
a second insulation layer covering the second surface of the conductive base and the first insulation layer, wherein the second insulation layer does not contact the die;
wherein the conductive base includes a protrusion substantially protruding from a middle portion of a lateral surface of the conductive base, wherein the protrusion is further from the first surface or the second surface than the lateral surface is.

14. A semiconductor device package, comprising:
a conductive base having a first surface and a second surface opposite to the first surface;
a die disposed on the first surface of the conductive base;
a first insulation layer covering the die and the first surface of the conductive base; and
a second insulation layer covering the second surface of the conductive base and the first insulation layer, wherein the second insulation layer does not contact the die;
wherein the conductive base includes a protrusion protruding outward from a lateral surface of the conductive base, and the first insulation layer and the second insulation layer are separated by the protrusion.

15. A semiconductor device package, comprising:
a conductive base having a first surface and a second surface opposite to the first surface;
a die disposed on the first surface of the conductive base;
a first insulation layer covering the die and the first surface of the conductive base; and
a second insulation layer covering the second surface of the conductive base and the first insulation layer, wherein the second insulation layer does not contact the die;
wherein the conductive base further has a left lateral surface and a right lateral surface opposite to the left lateral surface, wherein a first thickness of the first insulation layer adjacent to the left lateral surface is less than a second thickness of the first insulation layer adjacent to the right lateral surface.

* * * * *